United States Patent [19]
Muraki et al.

[11] Patent Number: 6,166,387
[45] Date of Patent: Dec. 26, 2000

[54] ELECTRON BEAM EXPOSURE APPARATUS AND METHOD

[75] Inventors: Masato Muraki, Inagi; Susumu Gotoh, Tama, both of Japan

[73] Assignee: Canon Kabushiki Kaisha, Tokyo, Japan

[21] Appl. No.: 09/313,072

[22] Filed: May 17, 1999

Related U.S. Application Data

[62] Division of application No. 09/098,432, Jun. 17, 1998, Pat. No. 5,973,332, which is a division of application No. 08/811,602, Mar. 4, 1997, Pat. No. 5,834,783.

[30] Foreign Application Priority Data

| Mar. 4, 1996 | [JP] | Japan | 8-045873 |
| Mar. 4, 1996 | [JP] | Japan | 8-045878 |
| Apr. 23, 1996 | [JP] | Japan | 8-101233 |
| Jun. 12, 1996 | [JP] | Japan | 8-150988 |
| Jun. 12, 1996 | [JP] | Japan | 8-150990 |

[51] Int. Cl.[7] .................................................. G21K 5/10
[52] U.S. Cl. ............................ 250/492.2; 250/492.22; 250/492.23
[58] Field of Search ........................ 250/492.2, 492.23, 250/492.22

[56] References Cited

U.S. PATENT DOCUMENTS

| 4,130,761 | 12/1978 | Matsuda . |
| 4,142,132 | 2/1979 | Harte . |
| 4,153,843 | 5/1979 | Pease . |
| 4,200,794 | 4/1980 | Newberry . |
| 4,338,548 | 7/1982 | Bono et al. . |
| 4,418,283 | 11/1983 | Trotel ................................ 250/492.2 |
| 4,472,636 | 9/1984 | Hahn . |
| 4,498,010 | 2/1985 | Biechler . |
| 4,724,328 | 2/1988 | Lischke . |
| 4,980,567 | 12/1990 | Yasuda et al. . |
| 5,027,043 | 6/1991 | Chen et al. . |
| 5,359,202 | 10/1994 | Yasuda et al. .................... 250/492.2 |
| 5,369,282 | 11/1994 | Arai et al. ......................... 250/492.22 |
| 5,399,872 | 3/1995 | Yasuda et al. . |
| 5,614,725 | 3/1997 | Oae et al. . |
| 5,712,488 | 1/1998 | Stickel et al. ..................... 250/492.23 |

FOREIGN PATENT DOCUMENTS

| 0 033 805 | 8/1981 | European Pat. Off. . |
| 0 053 225 | 6/1982 | European Pat. Off. . |
| 0314216 | 5/1989 | European Pat. Off. . |
| 0359018 | 3/1990 | European Pat. Off. . |
| 0 404 608 | 12/1990 | European Pat. Off. . |
| 2 443 085 | 6/1980 | France . |

OTHER PUBLICATIONS

Roelofs, B.J.G.M., et al., "Feasability of multi-beam electron lithography," *Microelectronic Eng.*, vol. 2, No. 4, 259–279 (Dec. 1994).

*Primary Examiner*—Bruce C. Anderson
*Assistant Examiner*—Nikita Wells
*Attorney, Agent, or Firm*—Fitzpatrick, Cella, Harper & Scinto

[57] ABSTRACT

An electron beam exposure apparatus which minimizes the influence of the space charge effect and aberrations of a reduction electron optical system, and simultaneously, increases the exposure area which can be exposed at once, thereby increasing the throughput. An electron beam exposure apparatus having a source for emitting an electron beam and a reduction electron optical system for reducing and projecting, on a target exposure surface, an image of the source, includes a correction electron optical system which is arranged between the source and the reduction electron optical system to form a plurality of intermediate images of the source along a direction perpendicular to the optical axis of the reduction electron optical system, and corrects in advance aberrations generated when the intermediate images are reduced and projected on the target exposure surface by the reduction electron optical system.

23 Claims, 46 Drawing Sheets

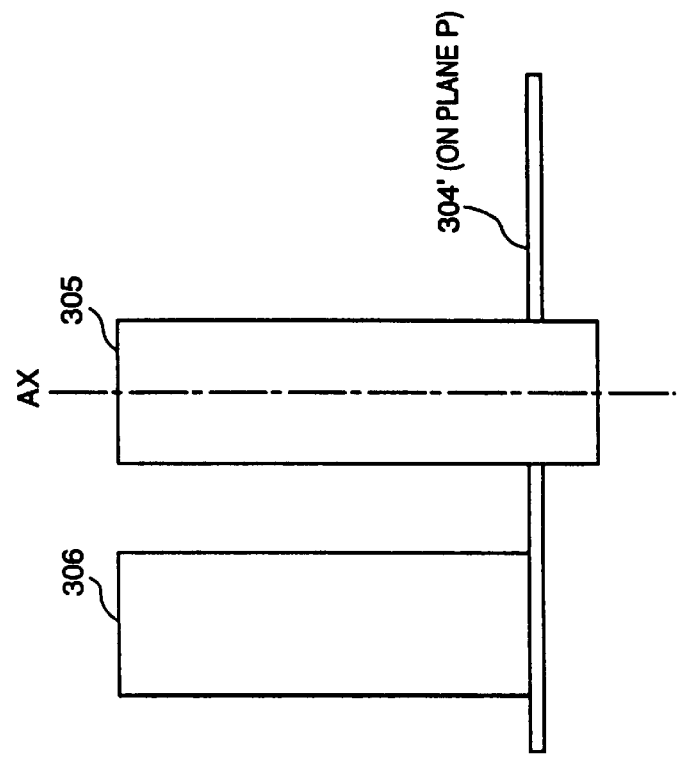
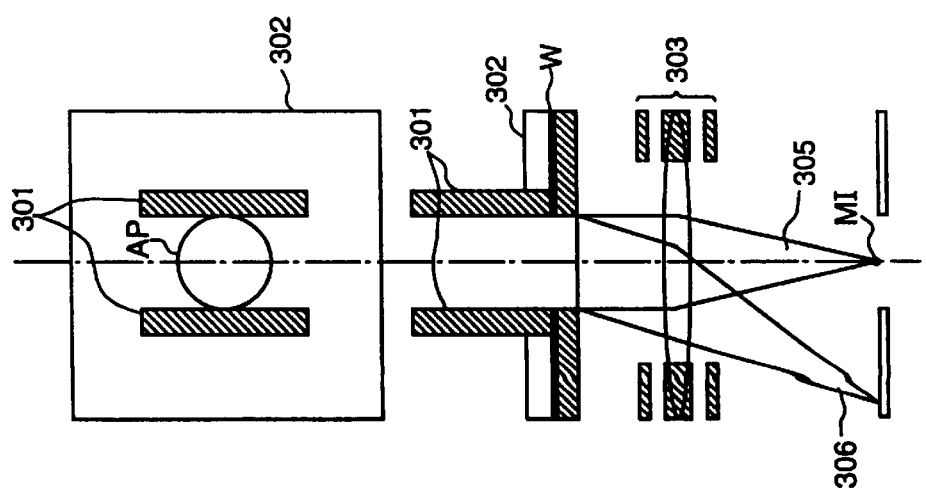

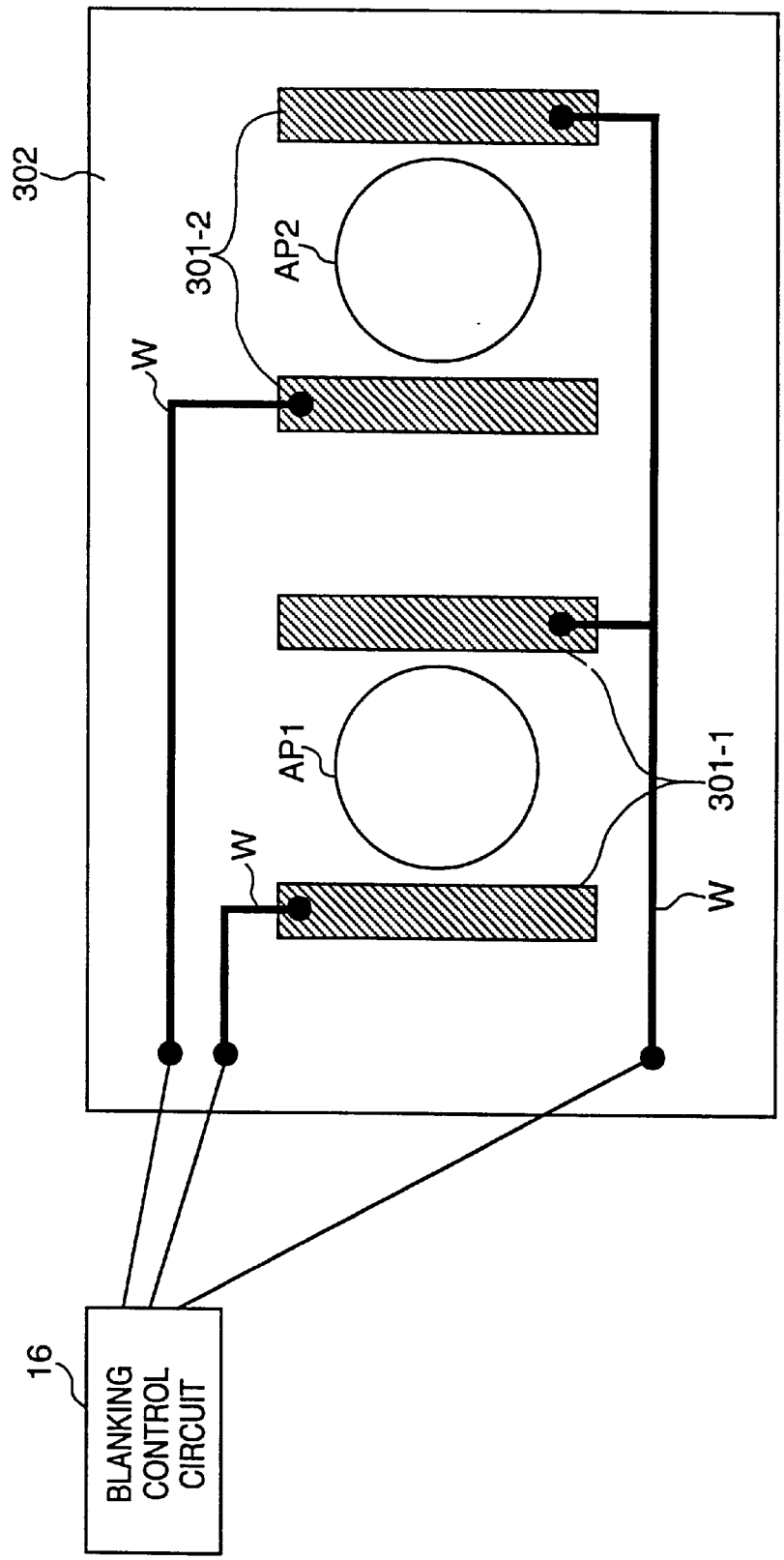

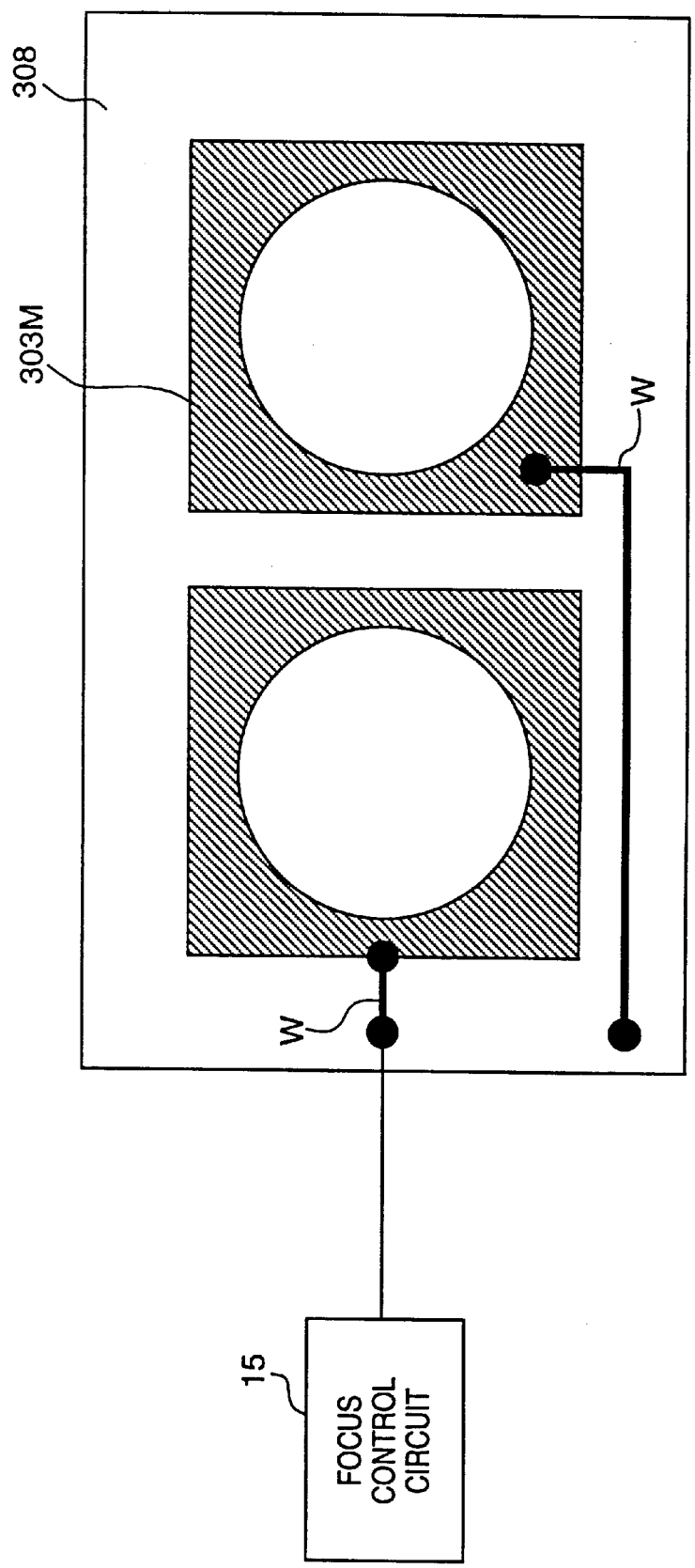

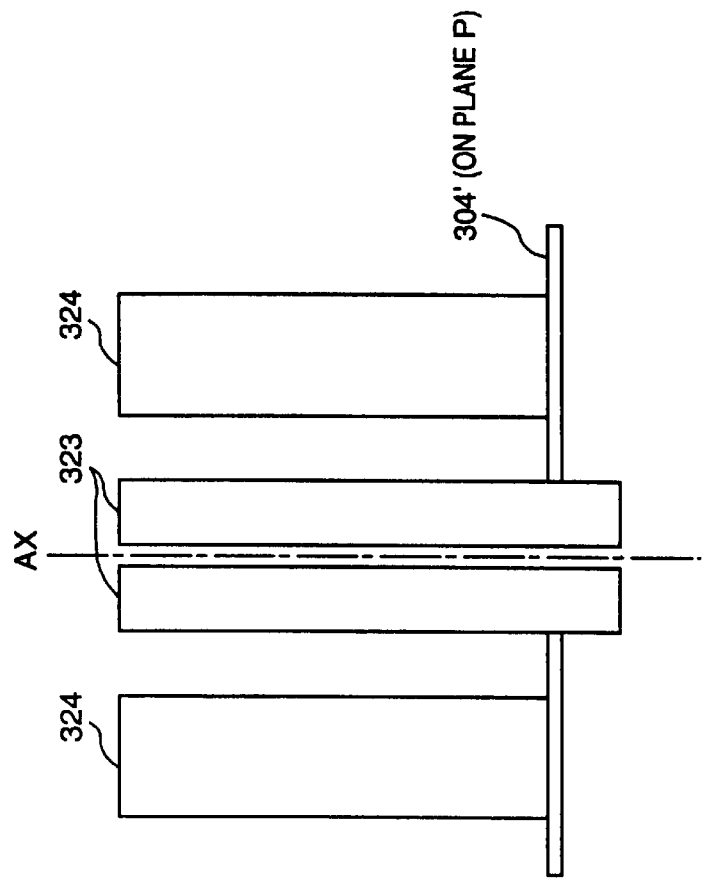
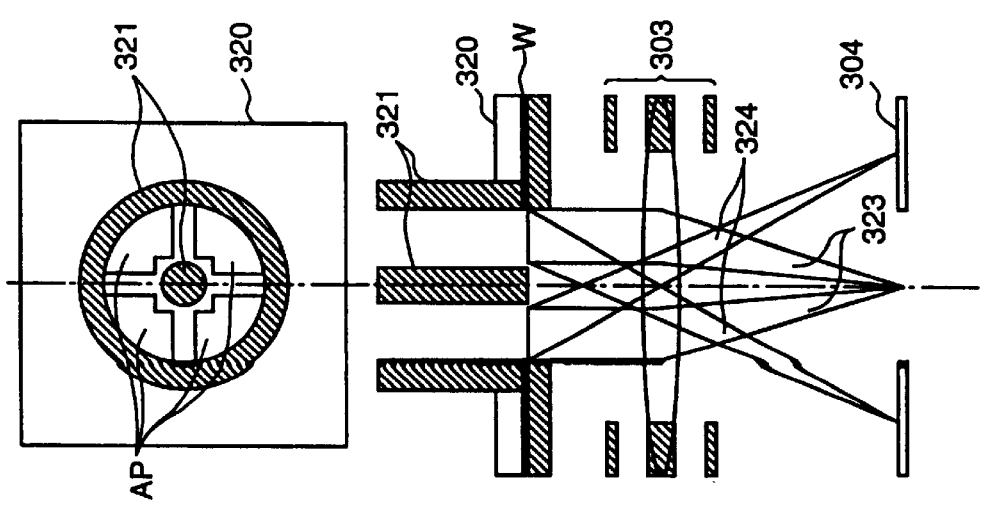

FIG. 15A
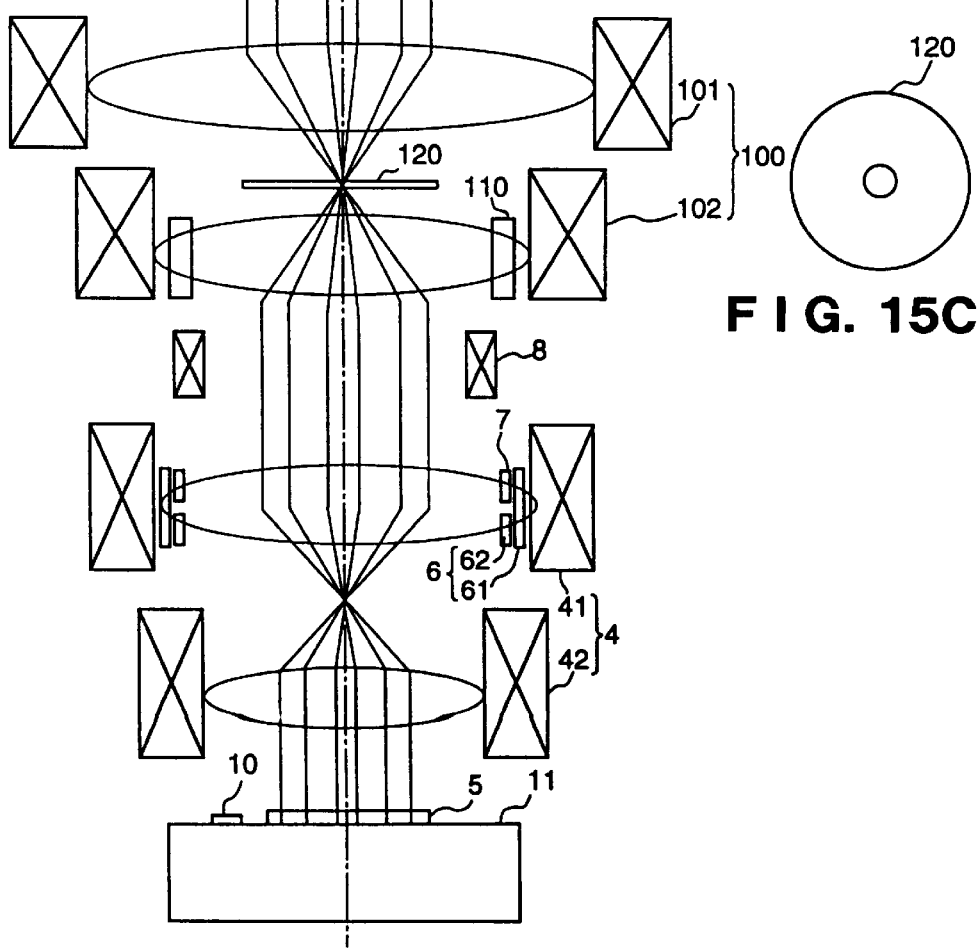
FIG. 15B
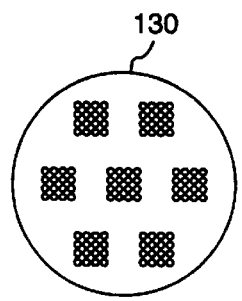
FIG. 15C

Lx, Ly : CONVERSION ON WAFER

FIG. 18
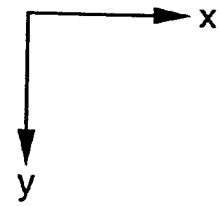
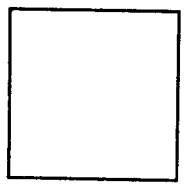 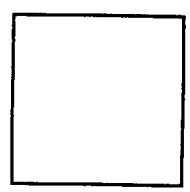
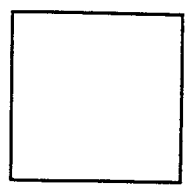 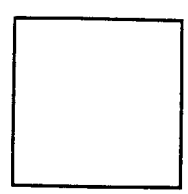 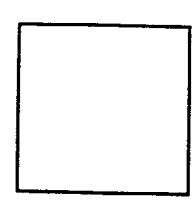
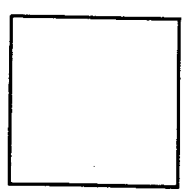 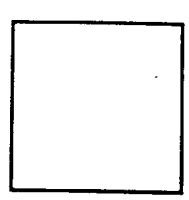

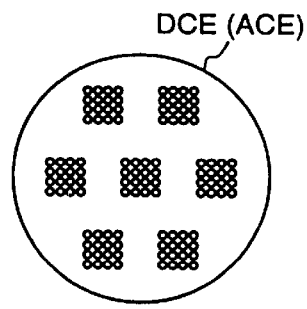
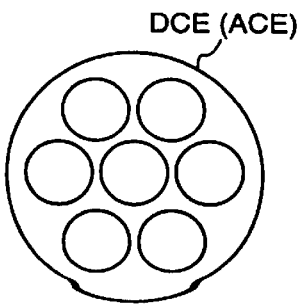
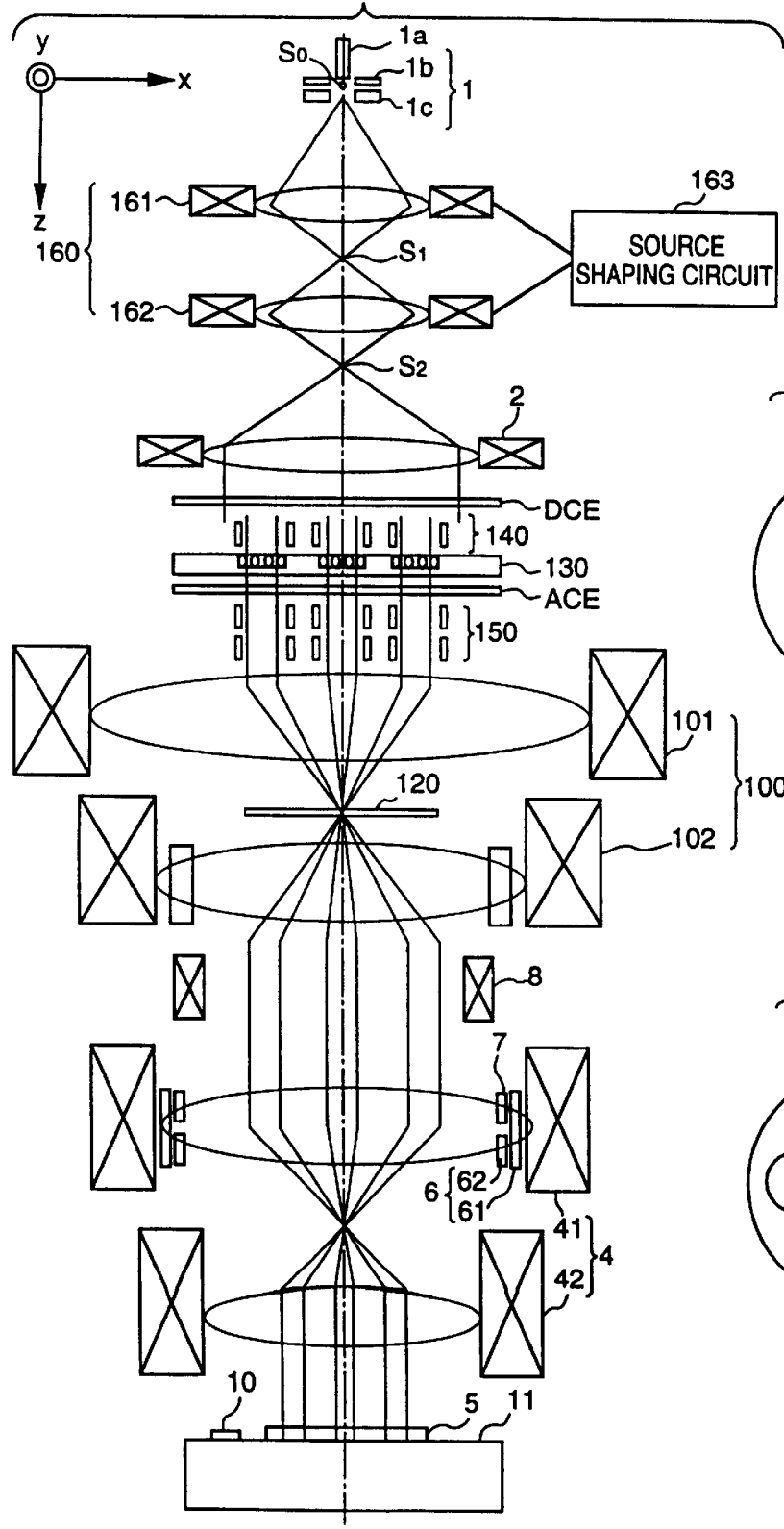

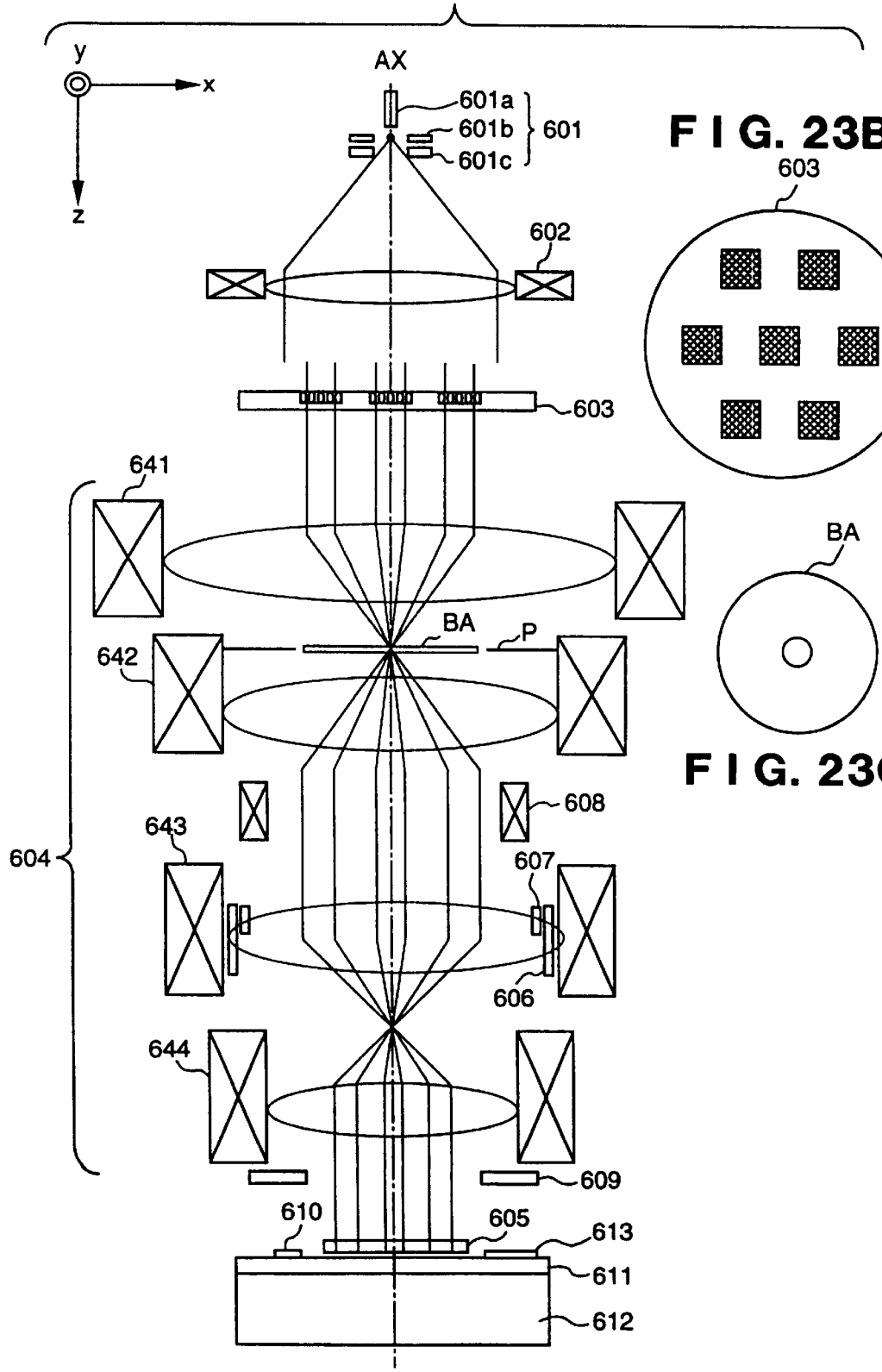

FIG. 33

| (SEQUENTIAL No.) | (ARRAY POSITION) | (TYPE OF ARRAY ELEMENT) | (BLANKING CONTROL) |
|---|---|---|---|
| | | A(1,1) | |
| 1 | (x, y) | FME or RME | on or off |
| 2 | (x, y) | FME or RME | on or off |
| ......... | ......... | ......... | ......... |
| | | G(5,5) | |
| n | (x, y) | FME or RME | on or off |

FLOW OF MANUFACTURING SEMICONDUCTOR DEVICE

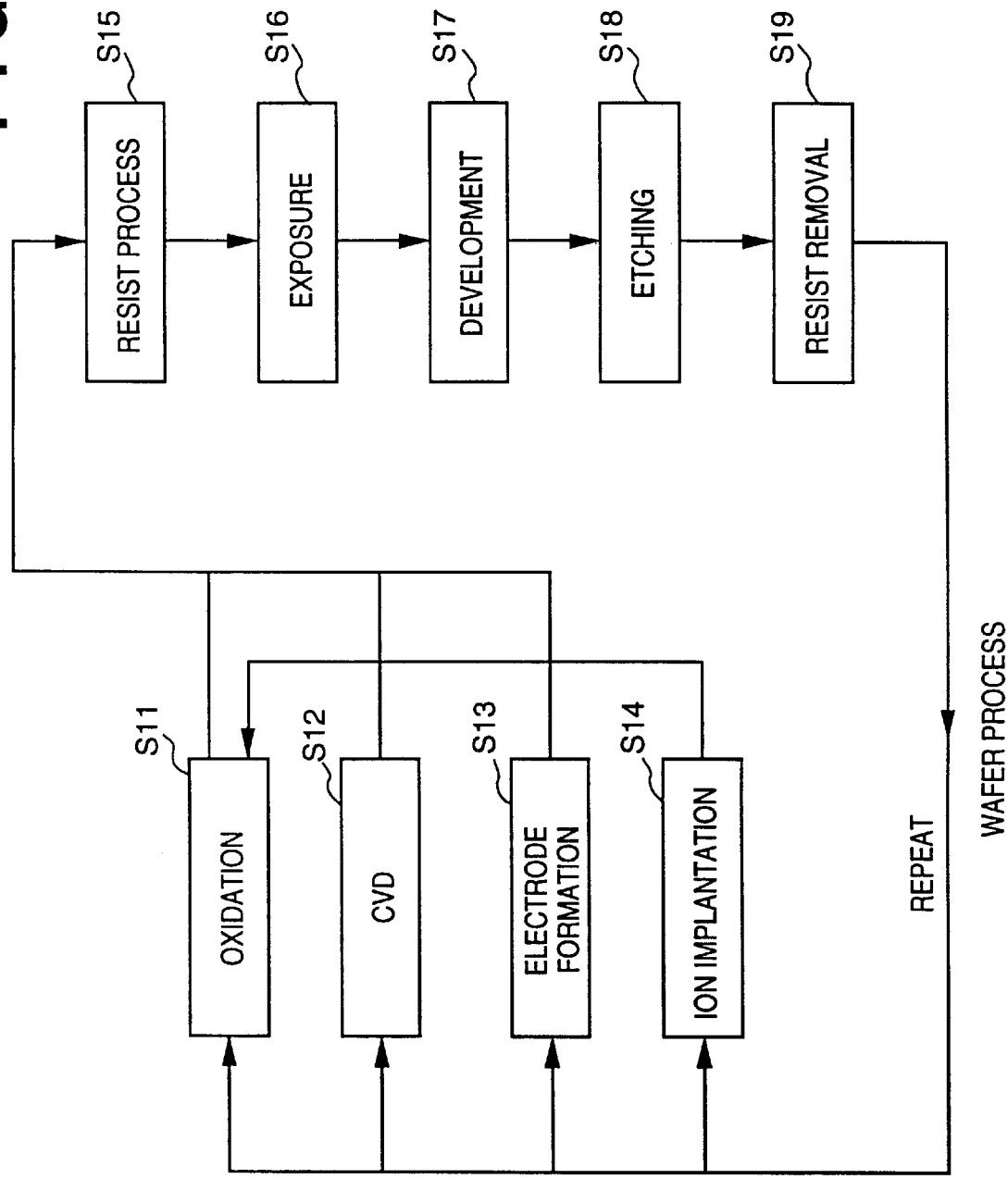

ELECTRON BEAM EXPOSURE APPARATUS AND METHOD

This application is a division of application No. 09/098,432, filed Jun. 17, 1998, U.S. Pat. No. 5,973,332 which in turn is a divisional of application No. 08/811,602, filed Mar. 4, 1997, U.S. Pat. No. 5,834,783.

BACKGROUND OF THE INVENTION

The present invention relates to an electron beam exposure apparatus and method, and a device manufacturing method and, more particularly, to an electron beam exposure apparatus and method in which exposure is performed by making a source emit an electron beam to form an image by the electron beam, and reducing and projecting the image on a target exposure surface by a reduction electron optical system, a stencil mask type electron beam exposure apparatus, and a device manufacturing method to which the above apparatus or method is applied.

Examples of electron beam exposure apparatuses are apparatuses of a point beam type which uses a spot-like beam, a variable rectangular beam type which uses a beam variable in its size and having a rectangular section, and a stencil mask type which uses a stencil to form a beam having a desired sectional shape.

The point beam type electron beam exposure apparatus is exclusively used for research and development purposes because of low throughput. The variable rectangular beam type electron beam exposure apparatus has a throughput higher than that of the point beam type apparatus by one to two orders, though the problem of throughput is still serious in forming an exposure pattern in which about 0.1 $\mu$m fine patterns are highly integrated. The stencil mask type electron beam exposure apparatus uses a stencil mask having a portion corresponding to a variable rectangular aperture in which a plurality of repeated pattern through holes are formed. The stencil mask type electron beam exposure apparatus can advantageously for repeated patterns by exposure, and its throughput is higher than that of the variable rectangular type electron beam exposure apparatus.

FIG. 2 shows the arrangement of an electron beam exposure apparatus having a stencil mask. An electron beam from an electron gun 501 is irradiated on a first aperture 502 for defining the electron bean irradiation area of the stencil mask. The illumination electron beam defined by the first aperture irradiates the stencil mask on a second aperture 504 through a projection electron lens 503 so that the electron beam passing through repeated pattern through holes which are formed in the stencil mask is reduced and projected on a wafer 506 by a reduction electron optical system 505. The images of the repeated pattern through holes are moved on the wafer by a deflector 507 to sequentially expose the wafer.

The stencil mask type electron beam exposure apparatus can form repeated patterns by a single exposure operation, so the exposure speed can be increased. However, although the stencil mask type electron beam exposure apparatus has a plurality of pattern through-holes, as shown in FIG. 3, the patterns must be formed in advance as the stencil mask in accordance with the exposure pattern.

Because of the space charge effect and the aberrations of the reduction electron optical system, the exposure area which can be exposed at once is limited. If a semiconductor circuit needs so many transfer patterns that they cannot be formed in one stencil mask, a plurality of stencil masks must be prepared and used one by one. Time for exchanging the mask is required, resulting in a large decrease in throughput.

When the stencil mask has patterns with different sizes, or when the pattern is a combination of patterns with different sizes, the blur of the exposure pattern caused by the space charge effect changes depending on the size of the pattern. Since the refocus amount changes depending on the size of the pattern accordingly, the blur cannot be corrected by refocusing. Therefore, such a pattern cannot be used as a stencil mask pattern.

An apparatus for solving this problem is a multi-electron beam exposure apparatus which irradiates a plurality of electron beams on the sample surface along designed coordinates, deflects the plurality of electron beams along the designed coordinates to scan the sample surface, and at the same time, independently turns on/off the plurality of electron beams in correspondence with the pattern to be drawn, thereby drawing the pattern. The multi-electron beam exposure apparatus can draw an arbitrary pattern without using any stencil mask, so the throughput can be increased.

FIG. 38A shows the arrangement of the multi-electron beam exposure apparatus. Reference numerals 501a, 501b, and 501c denote electron guns capable of independently turning on/off electron beams; 502, a reduction electron optical system for reducing and projecting the plurality of electron beams from the electron guns 501a, 501b, and 501c on a wafer 503; and 504, a deflector for deflecting the plurality of electron beams reduced and projected on the wafer 503.

The plurality of electron beams from the electron guns 501a, 501b, and 501c are deflected by the same amount by the deflector 504. With reference to the beam reference position, each electron beam sequentially sets its position on the wafer and moves in accordance with an array defined by the deflector 504. The electron beams expose different exposure areas in exposure patterns to be formed.

FIGS. 38B to 38D show a state in which the electron beams from the electron guns 501a, 501b, and 501c expose the corresponding exposure areas in exposure patterns to be formed in accordance with the same array. While setting and shifting the positions on the array in the order of (1,1), (1,2), . . . , 1,16), (2,1), (2,2), . . . , (2,16), (3,1), each electron beam is turned on at a position where an exposure pattern (P1, P2, P3) to be formed is present to expose the corresponding exposure area in the exposure pattern (PI, P2, P3) to be formed (i.e., a so-called raster scan is performed).

However, in the multi-electron beam exposure apparatus using a raster scan, when the size of the exposure pattern to be formed is small, each electron beam must be turned on at a position defined by further finely dividing the exposure region of the electron beam (the array interval of the array defined by the deflector 504 decreases small). As a result, with the same exposure area, the number of times of setting the position of the electron beam and exposing the area increases, resulting in a large decrease in throughput.

FIG. 43 shows the main part of the multi-electron beam exposure apparatus. Reference numerals 501a, 501b, and 501c denote electron guns capable of independently turning on/off electron beams; 502, a reduction electron optical system for reducing and projecting the plurality of electron beams from the electron guns 501a, 501b, and 501c on a wafer 503; 504, a deflector for scanning the plurality of electron beams reduced and projected on the wafer 503; 505, a dynamic focus coil for correcting the focus position of the electron beam in accordance with any deflection errors generated in the electron beam passing through the reduction electron optical system 502 when the deflector 504 is actuated; and 506, a dynamic stigmatic coil for correcting the astigmatism of the electron beam in accordance with the deflection errors.

With the above arrangement, the plurality of electron beams are scanned on the wafer to expose the wafer in which the exposure areas of the electron beams are adjacent to each other.

However, the deflection errors generated in the plurality of electron beams passing through the reduction electron optical system 502 when the deflector 504 is actuated are different from each other. For this reason, even when the focus position and astigmatism of each electron beam are corrected by a dynamic focus coil and a dynamic stigmatic coil, optimum correction for each electron beam can hardly be performed.

SUMMARY OF THE INVENTION

It is the first object of the present invention to provide an electron beam exposure apparatus and method which minimize the influence of the space charge effect and aberrations of the reduction electron optical system and increase the area which can be exposed at once, thereby increasing the throughput.

According to the present invention, the foregoing object is attained by providing an electron beam exposure apparatus having a source for emitting electron beams and a reduction electron optical system for reducing and projecting, on a target exposure surface, an image formed with the electron beam emitted from the source, comprising: a correction electron optical system arranged between the source and the reduction electron optical system to form a plurality of intermediate images of the source for correcting an aberration generated by the reduction electron optical system, the intermediate images being reduced and projected on the target exposure surface by the reduction electron optical system.

According to another aspect of the present invention, the foregoing object is attained by providing an electron beam exposure method in which exposure is performed by making a source emit an electron beam to form an image, and reducing and projecting the image on a target exposure surface by a reduction electron optical system, comprising: the intermediate image formation step of forming a plurality of intermediate images of the source for correcting an aberration generated by the reduction electron optical system by a correction electron optical system arranged between the source and the reduction electron optical system.

According to still another aspect of the present invention, the foregoing object is attained by providing an electron beam exposure method in which exposure is performed by independently shielding a plurality of electron beams in accordance with an exposure pattern to be formed on a target exposure surface while scanning the plurality of electron beams on the target exposure surface, comprising: the exposure procedure setting step of setting an exposure procedure in which the plurality of electron beams are scanned while skipping a portion where all the plurality of electron beams are shielded; and the control step of controlling exposure in accordance with the set exposure procedure.

It is the second object of the present invention to provide an electron beam exposure apparatus which relaxes the limitation in patterns usable in a stencil mask.

According to the present invention, the foregoing object is attained by providing an electron beam exposure apparatus having a source for emitting an electron beam and a reduction electron optical system for bringing the electron beam into a focus on a target exposure surface, comprising: electron density distribution adjustment means for adjusting electron density distribution of the electron beam when the electron beam passes through a pupil plane of the reduction electron optical system, in which density distribution of an electron density at a peripheral portion on the pupil plane becomes higher than that at a central portion.

It is the third object of the present invention to provide an electron beam exposure apparatus and method which suppress a decrease in throughput for a fine pattern.

According to the present invention, the foregoing object is attained by providing an electron beam exposure apparatus which has a deflector for deflecting a plurality of electron beams and exposes a target exposure surface by deflecting the plurality of electron beams, and simultaneously, independently controlling irradiation of the plurality of electron beams, comprising: control means for controlling an exposure operation such that a unit of deflection by the deflector is set to be small in a first area where a contour area of a pattern is formed by exposure with at least one of the plurality of electron beams, and the unit of deflection by the deflector is set to be large in a second area different from the first area, where an inner area of the pattern is formed by exposure with at least one of the plurality of electron beams.

According to another aspect of the present invention, the foregoing object is attained by providing an electron beam exposure method in which a target exposure surface is exposed by deflecting a plurality of electron beams by a common deflector, and simultaneously, independently controlling irradiation of the plurality of electron beams, comprising: the control step of controlling an exposure operation to set a unit of deflection by the deflector to be small in a first area where a contour area of a pattern is formed by exposure with at least one of the plurality of electron beams, and the unit of deflection by the deflector is set to be large in a second area different from the first area, where an inner area of the pattern is formed by exposure with at least one of the plurality of electron beams.

According to still another aspect of the present invention, the foregoing object is attained by providing an electron beam exposure method in which a target exposure surface is exposed by deflecting a plurality of electron beams by a common deflector, and simultaneously, independently controlling irradiation of the plurality of electron beams, comprising: the area determination step of determining, on the basis of an exposure pattern to be formed on the target exposure surface, a first area where a contour area of the pattern is formed by exposure with at least one of the plurality of electron beams and a second area different from the first area, where an inner area of the pattern is formed by exposure with at least one of the plurality of electron beams; and the control step of controlling an exposure operation to set a unit of deflection by the deflector to be small in the first area, and the unit of deflection by the deflector is set to be large in the second area.

It is the fourth object of the present invention to provide an electron beam exposure apparatus and method which can independently correct aberrations generated in a plurality of electron beams.

According to the present invention, the foregoing object is attained by providing an electron beam exposure apparatus having a source for emitting an electron beam, and a reduction electron optical system for reducing and projecting, on a target exposure surface, an image formed with the electron beam emitted from the source, comprising:

an element electron optical system array constituted by arranging a plurality of subarrays each including at least one element electron optical system which forms an intermediate image of the source between the source and the reduction electron optical system with the electron beam emitted from the source; deflection means for deflecting an electron beam from the element electron optical system array to scan the target exposure surface; and correction means for correcting in units of subarrays a deflection error generated when the electron beam from the element electron optical system array is deflected by the deflection means.

According to another aspect of the present invention, the foregoing object is attained by providing an electron beam exposure method in which exposure is performed by making a source emit an electron beam to form an image, and reducing and projecting the image on a target exposure surface by a reduction electron optical system, comprising: the correction step of correcting, in units of subarrays, a deflection error generated when an electron beam from an element electron optical system array constituted by arranging the plurality of subarrays each including at least one element electron optical system which forms an intermediate image between the source is deflected to scan the target exposure surface.

It is the fifth object of the present invention to provide a method of manufacturing a device by using the above electron beam exposure apparatus and method.

Further objects, features and advantages of the present invention will become apparent from the following detailed description of embodiments of the present invention with reference to the accompanying drawings.

BRIEF DESCRIPTION OF THE DRAWINGS

FIGS. 5A and 5B are views for explaining an element electron optical system;

FIG. 7 is a view showing the wiring of a blanking electrode;

FIG. 9 is a view for explaining the intermediate aperture electrode of the element electron optical system;

FIGS. 13A and 13B are views for explaining arrangement 1 of the element electron optical system;

FIGS. 15A–15C are views for explaining the arrangement of an electron beam exposure apparatus according to the present invention;

FIG. 18 is a view for explaining the scan field of the element electron optical system array;

FIGS. 20A to 20C are views for explaining the arrangement of an electron beam exposure apparatus according to the present invention;

FIGS. 23A–23C are views for explaining the arrangement of an electron beam exposure apparatus according to the present invention;

FIG. 33 is a view for explaining the exposure control data;

FIG. 46 is a flow chart for explaining a wafer process.

DETAILED DESCRIPTION OF PREFERRED EMBODIMENTS

First Mode of Carrying Out the Invention

[Description of Principle]

Figure 4A:
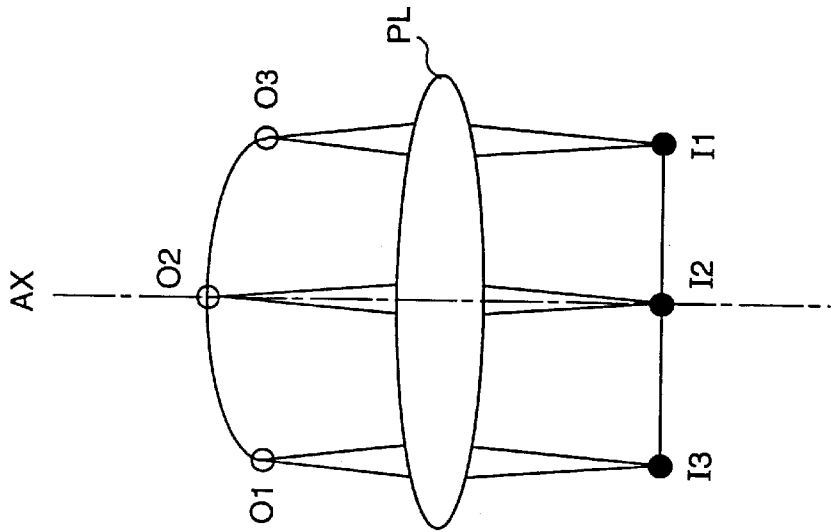
FIGS. 4A and 4B are views for explaining the principle of the present invention.
Figure 4B:
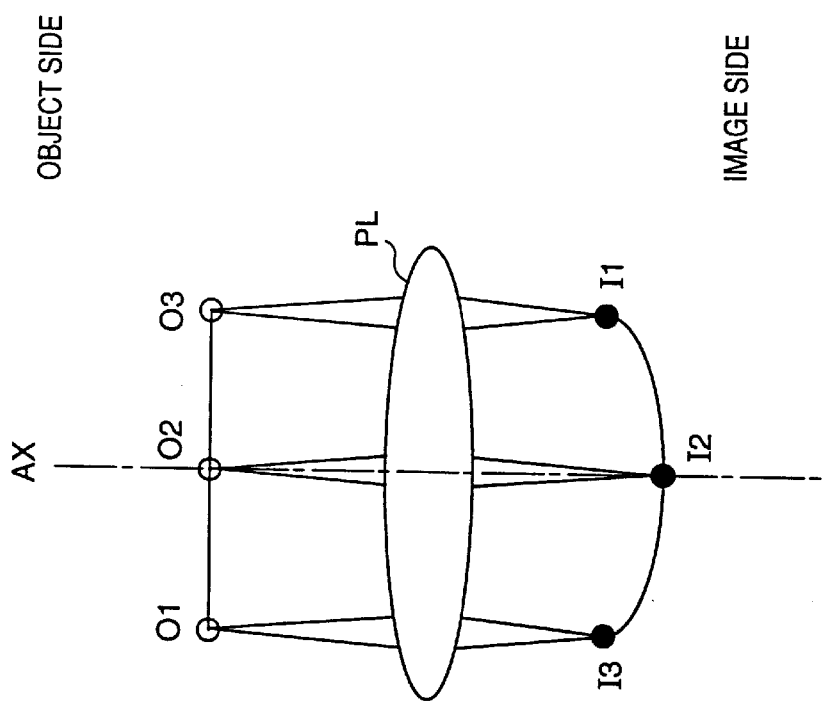

FIGS. 4A and 4B are views for explaining the principle of the present invention. Reference symbol PL denotes a reduction electron optical system; and AX, an optical axis of the reduction electron optical system PL. Reference numerals 01, 02, and 03 denote point sources for emitting electrons; and I1, I2, and I3, point source images corresponding to the point sources.

Referring to FIG. 4A, electrons emitted from the point sources 01, 02, and 03 which are located on a plane perpendicular to the optical axis Ax on the object side of the reduction electron optical system PL form the point source images I1, I2, and I3 corresponding to the point sources on the image side of the reduction electron optical system PL. The point source images I1, I2, and I3 are not formed on the same plane perpendicular to the optical axis AX because of the aberrations (curvature of field) of the reduction electron optical system.

In the present invention, to form the point source images I1, I2, and I3 on the same plane perpendicular to the optical axis AX, as shown in FIG. 4B, the point sources 01, 02, and 03 are located at different positions along the optical axis in accordance with the aberrations (curvature of field) of the reduction electron optical system. In addition, since the aberrations (astigmatism, coma, or distortion) of the reduction electron optical system change depending on the positions of the sources on the object side, desired source images are formed on the same plane by distorting the sources in advance.

In the present invention, a correction electron optical system is arranged to form a plurality of intermediate images of a source on the object side of the reduction electron optical system and to correct in advance the aberrations generated when the intermediate images are reduced and projected on a target exposure surface by the reduction electron optical system. With this arrangement, a lot of source images each having a desired shape can be simultaneously formed in a wide exposure area.

The plurality of intermediate images need not always be formed from one source, and may be formed from a plurality of sources, as a matter of course.

Embodiments of the present invention will be described below in detail.

(First Embodiment)

[Description of Constituent Elements of Exposure System]

Figure 1:
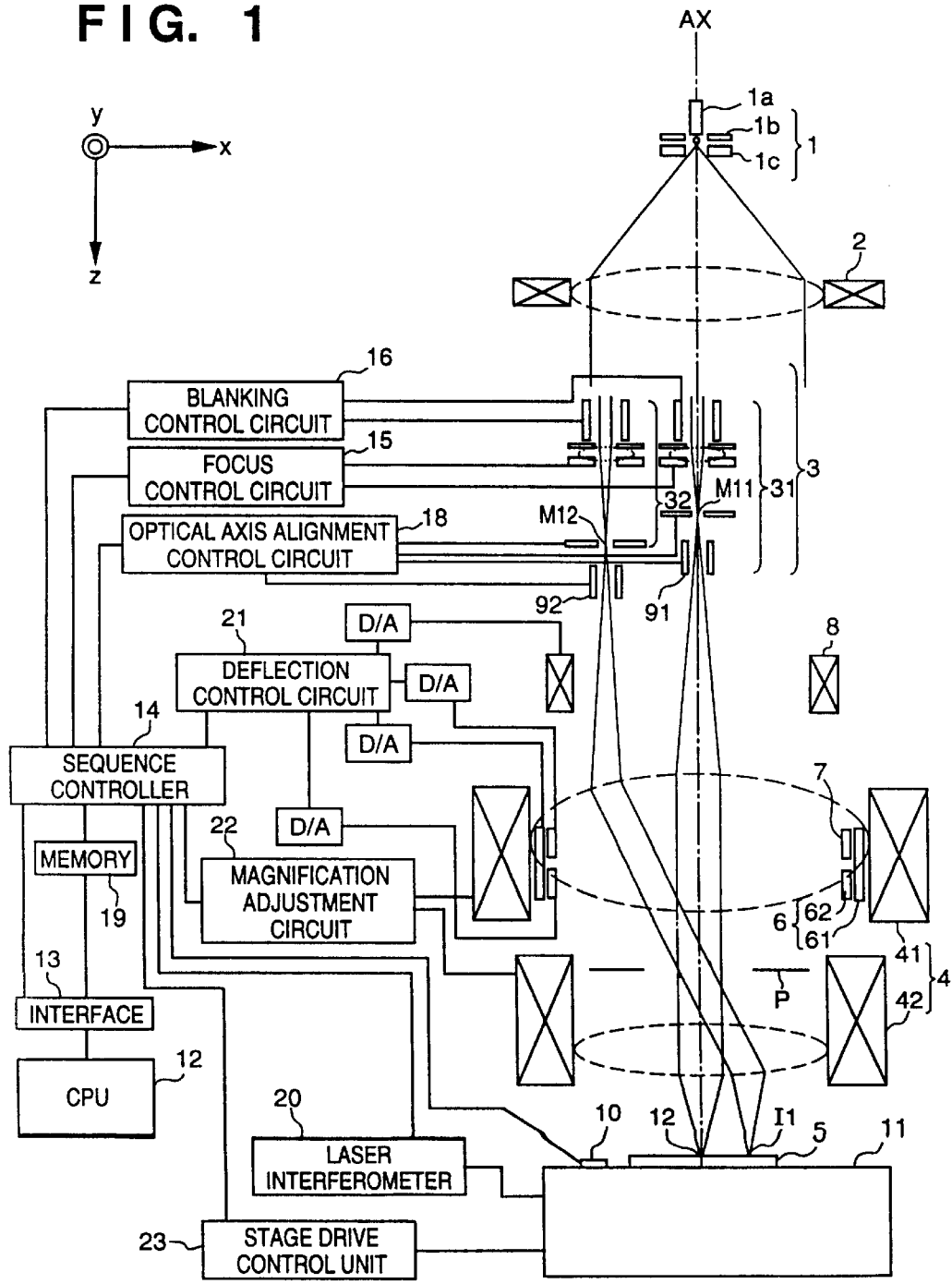
FIG. 1 is a view for explaining the arrangement of an electron beam exposure apparatus according to the present invention.
Figure 2:
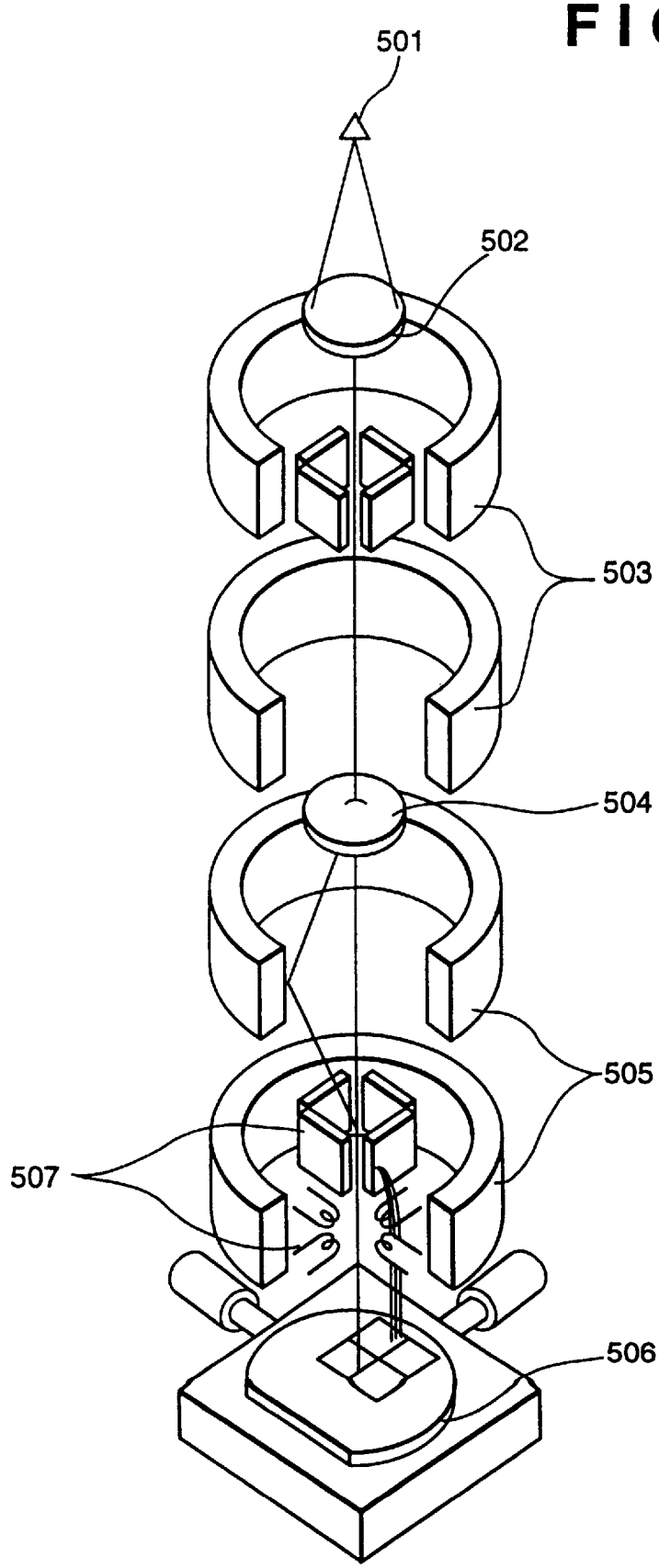
FIG. 2 is a view for explaining the arrangement of a stencil mask type electron beam exposure apparatus.
Figure 3:
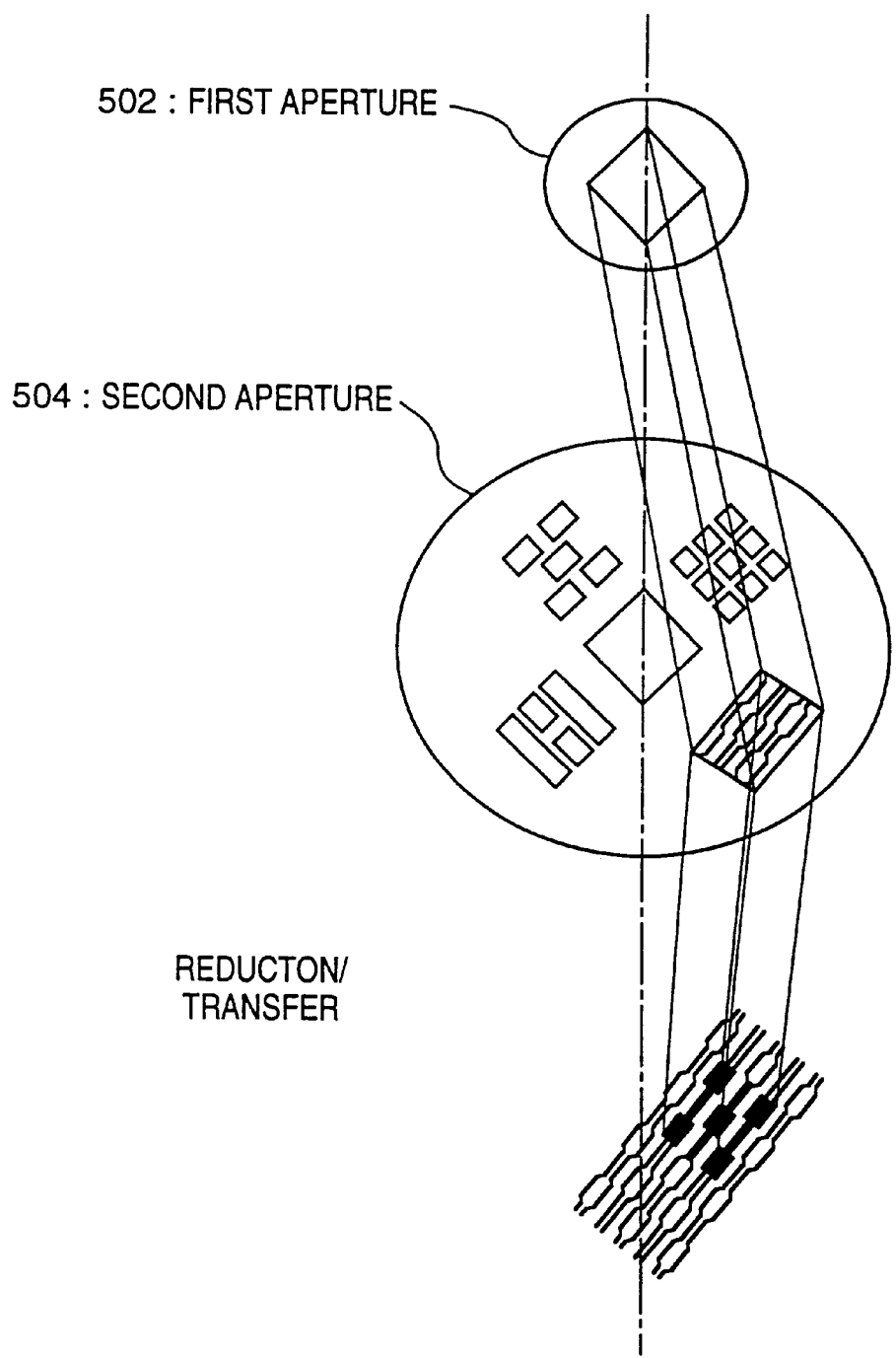
FIG. 3 is a view for explaining the concept of exposure by the stencil mask type electron beam exposure apparatus.

FIG. 1 is a view showing an electron beam exposure apparatus according to the first embodiment of the present invention.

Referring to FIG. 1, reference numeral 1 denotes an electron gun consisting of a cathode 1*a*, a grid 1*b*, and an anode 1*c*. Electrons emitted from the electron gun 1 form crossover image between the grid 1*b* and the anode 1*c*.

The electron gun 1 has a function of changing the grid voltage so as to change the size of the crossover image.

Since an electron optical system (not shown) for enlarging/reducing or shaping the crossover image is used, an enlarged/reduced or shaped crossover image can be obtained. With this arrangement, the size and shape of the crossover image can be changed (the crossover image will be referred to as a source hereinafter).

Electrons emitted from the source are formed into an almost collimated electron beam through a condenser lens 2 whose front focal position is set at the position of the source. The almost collimated electron beam is incident on a correction electron optical system 3 in which a plurality of element electron optical systems (31, 32) (the number of element electron optical systems is preferably as large as possible, though two element electron optical systems are illustrated for the descriptive convenience) are aligned in a direction perpendicular to the optical axis. The plurality of element electron optical systems (31, 32) constituting the correction electron optical system 3 will be described later in detail.

The correction electron optical system 3 forms a plurality of immediate images (MI1, MI2) of the source. The intermediate images form source images (I1, I2) on a wafer 5 through a reduction electron optical system 4. The elements of the correction electron optical system 3 are set to make the interval between the source images on the wafer 5 an integer multiple of the size of the source image. The correction electron optical system 3 changes the positions of the intermediate images along the optical axis in accordance with the curvature of field of the reduction electron optical system 4, and at the same time, corrects in advance any aberrations generated when the intermediate images are reduced and projected on the wafer 5 by the reduction electron optical system 4.

The reduction electron optical system 4 is a symmetrical magnetic tablet consisting of a first projecting lens 41 and a second projecting lens 42. When the focal length of the first projecting lens 41 is represented by f1, and that of the second projecting lens 42 is represented by f2, the distance between the two lenses is f1+f2. The intermediate image on the optical axis AX is formed at the focal position of the first projecting lens 41, and the image of the intermediate image is formed at the focal point of the second projecting lens 42. This image is reduced to –f2/f1. Since the two lens magnetic fields are determined to act in opposite directions, Seidel's aberrations except five aberrations, i.e., spherical aberration, isotropic astigmatism, isotropic coma, curvature of field, and on-axis chromatic aberration, and chromatic aberrations associated with rotation and magnification are canceled in theory.

A deflector 6 deflects the electron beams from the plurality of intermediate images to move the images of the plurality of intermediate images in the X and Y directions on the wafer. The deflector 6 is constituted by an MOL (Moving Object Lens) type electromagnetic deflector 61 which deflects a beam by a converging magnetic field and a deflection magnetic field satisfying the MOL condition, and an electrostatic deflector 62 which deflects a beam by an electric field. The electromagnetic deflector 61 and the electrostatic deflector 62 are selectively used in accordance with the moving distance of the source image. A dynamic focus coil 7 corrects any shift in focal position caused by deflection errors generated when the deflector is actuated. A dynamic stigmatic coil 8 corrects astigmatism generated by deflection.

Each of deflectors 91 and 92 is constituted by a plurality of electrostatic deflectors for translating (in the X and Y directions) or deflecting (tilt with respect to the Z-axis) the electron beam from the plurality of intermediate images formed by the correction electron optical system.

A Faraday cup 10 has two single knife-edges extending along the X and Y directions.

An X-Y-Z stage 11 is movable in the X, Y, and Z directions while mounting the wafer 5 thereon, and is controlled by a stage drive control unit 23.

The Faraday cup 10 fixed on the wafer stage detects the charge amount of the source image formed with the electron beam from the element electron optical system while moving through the knife-edges in cooperation with a laser interferometer 20 for detecting the position of the X-Y-Z stage. With this arrangement, the size and position (X,Y,Z) of the source image, and the current irradiated from the element electron optical system can be detected.

The element electron optical system constituting the correction electron optical system 3 will be described below with reference to FIGS. 5A and 5B.

Referring to FIG. 5A, reference numeral 301 denotes a blanking electrode consisting of a pair of electrodes and having a deflection function; 302, an aperture stop having an aperture (AP) for defining the shape of the electron beam passing through the aperture, on which a wiring layer (W) for turning on/off the blanking electrode 301 is formed; 303, a unipotential lens consisting of three aperture electrodes and having a converging function of setting the upper and lower electrodes at an acceleration potential V0 and keeping the intermediate electrode at another potential V1; and 304, a blanking aperture positioned on the focal plane of the aperture stop 302.

The electron beam which is nearly collimated by the condenser lens 2 is formed into an intermediate image (MI) of the source on the blanking aperture 304 by the unipotential lens 303 through the blanking electrode 301 and the aperture (AP). If, at this time, no electric field is applied between the electrodes of the blanking electrode 301, an electron beam 305 is transmitted through the aperture of the blanking aperture 304. On the other hand, when an electric field is applied between the electrodes of the blanking electrode 301, an electron beam 306 is shielded by the blanking aperture 304. Since the electron beams 305 and 306 have different angular distributions on the blanking aperture 304 (the object plane of the reduction electron optical system), the electron beams 305 and 306 are incident on different areas at the pupil position (on a plane P in FIG. 1) of the reduction electron optical system, as shown in FIG. 5B. Therefore, in place of the blanking aperture 304, a blanking aperture 304' for passing only the electron beam 305 may be formed at the pupil position (on the plane P in FIG. 1) of the reduction electron optical system. The blanking aperture can be commonly used by other element electron optical systems constituting the correction electron optical system 3.

In this embodiment, a unipotential lens having a converging function is used. However, a bipotential lens having a diverging function may be used to form a virtual intermediate image.

Referring back to FIG. 1, the correction electron optical system 3 changes the positions of intermediate images formed by the element electron optical systems along the optical axis in accordance with the curvature of field of the reduction electron optical system 4. As a specific means therefor, identical element electron optical systems are used and set at different positions along the optical axis. As another technique, the element electron optical systems are set on the same plane, and the electron optical characteristics (focal length and major surface position) of the element electron optical systems, and more particularly, the unipotential lenses are changed to change the positions of the intermediate images along the optical axis. The latter means employed in this embodiment will be described in detail with reference to FIGS. 6A and 6B.

Figure 6A:
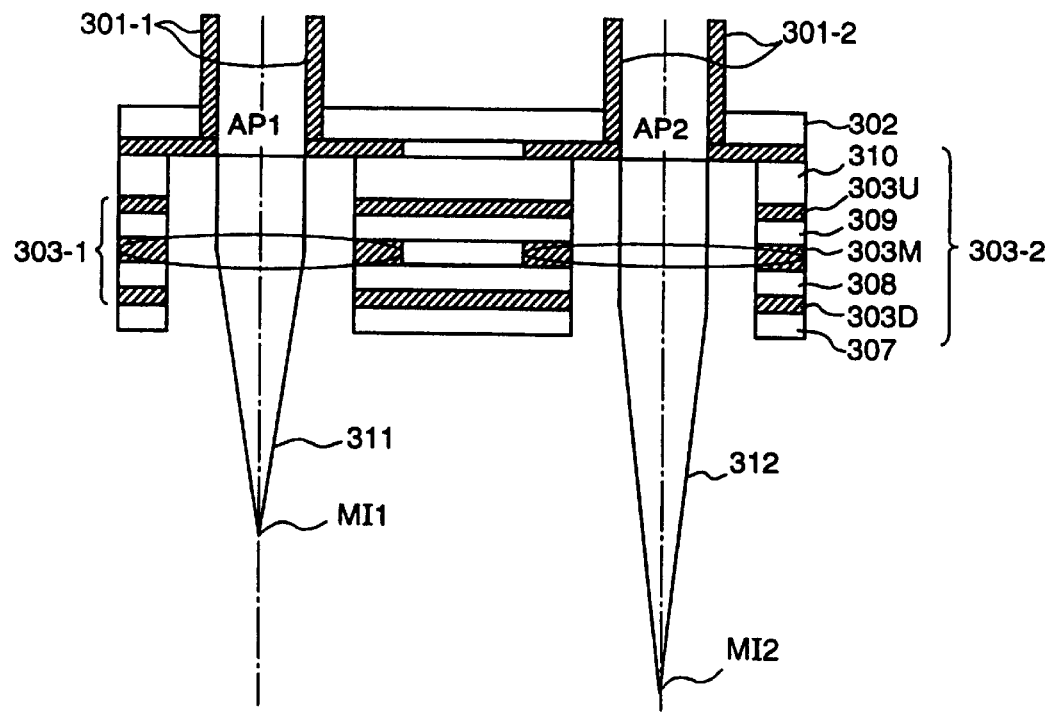
FIGS. 6A and 6B are views for explaining the element electron optical system.

Referring to FIG. 6A, blanking electrodes are formed for each aperture of the aperture stop 302 having two apertures (AP1, AP2) with the same shape, thereby constituting a blanking array. The blanking electrodes are independently wired to independently turn on/off the electric fields (FIG. 7).

Figure 8:
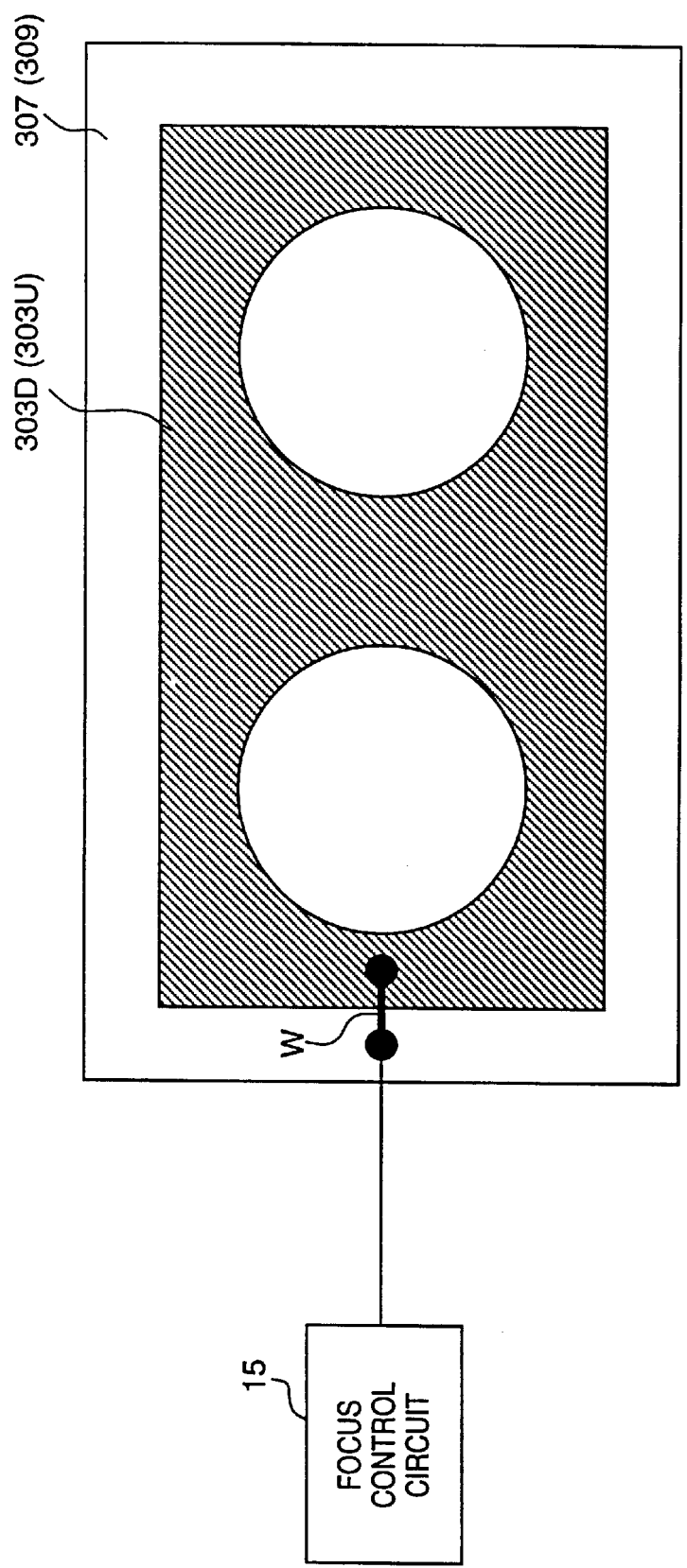
FIG. 8 is a view for explaining the upper and lower aperture electrodes of the element electron optical system.

Unipotential lenses 303-1 and 303-2 constitute a lens array by bonding three insulators 307 to 309 each having an electrode formed thereon. The electrodes are wired such that upper and lower electrodes (303U, 303D) can be set at a common potential (FIG. 8), and intermediate electrodes (303M) can be independently set at different potentials (FIG. 9). The blanking array and lens array form an integral structure while interposing an insulator 310.

The electrodes of the unipotential lenses 303-1 and 303-2 have the same shape. The focal lengths are different because the potentials of the intermediate electrodes are different. Therefore, the intermediate images (MI1, MI2) formed with electron beams 311 and 312 are located at different positions along the optical axis, respectively.

Figure 6B:
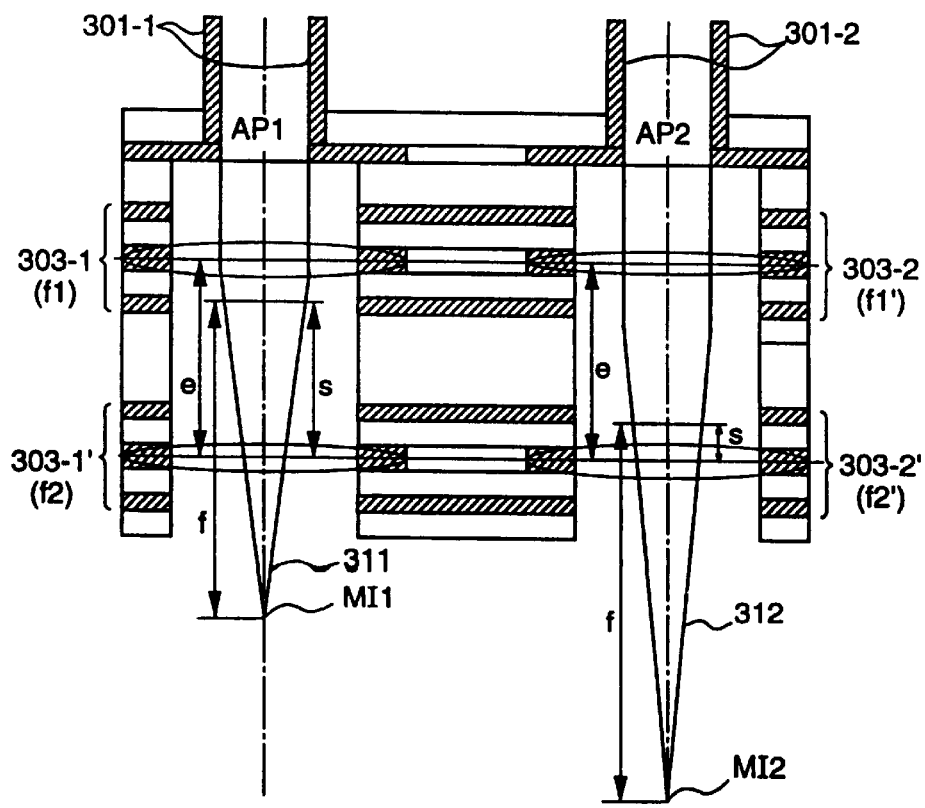

FIG. 6B shows another example of the element electron optical system which uses two lens arrays shown in FIG. 6A. Each element electron optical system is constituted by two unipotential lenses arranged at a predetermined interval. With this arrangement, the focal length and principal plane position of each element electron optical system can be independently controlled. When the focal length of the unipotential lens 303-1 is represented by f1, that of a unipotential lens 303-1' is represented by f2, the distance between the unipotential lenses is represented by e, the synthesized focal length is represented by f, and the principal plane position on the image plane side (the distance from the unipotential lens 303-1' toward the source side) is represented by s, the following equations hold paraxially:

$$1/f = 1/f1 + 1/f2 - e(f1 \times f2)$$

$$s = e \times f/f1$$

By adjusting the focal length of each unipotential lens (the potential of the intermediate electrode of each unipotential lens), the synthesized focal length and principal plane position of each element electron optical system can be independently set within limited ranges. The focal position (intermediate image formation position) changes by a distance corresponding to the moving amount of the major principal plane, as a matter of course. The focal lengths of the element electron optical systems can be made almost equal, and just the focal positions can be changed. In other words, the intermediate images of the source can be formed by the element electron optical systems at the same magnification (finally, the source images I1 and I2 on the wafer 5 are formed at the same magnification) while changing just the positions of the intermediate images along the optical axis. Therefore, the intermediate images (MI1, MI2) of the electron beams 311 and 312 can be formed at different positions along the optical axis. In this embodiment, the element electron optical system is constituted by two unipotential lenses. However, the element electron optical system may be constituted by three or more unipotential lenses.

Figure 10A:
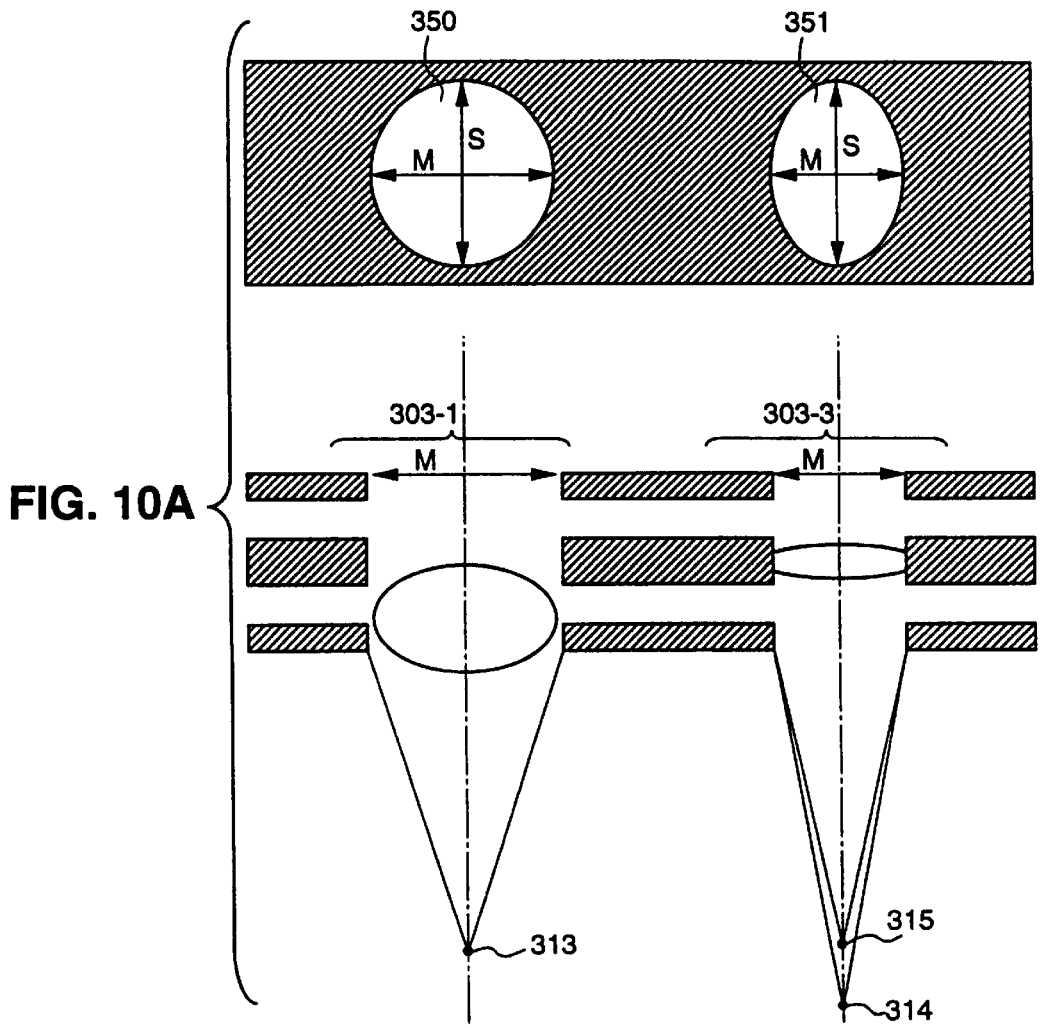
FIGS. 10A and 10B are views for explaining unipotential lenses each having astigmatism.

To correct astigmatism generated when each intermediate image is reduced and projected on the target exposure surface by the reduction electron optical system 4, each element electron optical system generates astigmatism of opposite sign. To generate the astigmatism of opposite sign, the shape of the aperture electrode constituting the unipotential lens is distorted. As shown in FIG. 10A, when the unipotential lens 303-1 has a circular aperture electrode 350, electrons distributed in a direction M and electrons distributed in a direction S form intermediate images at almost the same position 313. However, when a unipotential lens 303-3 has an elliptical aperture electrode 351, electrons distributed in the direction M (along the short diameter) form an intermediate image at a position 314, and electrons distributed in the direction S (along the long diameter) form an intermediate image at a position 315. With this arrangement, astigmatism of opposite sign can be generated.

Figure 10B:
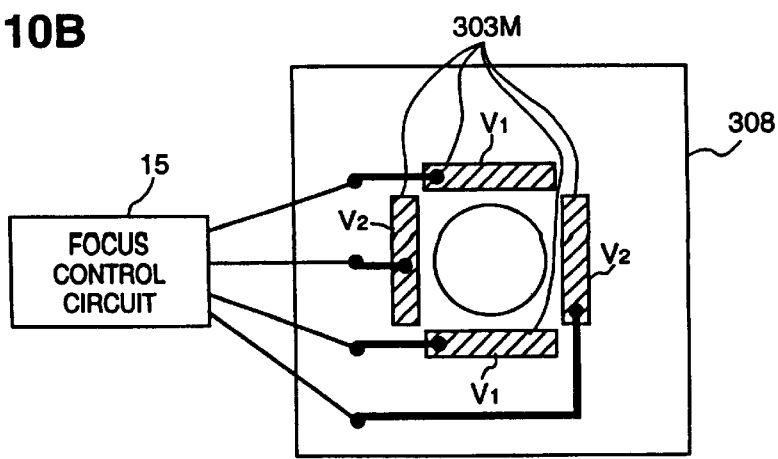

As shown in FIG. 10B, the intermediate electrode 303M of the unipotential lens 303-1 is divided into four portions. The potentials of opposing electrodes are set to be V1, and the potentials of the other opposing electrodes are set to be V2. The potentials V1 and V2 may be changed by a focus control circuit, and the function of the unipotential lens 303-1 can also be obtained in this case.

As described above, when the shape of the aperture electrode of the unipotential lens of each element electron optical system is changed in accordance with the astigmatism of the reduction electron optical system 4, astigmatism generated when each intermediate image is reduced and projected on the target exposure surface by the reduction electron optical system 4 can be corrected. One element electron optical system may be constituted by the unipotential lens 303-1 for correcting curvature of field and the unipotential lens 303-3 for correcting astigmatism such that the curvature of field and the astigmatism can be independently corrected or adjusted, as a matter of course.

To correct coma generated when each intermediate image is reduced and projected on the target exposure surface by the reduction electron optical system 4, each element electron optical system generates coma of opposite sign. As a technique of generating the coma of opposite sign, the aperture on the aperture stop 302 is decentered with respect to the optical axis of the unipotential lens 303 in each element electron optical system. As another technique, the electron beams from the plurality of intermediate images are independently deflected by the deflectors (91, 92) in each element electron optical system.

To correct distortion generated when each intermediate image is reduced and projected on the target exposure surface by the reduction electron optical system 4, the distortion characteristic of the reduction electron optical system 4 is determined in advance, and the position of each element electron optical system along the direction perpendicular to the optical axis of the reduction electron optical system 4 is set on the basis of the distortion characteristic.

[Description of Operation]

Figure 11A:
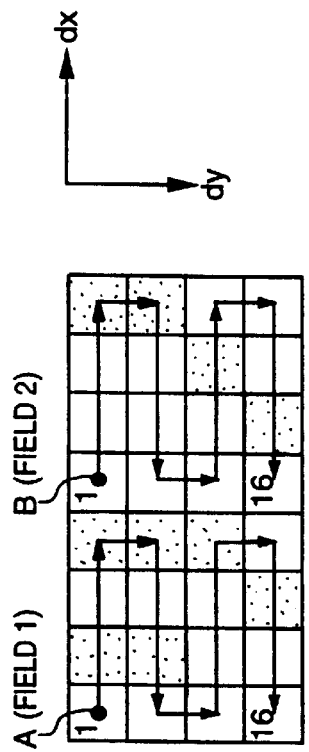
FIGS. 11A to 11C are views for explaining an exposure pattern and exposure pattern data generated from the exposure pattern.

The source images (I1, I2) formed on the wafer 5 by the element electron optical systems (31, 32) are deflected by the deflector 6 starting from reference positions (A, B) by the same predetermined amount as indicated by arrows in FIG. 11A, respectively, in their respective scan fields to expose the corresponding scan fields of the wafer 5. In FIG. 11A, each cell indicates an area to be exposed to one source image. Each hatched cell indicates an area to be exposed, and each unhatched cell indicates an area not to be exposed.

Figure 41:
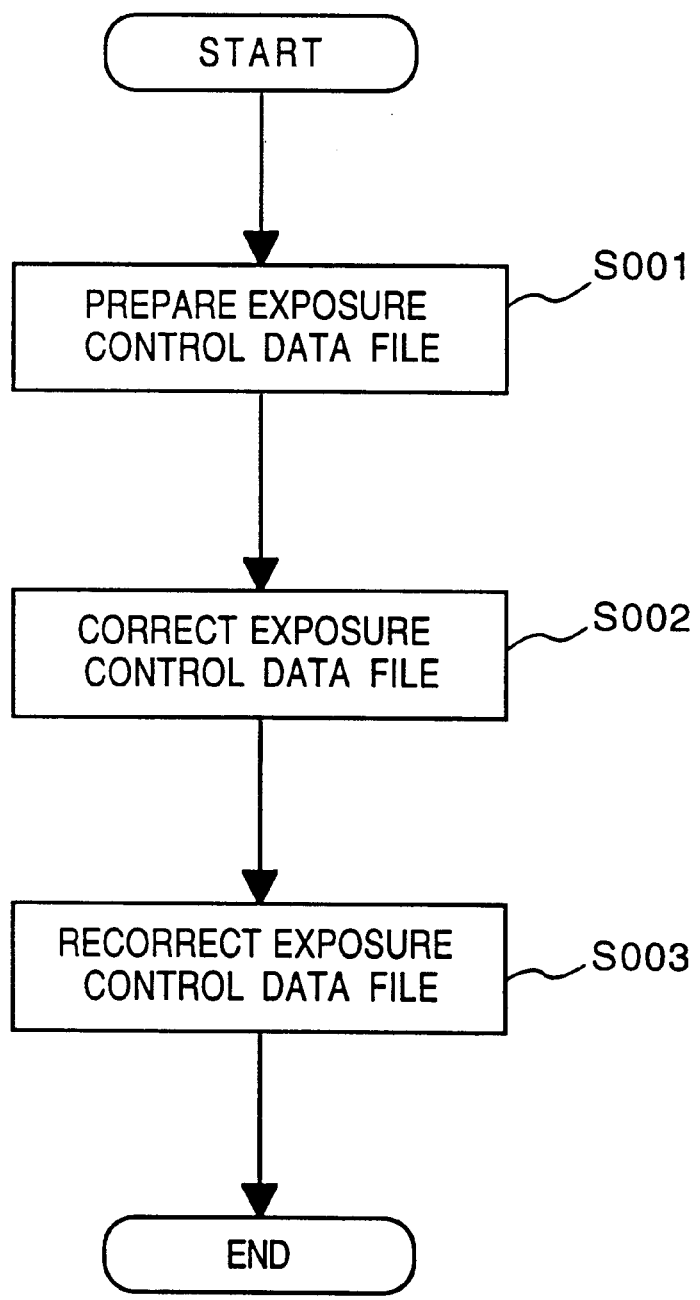
FIG. 41 is a flow chart for explaining preparation of an exposure control data file.

The procedures of preparing an exposure control data file for controlling the above exposure operation will be described below with reference to FIG. 41.

Figure 11B:
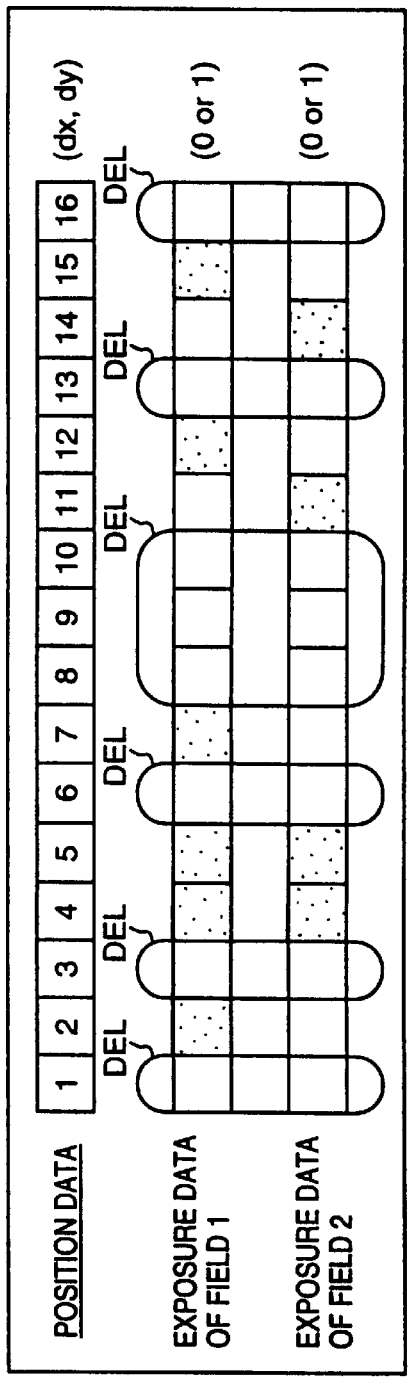

Upon receiving the pattern data of an exposure pattern as shown in FIG. 11A, a CPU 12 divides the exposure area into scan fields in units of element electron optical systems in step S001. As shown in FIG. 11B, exposure control data consists of the position data (dx,dy) of the exposure position based on the start position (A, B) in each scan field and exposure data representing whether exposure is to be performed at the exposure position in each scan field ("1" is set for a hatched cell, and "0" is set for an unhatched cell). The exposure control data are arranged in the order of exposure, thereby preparing an exposure control data file. The scan field of each element electron optical system is deflected by the deflector 6 and moved from the reference position (A, B) in the same predetermined amount. Therefore, exposure data of a plurality of scan fields is combined with one position data.

Figure 11C:
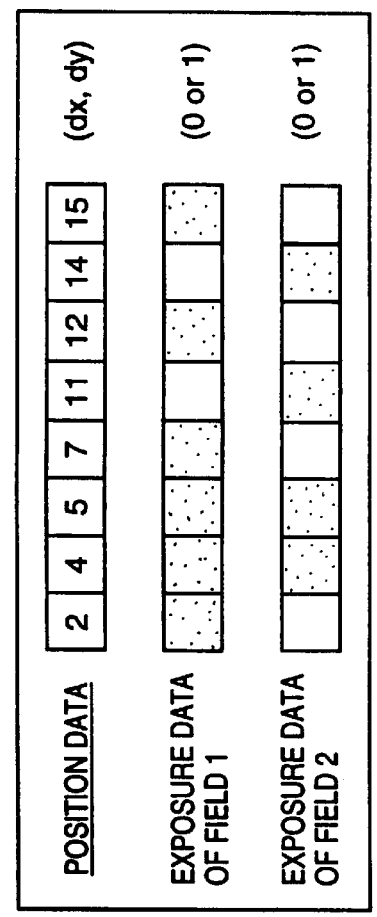

In step S002, when exposure is not performed in any scan field, i.e., when all exposure data are set at "0", the exposure control data are deleted (exposure data represented by DEL in FIG. 11B) to prepare a new exposure control data file as shown in FIG. 11C. The exposure control data file is stored in a memory 19 through an interface 13. By using the exposure control data prepared in the above manner, a deflection control circuit 21 can be operated such that scanning is performed while skipping portions where all exposure data are set at "0".

When the input pattern has a lot of repeated patterns at a specific period (pitch) (e.g., a DRAM circuit pattern consisting of a lot of patterns repeated at a period corresponding to the cell pitch), the CPU 12 sets the start position of each scan field in step S003 such that the interval of the start positions of the scan fields (the interval between the positions of sources formed on the wafer through the element electron optical systems) becomes an integer multiple of the specific period (pitch). With this processing, the number of exposure control data for which all exposure data are set at "0" increases, and the data can be further compressed. For this purpose, the magnification of the reduction electron optical system 4 is adjusted (the focal lengths of the first and second projecting lenses 41 and 42 are changed by a magnification adjustment circuit 22). Alternatively, the positions of intermediate images formed by the element electron optical systems are adjusted by the deflectors 91 and 92. Assume that a pattern has already been formed on the wafer 5, and that pattern is to be double-exposed to a pattern input to the apparatus. In some cases, the wafer may have expanded/contracted in processes before the double-exposure, and the previously formed pattern may also have expanded/contracted. In this apparatus, an alignment unit (wafer mark position detection unit) (not shown) is used to detect the positions of at least two wafer alignment marks on the wafer 5, thereby detecting the expansion/contraction ratio of the already formed pattern. The magnification of the reduction electron optical system 4 is adjusted by the magnification adjustment circuit 22 on the basis of the detected expansion/contraction ratio to increase/decrease the interval between the source images. At the same time, the gain of the deflector 6 is adjusted by the deflection control circuit 21 to increase/decrease the moving amount of the source image. With this arrangement, double-exposure can be satisfactorily performed even for an expanded/contracted pattern.

Referring back to FIG. 1, the operation of this embodiment will be described. When a calibration instruction for the exposure system is output from the CPU 12, a sequence controller 14 sets, through a focus control circuit 15, the potentials of the intermediate electrodes of the element electron optical systems to form intermediate images by the element electron optical systems of the correction electron optical system 3 at predetermined positions along the optical axis.

The sequence controller 14 controls a blanking control circuit 16 to turn on the blanking electrodes except that of the element electron optical system 31 (blanking on) such that only the electron beam from the element electron optical system 31 is irradiated on the X-Y-Z stage 11 side. Simultaneously, the X-Y-Z stage 11 is driven by the stage drive control unit 23 to move the Faraday cup 10 close to the source image formed by the electron beam from the element electron optical system 31. The position of the X-Y-Z stage 11 at this time is detected by the laser interferometer 20. While detecting the position of the X-Y-Z stage 11 and moving the X-Y-Z stage, the source image formed by the electron beam from the element electron optical system 31 is detected by the Faraday cup 10, thereby detecting the position and size of the source image and the irradiated current. A position (X1,Y1,Z1) where the source image assumes a predetermined size and a current I1 irradiated at that time are detected.

The sequence controller 14 controls the blanking control circuit 16 to turn on the blanking electrodes except that of the element electron optical system 32 such that only the electron beam from the element electron optical system 32 is irradiated on the X-Y-Z stage 11 side. Simultaneously, the X-Y-Z stage 11 is driven by the stage drive control unit 23 to move the Faraday cup 10 close to the source image formed by the electron beam from the element electron optical system 32. The position of the X-Y-Z stage 11 at this time is detected by the laser interferometer 20. While detecting the position of the X-Y-Z stage 11 and moving the X-Y-Z stage, the source image formed by the electron beam from the element electron optical system 32 is detected by the Faraday cup 10, thereby detecting the position and size of the source image and the irradiated current. In this way, the sequence controller 14 detects a position (X2,Y2,Z2) where the source image has a predetermined size and a current I2 irradiated at that time.

On the basis of the detection results, the sequence controller 14 translates the intermediate images in the X and Y directions by the deflectors 91 and 92 through an optical axis alignment control circuit 18 to locate the source images formed by the electron beams from the element electron optical systems 31 and 32 to hold a predetermined relative positional relationship along the X and Y directions. The sequence controller 14 also sets the potentials of the intermediate electrodes of the element electron optical systems again through the focus control circuit 15 to locate the source images formed by the electron beams from the element electron optical systems 31 and 32 within a predetermined range along the Z direction. In addition, the detected currents of the element electron optical systems, which are irradiated on the wafer, are stored in the memory 19.

Figure 12:
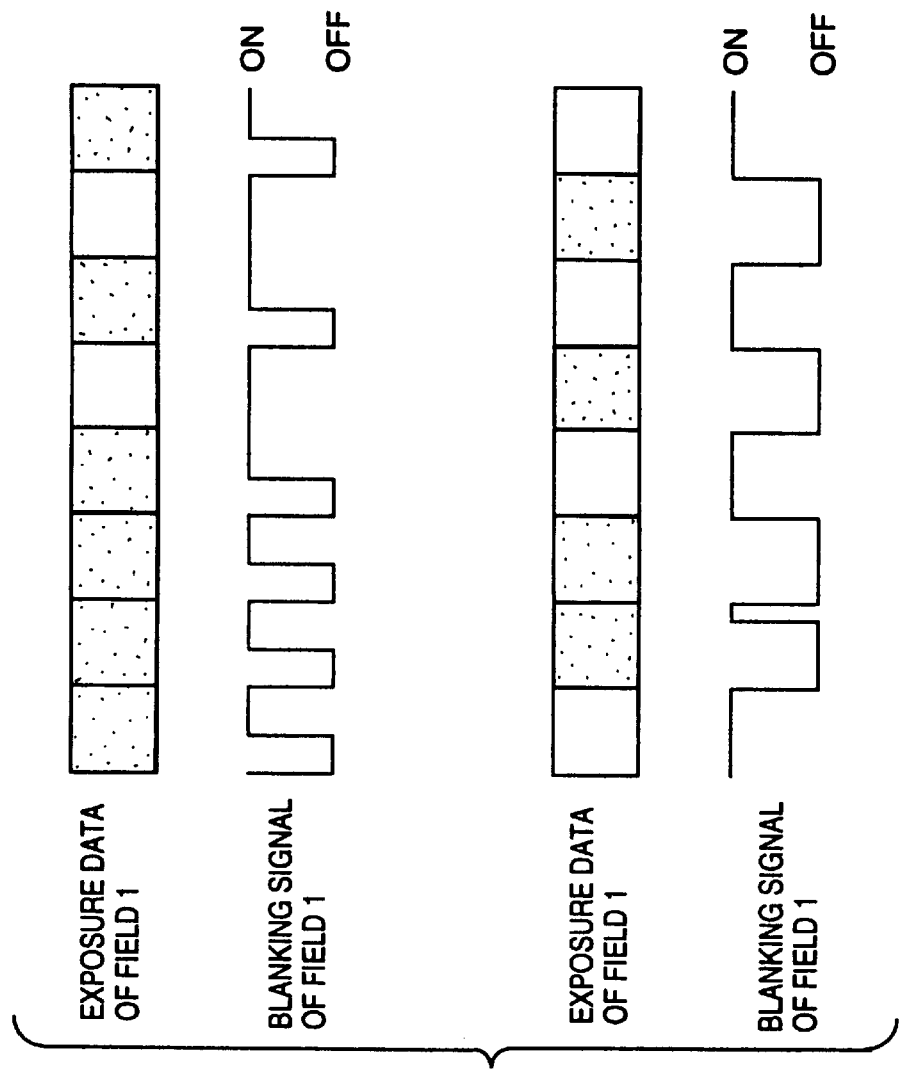
FIG. 12 is a view for explaining a blanking signal transmitted to each element electron optical system.

When pattern exposure is started in accordance with an instruction from the CPU 12, the sequence controller 14 calculates, on the basis of the sensitivity of a resist applied to the wafer 5 which has been input in the memory 19 in advance, and the current irradiated on the wafer by each element electron optical system which has been stored in the memory 19 as described above, the exposure time at the exposure position of the source image (the time of stay of the source image at the exposure position) formed by each element electron optical system, and transmits the calculated exposure time to the blanking control circuit 16. The sequence controller 14 also transmits the exposure control data file stored in the memory 19 as described above to the blanking control circuit 16. The blanking control circuit 16 sets the blanking OFF time (exposure time) for each element electron optical system. The blanking control circuit 16 also transmits a blanking signal as shown in FIG. 12 to each element electron optical system, on the basis of the exposure data for each element electron optical system and the blanking off time for each element electron optical system, which are stored in the transmitted exposure control file, in synchronism with the deflection control circuit 21, thereby controlling the exposure timing and exposure amount for each element electron optical system (the exposure time at each exposure position of field 1 is longer than that of field 2).

The sequence controller 14 also transmits the exposure control data file stored in the memory 19 as described above to the deflection control circuit 21. On the basis of the position data in the received exposure control file, the deflection control circuit 21 transmits a deflection control signal, a focus control signal, and an astigmatism correction signal to the deflector 6, the dynamic focus coil 7, and the dynamic stigmatism coil 8, respectively, through a D/A converter in synchronism with the blanking control circuit 16. With this operation, the positions of the plurality of source images on the wafer are controlled.

When the shift of the focus position caused by deflection errors generated when the deflector is actuated cannot be completely corrected by the dynamic focus coil, the potentials of the intermediate electrodes of the element electron optical systems may be adjusted through the focus control circuit 15 to set the source image within a predetermined range along the Z-axis, thereby changing the positions of the intermediate images along the optical axis.

[Other Arrangement 1 of Element Electron Optical System]

Other arrangement 1 of the element electron optical system will be described with reference to FIG. 13A. The same reference numerals as in FIG. 5A denote the same constituent elements in FIG. 13A, and a detailed description thereof will be omitted.

This arrangement is largely different from the element electron optical system shown in FIG. 5A in the aperture shape on the aperture stop and the blanking electrode. The aperture (AP) shields an electron beam which enters near the optical axis of the unipotential lens 303 to form a hollow beam (hollow cylindrical beam). A blanking electrode 321 is constituted by a pair of cylindrical electrodes in correspondence with the aperture shape.

The electron beam which is formed into an almost collimated beam by the condenser lens 2 passes through the blanking electrode 321 and an aperture stop 320 and forms an intermediate image of the source on the blanking aperture 304 through the unipotential lens 303. If, at this time, no electric field is applied between the electrodes of the blanking electrode 321, an electron beam 323 is transmitted through the aperture of the blanking aperture 304. On the other hand, when an electric field is applied between the electrodes of the blanking electrode 321, an electron beam 324 is deflected and shielded by the blanking aperture 304. Since the electron beams 323 and 324 have different angular distributions on the blanking aperture 304 (the object plane of the reduction electron optical system), the electron beams 323 and 324 are incident on different areas at the pupil position (P in FIG. 1) of the reduction electron optical system, as shown in FIG. 13B. Therefore, in place of the blanking aperture 304, the blanking aperture 304' for passing only the electron beam 323 may be formed at the pupil position of the reduction electron optical system. The blanking aperture can be commonly used by other element electron optical systems constituting the correction electron optical system 3.

Since the space charge effect of a hollow electron beam (hollow cylindrical beam) is smaller than that of a nonhollow electron beam (e.g., a Gaussian beam), the electron beam can be brought to a focus on the wafer to form a source image free from any blur on the wafer. More specifically, when the electron beam from each element electron optical system passes through the pupil plane P of the reduction electron optical system 4, the electron beam on the pupil plane obtains an electron density distribution in which the electron density at the peripheral portion becomes higher than that at the central portion. With this arrangement, the above effect can be obtained. The electron density distribution on the pupil plane P can be obtained by the aperture (aperture for shielding light at the central portion) on the aperture stop 320 arranged at a position almost conjugate to the pupil plane P of the reduction electron optical system 4, as in this embodiment.

[Other Arrangement 2 of Element Electron Optical System]

Other arrangement 2 of the element electron optical system will be described below with reference to FIG. 14A. The same reference numerals as in FIG. 5A or 13A denote the same constituent elements in FIG. 14A, and a detailed description thereof will be omitted.

This arrangement is largely different from the element electron optical system shown in FIG. 5A in the aperture shape on the aperture stop (the same shape as that of the aperture stop in FIG. 13A) and omission of the blanking electrode.

The electron beam formed into an almost collimated beam by the condenser lens 2 passes through an aperture stop 322 and forms an intermediate image of the source on the blanking aperture 304 through the unipotential lens 303. When the intermediate electrode of the unipotential lens 303 is set at a predetermined potential, the electron beam is converged, and an electron beam 330 is transmitted through the aperture of the blanking aperture 304. On the other hand, when the intermediate electrode is set at the same potential as that of other electrodes, the electron beam is not converged, and an electron beam 331 is shielded by the blanking aperture 304. By changing the potential of the intermediate electrode of the unipotential lens 303, blanking can be controlled.

Figure 14B:
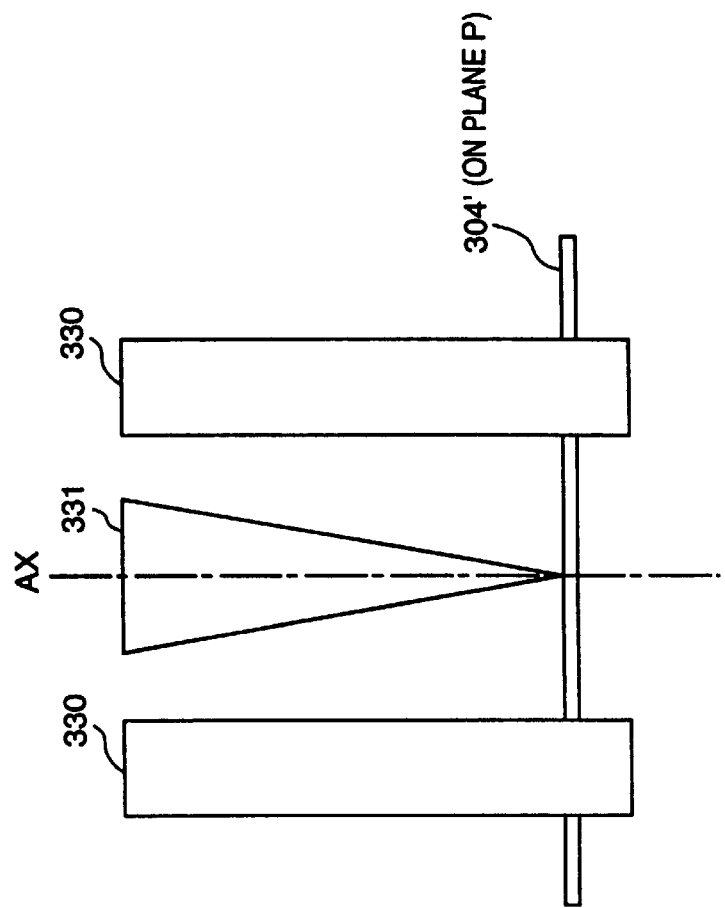
FIGS. 14A and 14B are views for explaining arrangement 2 of the element electron optical system.
Figure 14A:
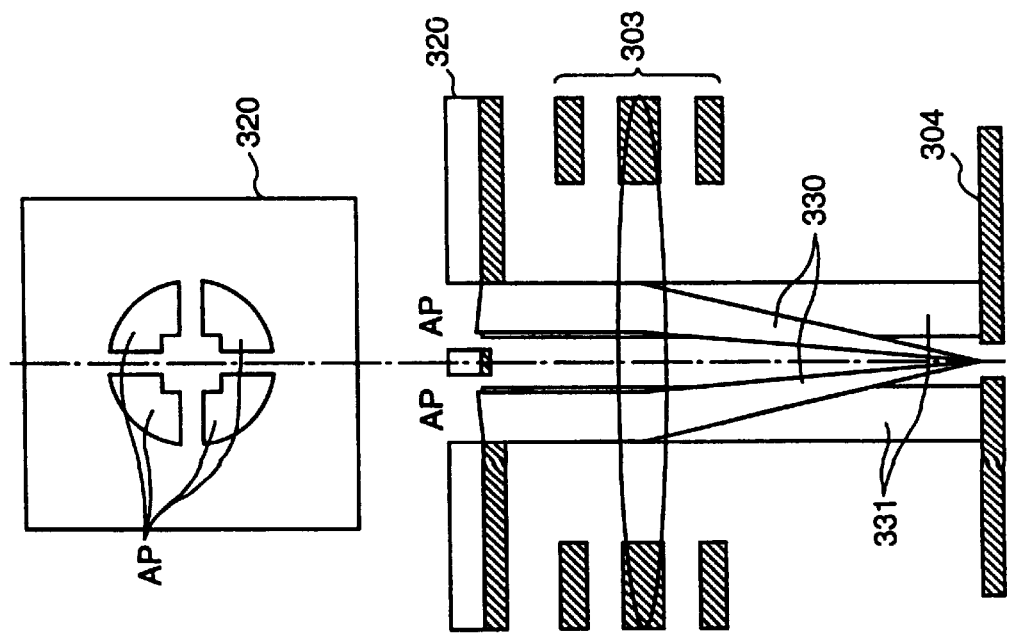

Since the electron beams 330 and 331 have different angular distributions on the blanking aperture 304 (the object plane of the reduction electron optical system), the electron beams 330 and 331 are incident on different areas at the pupil position (P in FIG. 1) of the reduction electron optical system, as shown in FIG. 14B. Therefore, in place of the blanking aperture 304, the blanking aperture 304' for passing only the electron beam 330 may be formed at the pupil position of the reduction electron optical system. The blanking aperture can be commonly used by other element electron optical systems constituting the correction electron optical system 3.

(Second Embodiment)

[Description of Constituent Elements of Exposure System]

FIGS. 15A–15C are views showing an electron beam exposure apparatus according to the second embodiment of the present invention. Reference numerals as in FIG. 1 denote the same constituent elements in FIGS. 15A–15C, and a detailed description thereof will be omitted.

Referring to FIGS. 15A–15C, electrons emitted from the source of an electron gun 1 are formed into an almost collimated electron beam by a condenser lens 2 whose front focal position is set at the position of the source. The almost collimate electron beam in incident on an element electron optical system array 130 (corresponding to the correction electron optical system 3 of the first embodiment) formed by arraying a plurality of element electron optical systems described with reference to FIG. 13A in a direction perpendicular to the optical axis, thereby forming a plurality of intermediate images of the source. The element electron optical system array 130 has a plurality of subarrays each of which is formed by arranging a plurality of element electron optical systems having the same electron optical characteristics. At least two subarrays have element electron optical systems with different electron optical characteristics. The element electron optical system array 130 will be described later in detail.

A deflector 140 for deflecting (tilt with respect to the Z-axis) the electron beam incident on the subarray is arranged for each subarray. The deflector 140 has a function of correcting, in units of subarrays, the difference in incident angle between electron beams which are incident on subarrays at different positions because of the aberration of the condenser lens 2.

A deflector 150 translates (in the X and Y directions) and deflects (tilt with respect to the Z-axis) electron beams from the plurality of intermediate images formed by the subarrays. The deflector 150 corresponds to the deflector 91 or 92 of the first embodiment. The deflector 150 is different from the deflector 91 or 92 in that the deflector 150 translates and deflects the plurality of electron beams from the subarrays at once.

The plurality of intermediate images formed by the element electron optical system array 130 are reduced and projected on a wafer 5 through a reduction electron optical system 100 and a reduction electron optical system 4.

In this embodiment, two-step reduction is employed to decrease the reduction ratio without making the exposure apparatus bulky. The reduction electron optical system 100 is constituted by a first projecting lens 101 and a second projecting lens 102, like the reduction electron optical system 4. That is, one reduction electron optical system is constituted by the reduction electron optical system 4 and the reduction electron optical system 100.

When the number of electron beams from the element electron optical system array increases, the size of the beam incident on the reduction electron optical system increases, and blurs are generated in the source images due to the space charge effect. To correct these blurs, a refocus coil 110 controls the focus position on the basis of the number of source images (the number of blanking electrodes in the OFF state) irradiated on the wafer, which is obtained from a sequence controller 14.

A blanking aperture 120 positioned on the pupil plane of the reduction electron optical system 100 is common to the element electron optical systems constituting the element electron optical system array and corresponds to the blanking aperture 304' shown in FIG. 13B.

Figure 16:
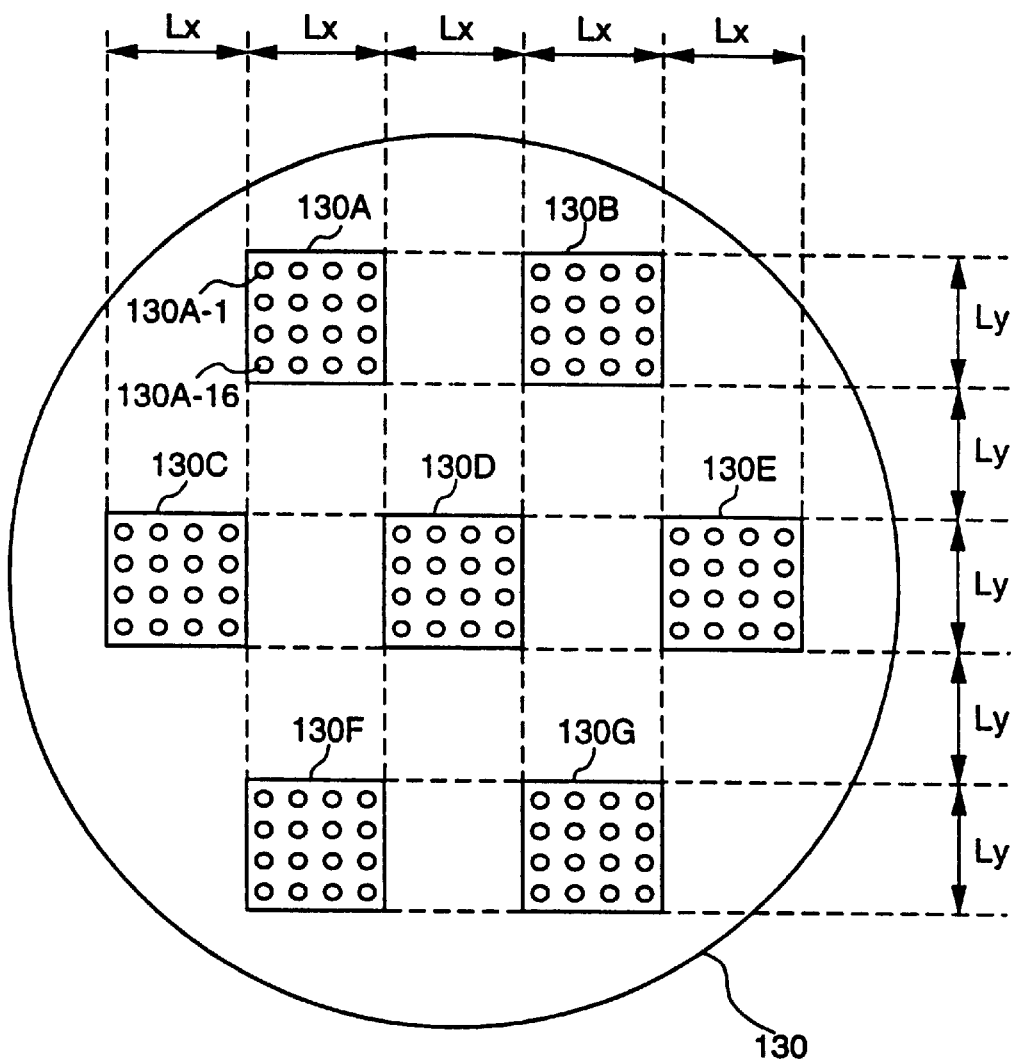
FIG. 16 is a view for explaining an element electron optical system array.

The element electron optical system array 130 will be described below with reference to FIG. 16. FIG. 16 shows the element electron optical system array 130 viewed from the electron gun 1 side.

In the element electron optical system array 130, the element electron optical systems described in FIG. 13A are arrayed. The element electron optical system array 130 is constituted by a blanking array in which a plurality of apertures, blanking electrodes corresponding to the apertures, and a wiring layer are formed on one substrate, and a lens array constituted by stacking electrodes constituting a unipotential lens while interposing insulators. The blanking array and the lens array are positioned and coupled to make the apertures oppose the corresponding unipotential lenses.

Reference numerals 130A to 130G denote subarrays each consisting of a plurality of element electron optical systems. In the subarray 130A, 16 element electron optical systems 130A-1 to 130A-16 are formed. Since the amounts of aberrations to be corrected in one subarray remain almost the same or fall within an allowance, the unipotential lenses of the element electron optical systems 130A-1 to 130A-16 have the same aperture electrode shape and are applied with the same potential. Therefore, wiring lines for applying deferent potentials to the electrodes can be omitted, though the blanking electrodes need independent wiring lines, as in the first embodiment.

A subarray may be divided into a plurality of sub-subarrays, and the electron optical characteristics (focal length, astigmatism, coma, and the like) of the element electron optical systems of the sub-subarrays may be equalized, as a matter of course. At this time, wiring lines for intermediate electrodes are necessary in units of sub-subarrays.

[Description of Operation]

A difference from the first embodiment will be described.

In the first embodiment, when calibration for the exposure system is to be performed, the position (X,Y,Z) where a source image assumes a predetermined size and the current I at that time are detected for all source images. In the second embodiment, at least one source image which represents the subarray is detected. On the basis of the detection result, the sequence controller 14 makes the deflector 15 translate the intermediate images in the subarray in a direction perpendicular to the optical axis of the reduction electron optical system by the same amount through an optical axis alignment control circuit 18 to locate the source image of the element electron optical system representing the subarray with a predetermined relative positional relationship along the X and Y directions. In addition, the potential of the intermediate electrode of each subarray is set again through a focus control circuit 15 to locate the source image of the element electron optical system representing the subarray within a predetermined range along the Z direction. Furthermore, the detected irradiation current of the element electron optical system representing the subarray is stored in a memory 19 as the irradiation current of each element electron optical system in the same subarray.

Figure 17:
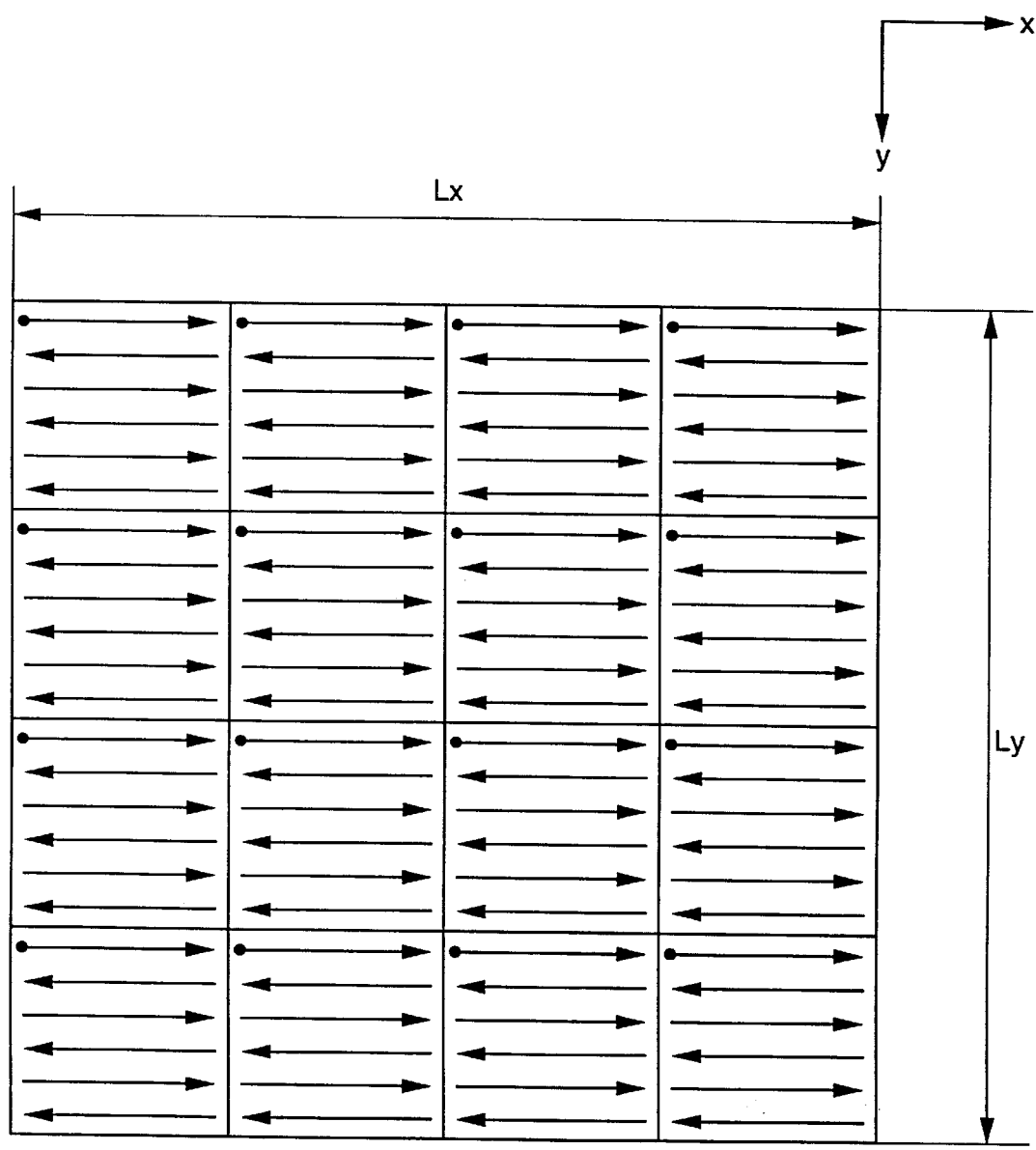
FIG. 17 is a view for explaining the scan field of a subarray.
Figure 19:
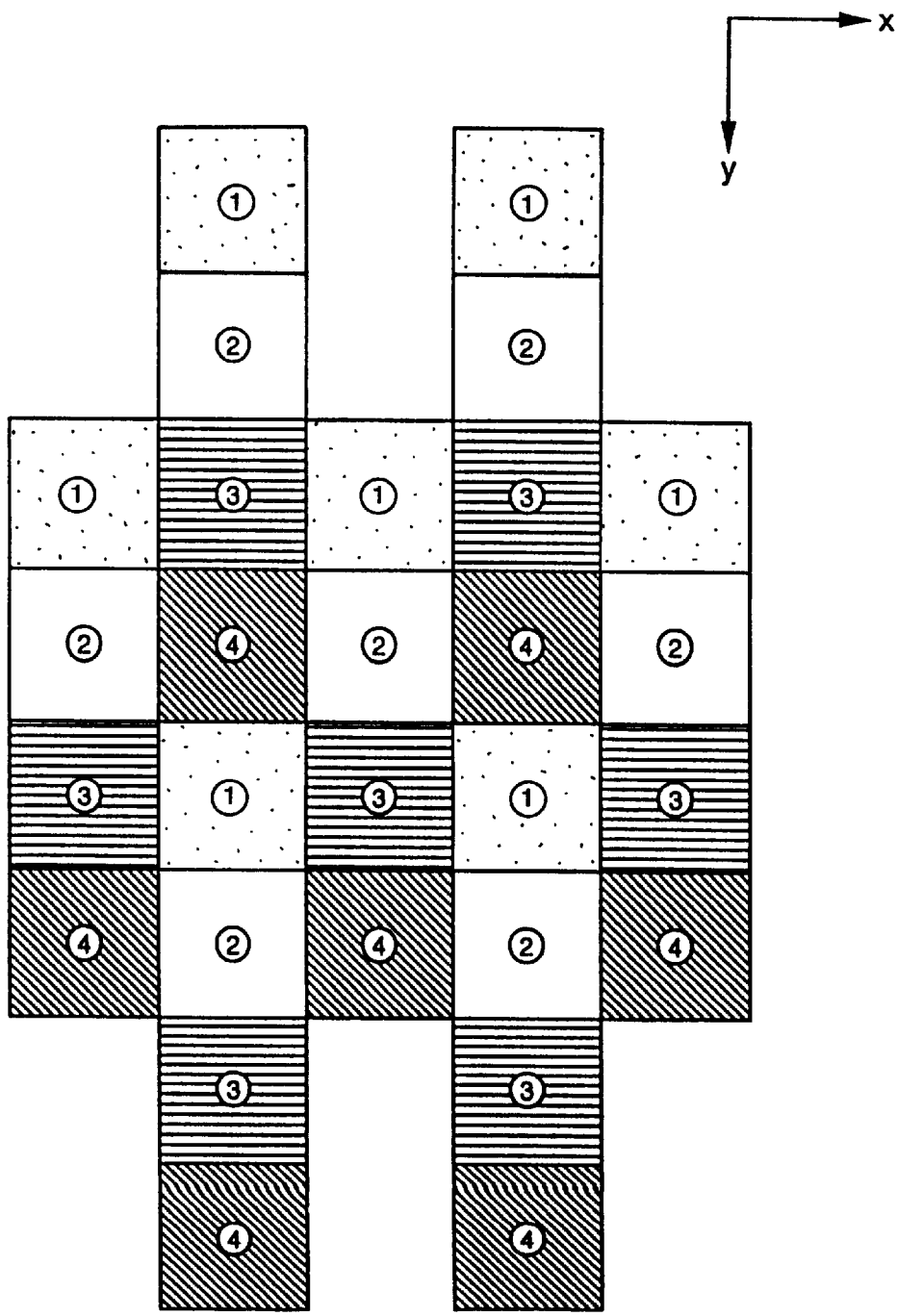
FIG. 19 is a view for explaining the exposure field.

The source images formed on the wafer 5 through the element electron optical systems in the subarray are deflected by the same moving amount by a deflector 6 starting from reference positions (full circles) in their respective scan fields to expose the wafer with the scan fields of the respective element electron optical systems adjacent to each other, as shown in FIG. 17. In this fashion, the wafer is exposed by all subarrays, as shown in FIG. 18. The scan fields are stepped by an amount Ly in the Y direction by a deflector 7. Again, the source images are deflected by the same amount by the deflector 6 starting from the reference positions (full circles) in the scan fields of the respective element electron optical systems to expose the wafer. When the above operation is repeated four times, e.g., in the order of ①, ②, ③ and ④, an exposure field in which the exposure fields of the subarrays are adjacent is formed, as shown in FIG. 19.

(Third Embodiment)

[Description of Constituent Elements of Exposure System]

FIGS. 20A to 20C are views showing an electron beam exposure apparatus according to the third embodiment of the present invention. The same reference numerals as in FIGS. 1 and 15 denote the same constituent elements in FIGS. 20A to 20C, and a detailed description thereof will be omitted.

In this embodiment, at least one electrode for decelerating or accelerating the electron beam is added, and a means for changing the source shape is arranged in the second embodiment.

A unipotential lens serving as an electrostatic lens constituting an element electron optical system array 130 can realize a smaller electron lens as the electrons have a lower energy.

However, to extract a lot of electron beams from an electron gun 1, the anode voltage must be raised. As a result, electrons from the electron gun 1 may obtain a high energy. In this embodiment, a decelerating electrode DCE shown in FIG. 20A is arranged between the electron gun 1 and the element electron optical system array 130. The decelerating electrode is an electrode at a lower potential than the anode potential and adjusts the energy of electrons incident on the element electron optical system array 130. The decelerating electrode can have apertures corresponding to the element electron optical systems, as shown in FIG. 20A, or apertures corresponding to subarrays, as shown in FIG. 20B.

In a reduction electron optical system (4, 100), when the energy of an electron beam is low, the convergence of the electron beam on the wafer is degraded by the space charge effect. Therefore, the energy of the electron beam from the unipotential lens must be raised (accelerated). In this embodiment, an accelerating electrode ACE as shown in FIGS. 20A to 20C is arranged between the element electron optical system array 130 and the reduction electron optical system (4, 100). The accelerating electrode is an electrode at a higher potential than that of the element electron optical system array and adjusts the energy of electrons incident on the reduction electron optical system (4, 100). Like the decelerating electrode, the accelerating electrode may have apertures corresponding to the element electron optical systems, as shown in FIG. 20A, or apertures corresponding to the subarrays, as shown in FIG. 20B.

In the first, second, and third embodiments, the source image is transferred on the wafer and scanned to form a desired exposure pattern. The size of the source image is set to be ⅕ to ⅒ the minimum line width of the exposure pattern. When the size of the source image is changed in accordance with the minimum line width of the exposure pattern, the number of source image moving steps for exposure can be minimized. In this embodiment, an electron optical system 160 as shown in FIG. 20C is arranged to shape the source. The electron optical system 160 forms an image S1 of a source S0 of the electron gun 1 through a first electron lens 161 and further forms an image S2 of the source image S1 through a second electron lens 162. With this arrangement, when the focal lengths of the first electron lens 161 and the second electron lens 162 are changed, only the size of the source image S2 can be changed while fixing the position of the source image S2. The focal lengths of the first and second electron lenses 161 and 162 are controlled by a source shaping circuit 163.

When an aperture having a desired shape is formed at the position of the source image S2, not only the size but also the shape of the source can be changed.

(Fourth Embodiment)
[Description of Constituent Elements of Exposure System]

Figures 21A, 21B:
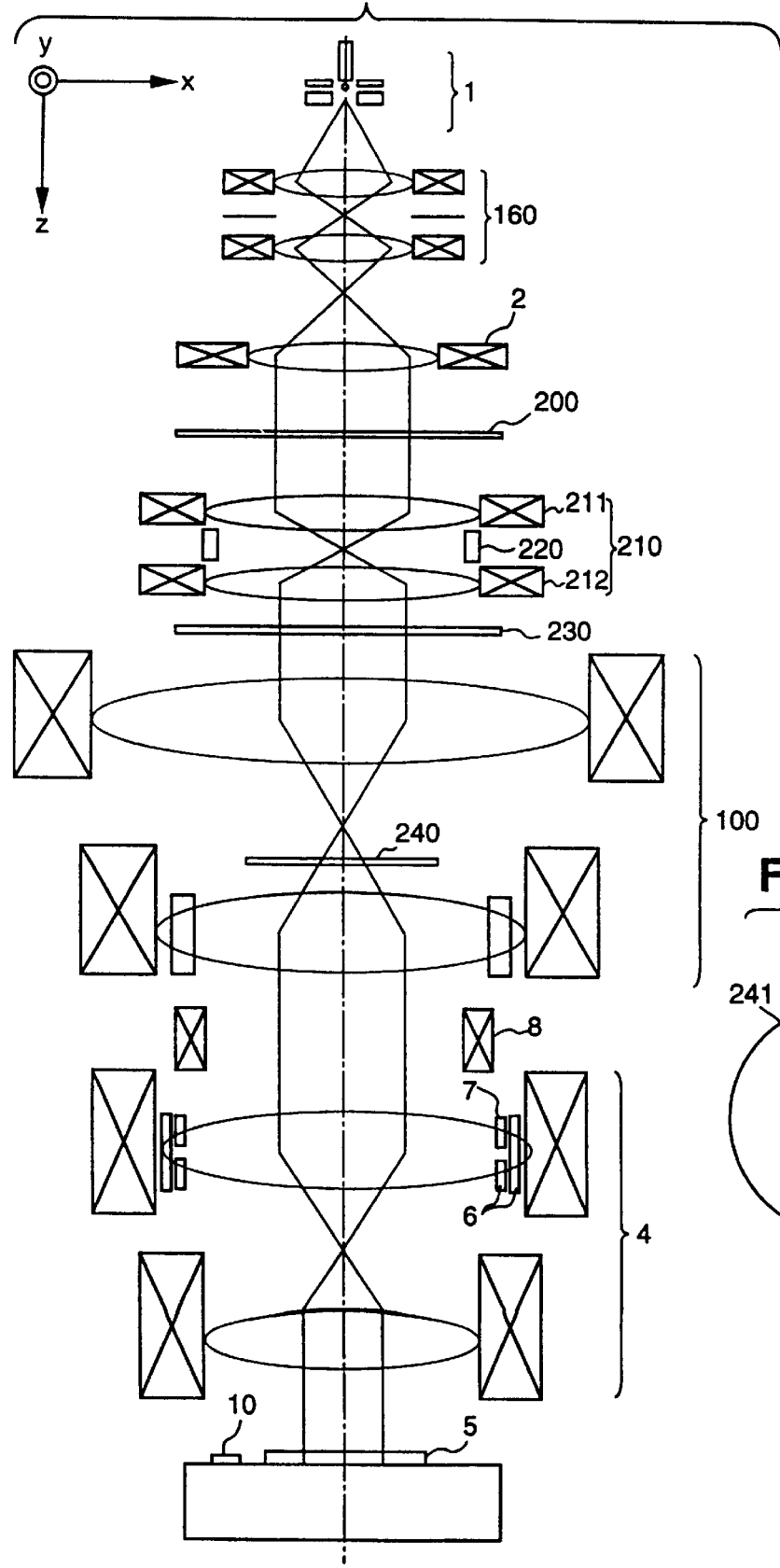
FIGS. 21A and 21B are views for explaining the arrangement of an electron beam exposure apparatus according to the present invention.

FIGS. 21A and 21B are views showing an electron beam exposure apparatus according to the fourth embodiment of the present invention. The same reference numerals as in FIGS. 1, 15A–15C, and 20C denote the same constituent elements in FIGS. 21A and 21B, and a detailed description thereof will be omitted.

The electron beam exposure apparatus of this embodiment is a stencil mask type exposure apparatus. An electron beam from an electron gun 1 is shaped by a first shaping aperture 200 having an aperture for defining the illumination area. A stencil mask 230 having pattern through holes are illuminated using a first shaping electron lens 210 (constituted by electron lenses 211 and 212) and a shaping deflector 220. The drawing pattern elements of the stencil mask 230 are reduced and projected on a wafer 5 through a reduction electron optical system (4, 100).

Figure 22:
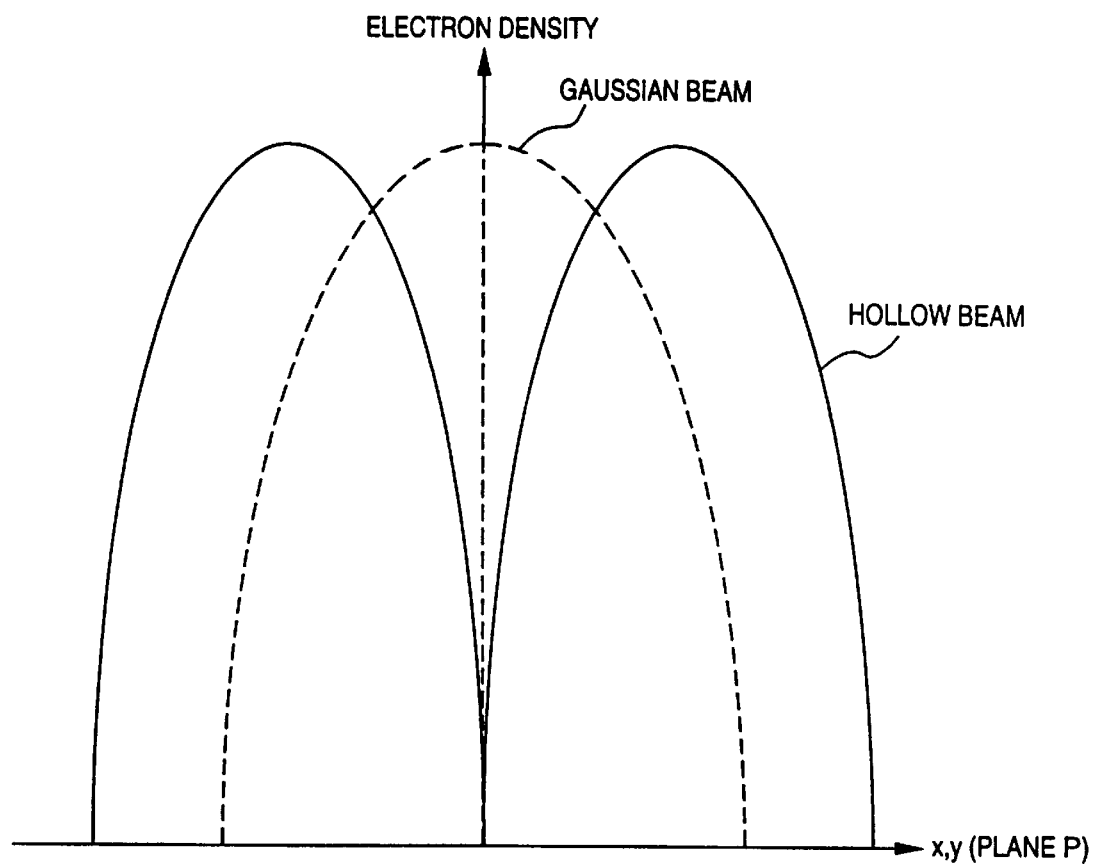
FIG. 22 is a graph for explaining the electron density distribution on a pupil plane.

This embodiment is different from the conventional stencil mask type exposure apparatus in that a stop 241 is arranged near the pupil of the reduction electron optical system 100 to obtain an electron density distribution of the electron beam on the pupil plane in which the electron density at the peripheral portion becomes higher than that at the central portion. More specifically, a hollow beam forming stop 240 whose central portion is shielded as shown in FIG. 21A is arranged. As shown in FIG. 22, the electron beam from the stencil mask has the electron density distribution of a hollow beam. For reference, the electron density distribution of a conventional Gaussian beam is also shown in FIG. 22.

As described in [Other Arrangement 1 of Element Electron Optical System], the space charge effect of the hollow beam is smaller than that of the conventional Gaussian beam. For this reason, the electron beam can be brought to a focus on the wafer to form a source image free from any blur on the wafer. The electron beam passing through the stencil mask can be regarded as a source positioned on the stencil mask. When an image of a source having the shape of the pattern of the stencil mask is to be formed on the wafer, a source image having an exact shape can be formed because of the small space charge effect. That is, an exposure pattern having the exact shape of the pattern of the stencil mask can be formed on the wafer.

In this embodiment, the hollow beam forming stop 240 is arranged near the pupil plane of the reduction electron optical system 100. However, even when a stop having the same shape as that of the hollow beam forming stop 240 is arranged at a position conjugate to the pupil of the reduction electron optical system 100, e.g., the pupil position of the first shaping electron lens 210, or the position of the source S2, the same effect as described above can be obtained.

The shape or potential of each electrode of the electron gun may be adjusted to form the source itself into a hollow beam shape.

In this embodiment, even when the first shaping aperture 200 has a rectangular shape, and a second shaping aperture having a rectangular shape is arranged in place of the stencil mask to constitute a variable rectangular beam type exposure apparatus, the same effect as described above can be obtained with the same arrangement.

According to the first to third embodiments,
first, no stencil mask is required;
second, a lot of source images having a desired shape can be formed in a wide exposure area; and
third, since the source images are discretely arranged, the source images are not affected by the space charge effect.

Therefore, a desired exposure pattern can be formed at a high throughput.

By forming a hollow electron beam, the influence of the space charge effect is minimized. Particularly, as in the fourth embodiment, the limitation in patterns usable for a stencil mask can be minimized in a stencil mask type electron beam exposure apparatus, so that the throughput can be further increased.

Second Mode of Carrying Out the Invention
(First Embodiment)
[Description of Constituent Elements of Electron Beam Exposure Apparatus]

FIGS. 23A–23C are views showing the main part of an electron beam exposure apparatus according to the present invention.

Referring to FIGS. 23A–23C, reference numeral 601 denotes an electron gun consisting of a cathode 601$a$, a grid 601$b$, and an anode 601$c$. Electrons emitted from the cathode 601$a$ form a crossover image between the grid 601$b$ and the anode 601$c$ (the crossover image will be referred to as source hereinafter).

The electrons emitted from the sources are formed into an almost collimated electron beam by a condenser lens 602 whose front focal position is set at the position of the source. The almost collimated electron beam is incident on an element electron optical system array 603. The element electron optical system array 603 is formed by arraying a plurality of element electron optical systems each consisting of a blanking electrode, an aperture, and an electron lens, in a direction perpendicular to an optical axis AX. The element electron optical system array 603 will be described later in detail.

The element electron optical system array 603 forms a plurality of intermediate images of the source. Each intermediate image is reduced and projected by a reduction electron optical system 604 to form a source image on a wafer 605.

The elements of the element electron optical system array 603 are set such that the interval between the sources on the wafer 605 becomes an integer multiple of the size of source image. The element electron optical system array 603 changes the positions of the intermediate images along the optical axis in accordance with the curvature of field of the reduction electron optical system 604, and at the same time, corrects in advance any aberration generated when each intermediate image is reduced and projected on the wafer 605 by the reduction electron optical system 604, as in the first mode of carrying out the invention.

The reduction electron optical system 604 is a symmetrical magnetic tablet consisting of a first projecting lens 641 (643) and a second projecting lens 642 (644). When the focal length of the first projecting lens 641 (643) is represented by f1, and that of the second projecting lens 642 (644) is represented by f2, the distance between the two lenses is f1+f2. The object point on the optical axis AX is located at the focal position of the first projecting lens 641 (643), and the image point is set at the focal point of the second projecting lens 642 (644). This image is reduced to −f2/f1. Since the two lens magnetic fields are determined to act in opposite directions, the Seidel's aberrations except five aberrations, i.e., spherical aberration, isotropic astigmatism, isotropic coma, curvature of field, and on-axis chromatic aberration, and chromatic aberrations associated with rotation and magnification are canceled in theory.

A deflector 606 deflects the plurality of electron beams from the element electron optical system array 603 to displace the plurality of source images in the X and Y directions on the wafer 605 by roughly the same amounts. The deflector 606 is constituted by a main deflector used when the deflection width is large, and a subdeflector used when the deflection width is small (neither are shown). The main deflector is an electromagnetic deflector, and the subdeflector is an electrostatic deflector.

A dynamic focus coil 607 corrects any shift of the focus position of the source image caused by deflection errors generated when the deflector 606 is actuated. A dynamic stigmatic coil 608 corrects astigmatism caused by deflection errors generated by deflection, like the dynamic focus coil 607.

A reflected electron detector 609 detects reflected electrons or secondary electrons generated when the electron beam from the element electron optical system array 603 irradiates an alignment mark formed on the wafer 605 or a mark formed on a stage reference plate 613.

A Faraday cup 610 having two single knife-edges extending in the X and Y directions detects the charge amount of the source image formed by the electron beam from the element electron optical system.

A θ-Z stage 611 with a wafer mounted is movable along the optical axis AX (Z-axis) and in a rotational direction about the Z-axis. A stage reference plate 613 and the Faraday cup 610 are fixed on the θ-Z stage 611.

An X-Y stage 612 with the θ-Z stage mounted is movable in the X and Y directions perpendicular to the optical axis AX (Z-axis).

The element electron optical system array 603 will be described below with reference to FIGS. 24A and 24B.

In the element electron optical system array 603, a plurality of element electron optical systems are formed into a group (subarray), and a plurality of subarrays are formed. In this embodiment, seven subarrays A to G are formed. In each subarray, a plurality of element electron optical systems are two-dimensionally arrayed. In each subarray of this embodiment, 25 element electron optical systems D(1,1) to D(5,5) are formed. The element electron optical systems form source images which are arrayed on the wafer at a pitch Pb ($\mu$m) in the X and Y directions through the reduction electron optical system 604.

Figure 25:
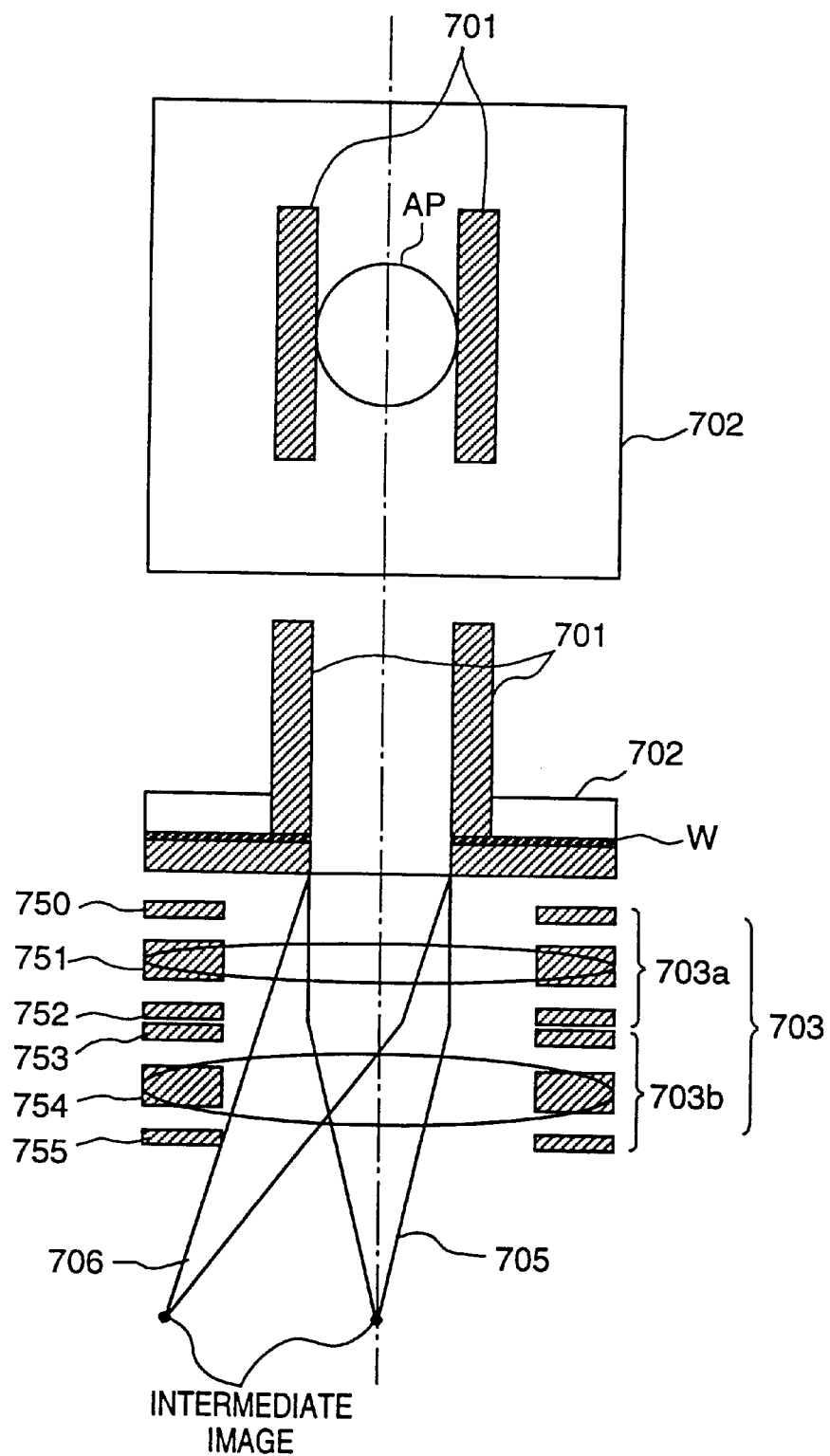
FIG. 25 is a view for explaining an element electron optical system.

FIG. 25 is a sectional view of each element electron optical system.

Referring to FIG. 25, reference numeral 701 denotes a blanking electrode consisting of a pair of electrodes and having a deflection function; and 702, a substrate common to the remaining element electron optical systems and having an aperture (AP) for defining the shape of the transmitted electron beam. A wiring layer (W) for turning on/off the blanking electrode 701 is formed on the substrate 702. Reference numeral 703 denotes an electron lens using two unipotential lenses 703a and 703b each consisting of three aperture electrodes and having a converging function for setting the upper and lower electrodes at an acceleration potential V0 and the intermediate electrode at another potential V1 or V2.

Figure 26A:
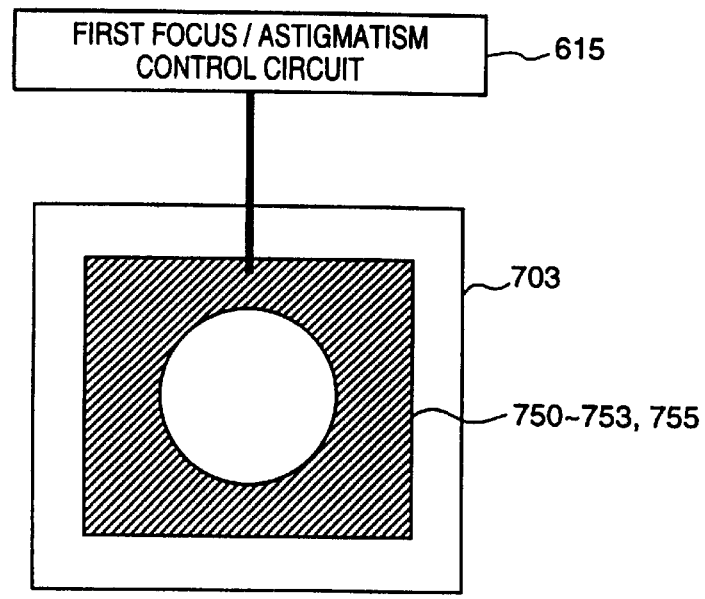
FIGS. 26A and 26B are views for explaining the electrodes of the element electron optical system.

Upper, intermediate, and lower electrodes 750 to 752 of the unipotential lens 703a and upper and lower electrodes 753 and 755 of the unipotential lens 703b have a shape shown in FIG. 26A. In all the element electron optical systems, the upper and lower electrodes of the unipotential lenses 703a and 703b are set at a common potential by a first focus/astigmatism control circuit 615.

The potential of the intermediate electrode 751 of the unipotential lens 703a can be set for each element electron optical system by the first focus/astigmatism control circuit 615. For this reason, the focal length of the unipotential lens 703a can be set for each element electron optical system.

Figure 26B:
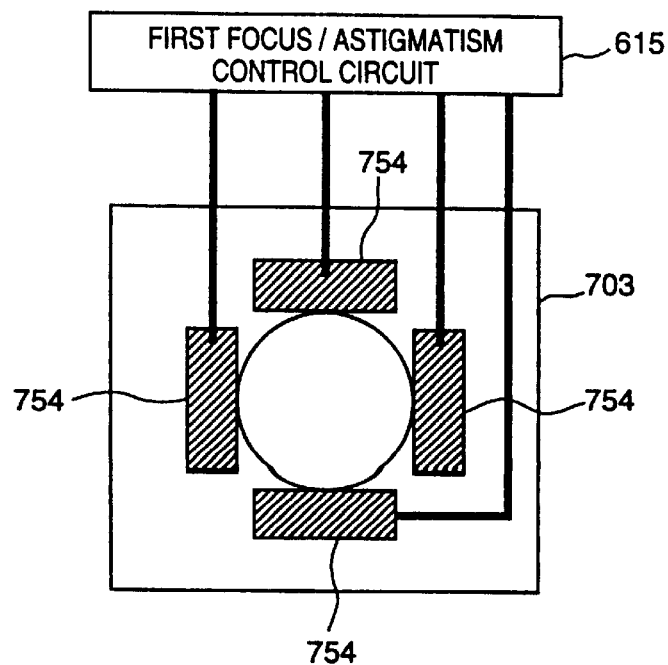

An intermediate electrode 754 of the unipotential lens 703b is constituted by four electrodes as shown in FIG. 26B. The potentials of electrodes 703M can be independently set by the first focus/astigmatism control circuit 615. The potentials of the electrodes 703M are also independently set for each element electron optical system. Therefore, the focal length of the unipotential lens 703b can be changed along sections perpendicular to each other. The focal length of the unipotential lens 703b can be independently set for each element electron optical system. With this arrangement, the astigmatisms of the element electron optical systems can be independently controlled.

As a result, when the potentials of the intermediate electrodes of the element electron optical systems are independently controlled, the electron optical characteristics (intermediate image formation positions and astigmatisms) of the element electron optical systems can be controlled.

The electron beam formed into an almost collimated beam by the condenser lens 602 passes through the blanking electrode 701 and the aperture (AP) and forms an intermediate image of the source through the electron lens 703. If, at this time, no electric field is applied between the electrodes of the blanking electrode 701, an electron beam 705 is not deflected. On the other hand, when an electric field is applied between the electrodes of the blanking electrode 701, an electron beam 706 is deflected. Since the electron beams 705 and 706 have different angular distributions on the object plane of the reduction electron optical system 604, the electron beams 705 and 706 are incident on different areas at the pupil position (on a plane P in FIG. 23) of the reduction electron optical system 604. Therefore, a blanking aperture BA for passing only the electron beam 705 is formed at the pupil position (on the plane P in FIG. 23) of the reduction electron optical system.

To correct curvature of field/astigmatism generated when the intermediate image is reduced and projected on the target exposure surface by the reduction electron optical system 604, the potentials of the two intermediate electrodes of each element electron optical system are independently set to change the electron optical characteristics (intermediate image formation position and astigmatism) of the element electron optical system. In this embodiment, however, to minimize the wiring lines between the intermediate electrodes and the first focus/astigmatism control circuit 615, element electron optical systems in the same subarray are set to have the same electron optical characteristics so that the electron optical characteristics (intermediate image formation positions and astigmatisms) of the element electron optical systems are controlled in units of subarrays.

To correct distortion generated when the plurality of intermediate images are reduced and projected on the target exposure surface by the reduction electron optical system 604, the distortion characteristic of the reduction electron optical system 604 is determined in advance, and the position of each element electron optical system along the direction perpendicular to the optical axis of the reduction electron optical system 604 is set on the basis of the distortion characteristic.

Figure 27:
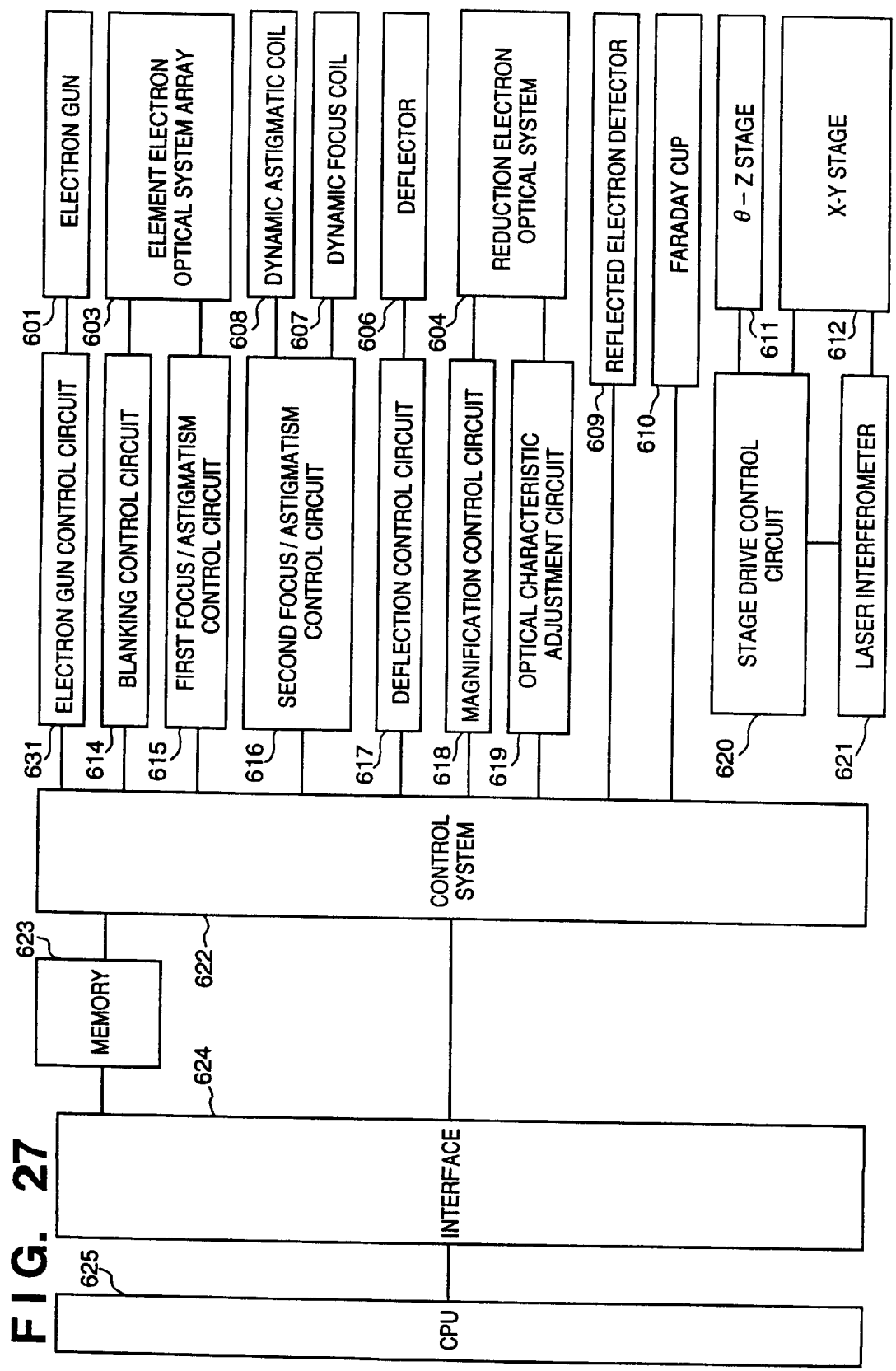
FIG. 27 is a block diagram for explaining the control arrangement of an electron beam exposure apparatus according to the present invention.

FIG. 27 is a block diagram showing the system configuration of this embodiment.

A blanking control circuit 614 independently controls ON/OFF of the blanking electrode of each element electron optical system of the element electron optical system array 603. The first focus/astigmatism control circuit 615 independently controls the electron optical characteristics (intermediate image formation position and astigmatism) of each element electron optical system of the element electron optical system array 603.

A second focus/astigmatism control circuit 616 controls the dynamic stigmatic coil 608 and the dynamic focus coil 607 to control the focal position and astigmatism of the reduction electron optical system 604. A deflection control circuit 617 controls the deflector 606. A magnification adjustment circuit 618 controls the magnification of the reduction electron optical system 604. An optical characteristic control circuit 619 changes the excitation current of the electromagnetic lens constituting the reduction electron optical system 604 to adjust the aberration of rotation and optical axis.

A stage drive control circuit 620 drives and controls the θ-Z stage 611 and also drives and controls the X-Y stage 612 in cooperation with a laser interferometer 621 for detecting the position of the X-Y stage 612.

A control system 622 controls the above-described plurality of control circuits, the reflected electron detector 609, and the Faraday cup 610 in synchronism with each other for exposure and alignment based on data from a memory 623 which stores information associated with a drawing pattern. The control system 622 is controlled by a CPU 625 which controls the overall operation of the electron beam exposure apparatus through an interface 624.

[Description of Operation]

The operation of the electron beam exposure apparatus of this embodiment will be described below with reference to FIG. 27.

Upon receiving pattern data for exposing the wafer, the deflector 606 determines the minimum amount of deflection applied to the electron beam on the basis of the minimum line width and the type and shape of line width of the exposure pattern to be formed on the wafer. The pattern data is divided in units of exposure areas of each element electron optical system. A common array consisting of array elements FME is set at an array interval corresponding to the minimum deflection amount, and the pattern data is converted into data represented on the common array in units of element electron optical systems. For the descriptive convenience, processing associated pattern data in exposure using two element electron optical systems a and b will be described below.

Figure 28A:
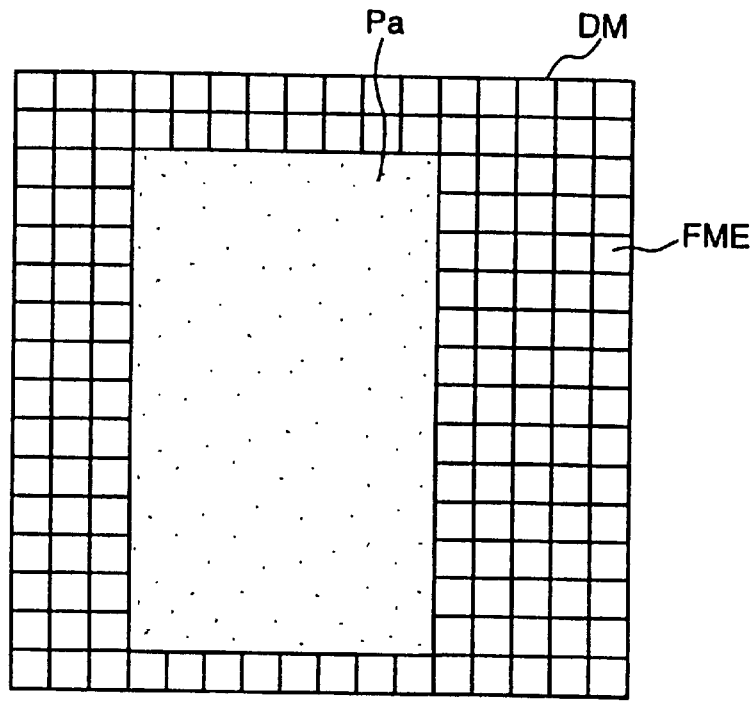
FIGS. 28A and 28B are views for explaining exposure patterns to be formed by element electron optical systems.
Figure 28B:
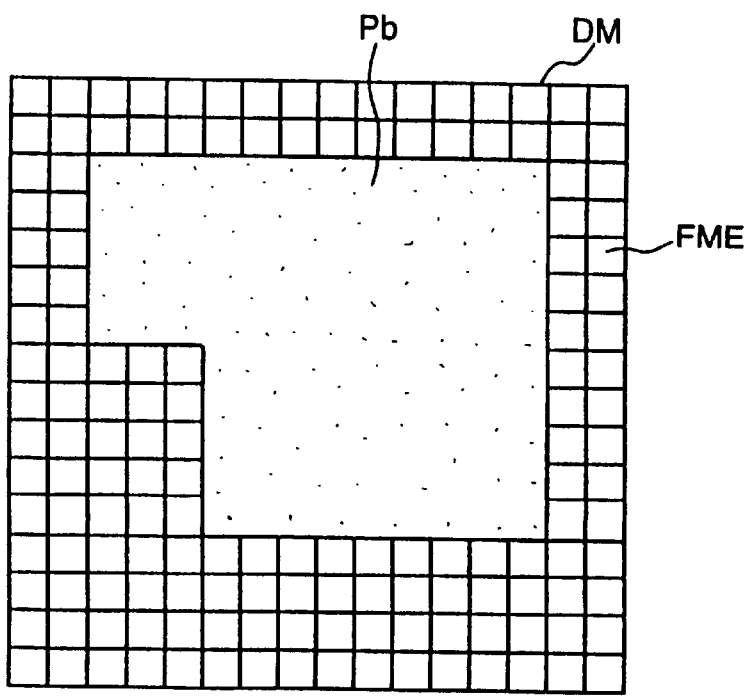

FIGS. 28A and 28B are views showing exposure patterns Pa and Pb to be formed by the element electron optical systems a and b, respectively, on a common array DM. More specifically, each element electron optical system irradiates an electron beam on the wafer at a hatched array position where the pattern is present by turning off the blanking electrode.

Figure 37:
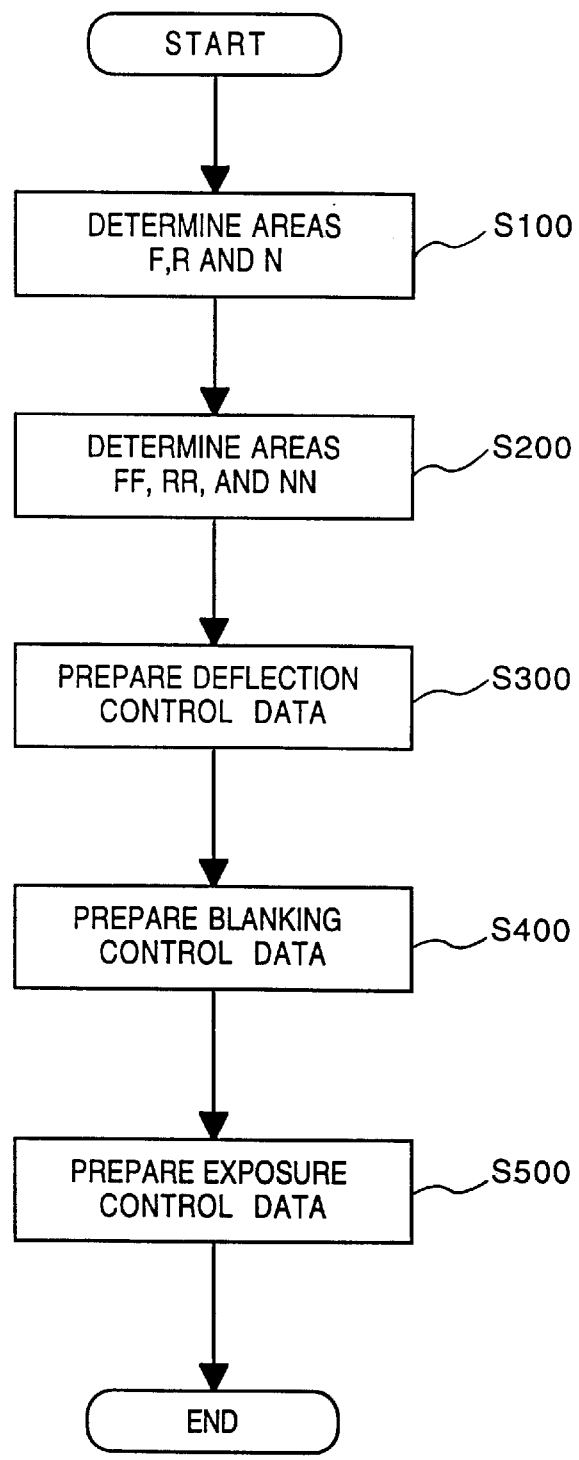
FIG. 37 is a flow chart for explaining preparation of the exposure control data.
Figure 38A:
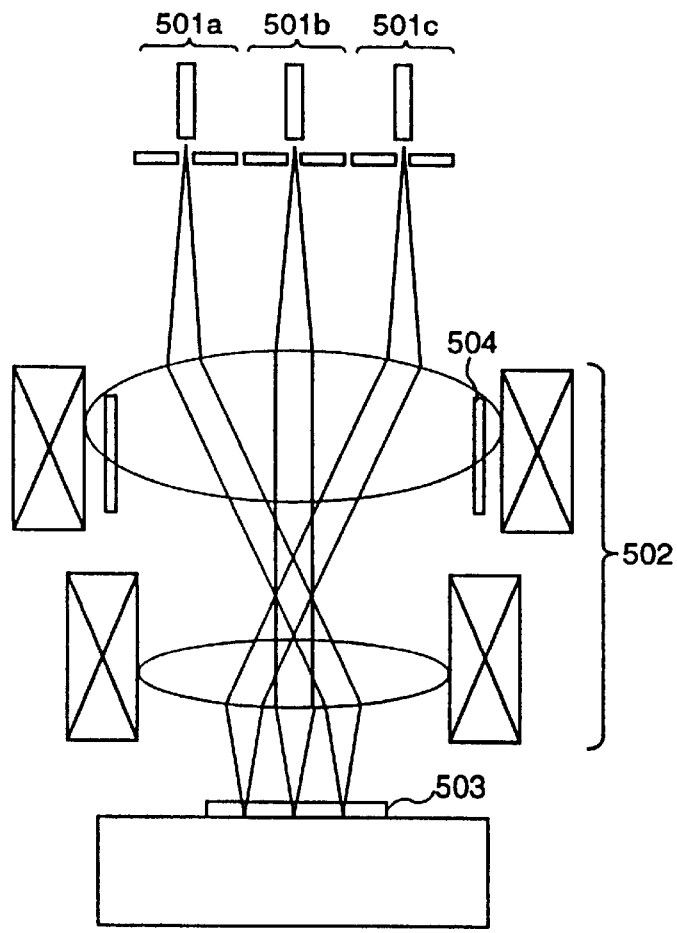
FIGS. 38A to 38D are views for explaining a conventional multi-electron beam exposure apparatus.
Figure 38B:
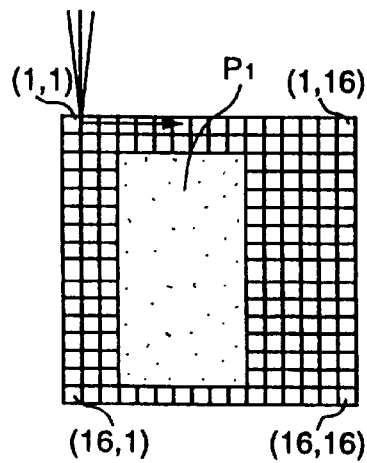
Figure 38C:
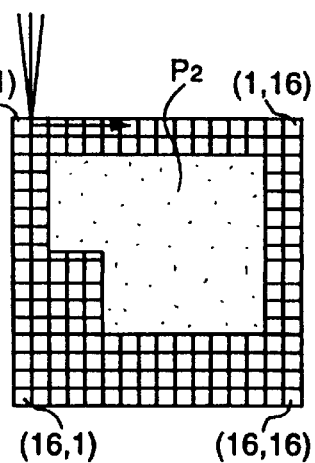
Figure 38D:
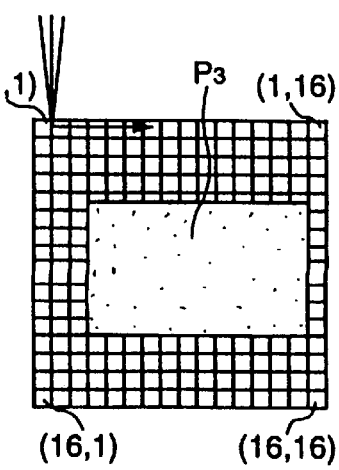

Normally, the contour portion of the pattern must be precisely exposed. However, a portion except the contour portion of the pattern, i.e., inner portion of the pattern need not be precisely exposed, and a defined exposure amount need only be satisfied. This operation will be described with reference to FIG. 37.

(S100)

Figure 29A:
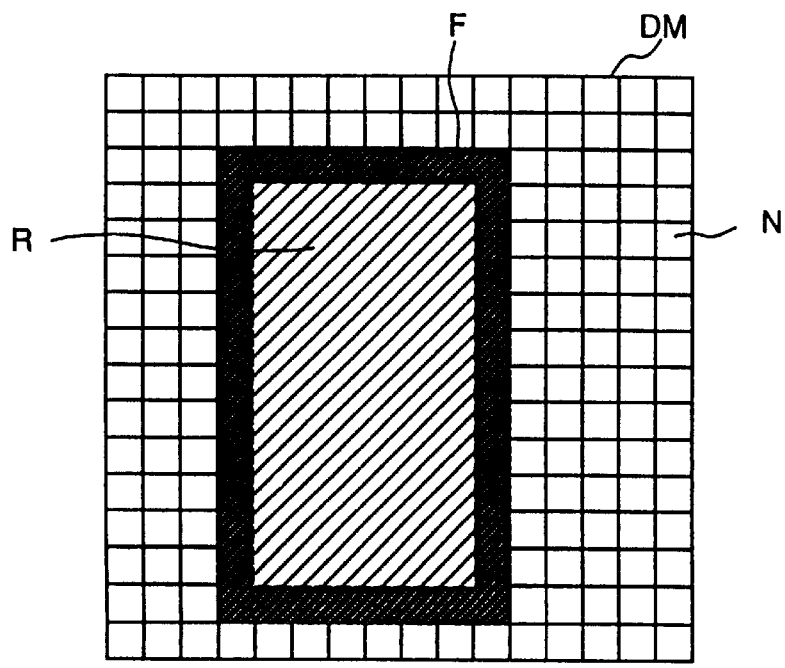
FIGS. 29A and 29B are views for explaining the method of determining areas R, F, and N on the basis of the patterns shown in FIGS. 28A and 28B.
Figure 29B:
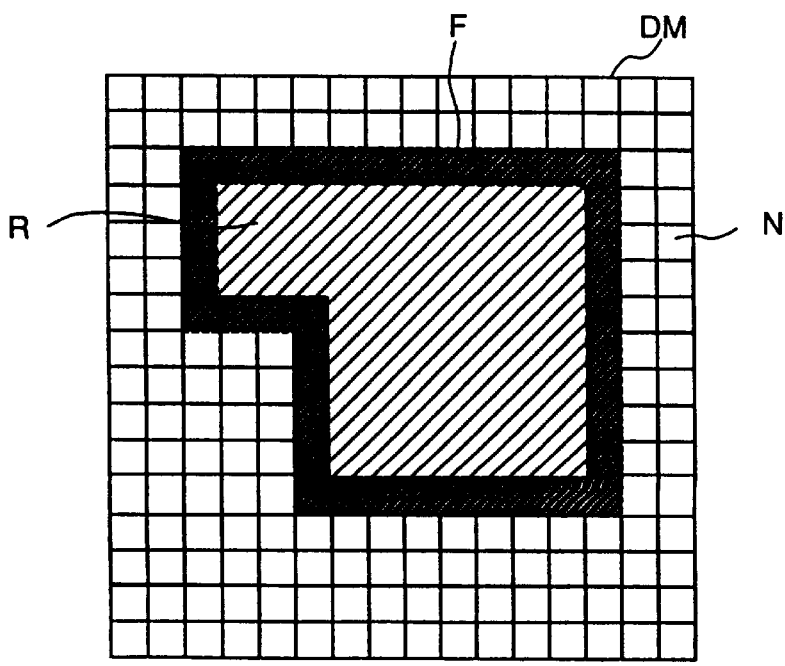

On the basis of data (pattern data) of array positions as shown in FIGS. 28A and 28B where exposure must be performed for each element electron optical system, the CPU 625 determines an area F (black portion) on an array consisting of array positions (array elements FME) at which the contour portion is exposed, an area R (hatched portion) on an array consisting of array positions (array elements FME) at which the inner portion of the pattern is exposed, and an area N (white portion) on an array consisting of array positions (array elements FME) at which exposure is not performed, as shown in FIGS. 29A and 29B. The contour portion may be regarded as an inner portion depending on the shape of the pattern. In this embodiment, the width of the contour portion corresponds to one array element FME. However, the width of the contour portion may be represented by two array elements FME.

(S200)

Figure 30A:
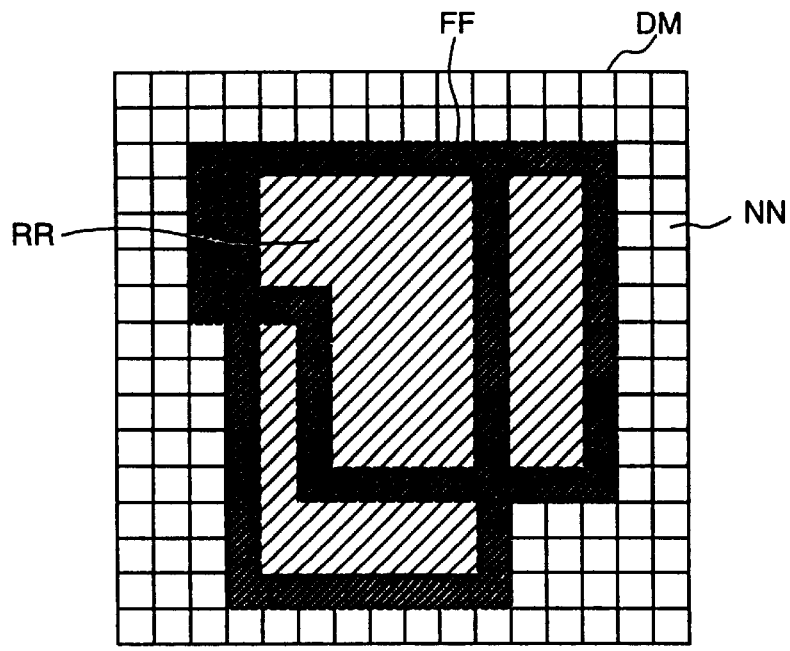
FIG. 30A is a view for explaining the method of determining areas FF, RR, and NN on the basis of data associated with the areas R, F, and N shown in FIGS. 29A and 29B.

On the basis of the data associated with the areas F, R, and N shown in FIGS. 29A and 29B, the CPU 625 determines a first area FF (black portion) consisting of array positions at which the contour portion is exposed by at least one of the element electron optical systems a and b, a second area RR (hatched portion) different from the first area and consisting of array positions at which the inner portion of the pattern is exposed by at least one of the element electron optical systems a and b, and a third area NN (white portion) consisting of array positions at which neither of the element electron optical systems a and b perform exposure, as shown in FIG. 30A. The CPU 625 also divides the second area RR by an array element RME larger than the array interval of the array. At this time, an area which cannot be divided by the array element RME is added to the first area FF. The result is shown in FIG. 30B.

When a plurality of electron beams are positioned in the first area FF on the array, the electron beams are deflected by the deflector 606 using the minimum deflection amount (array interval of the array) as a unit to perform exposure. With this operation, the contour portions of all exposure patterns to be formed on the wafer can be precisely reproduced. When the plurality of electron beams are positioned in the second area RR on the array, the electron beams are deflected by the deflector 606 using a deflection amount larger than the minimum deflection amount (array interval of the array) as a unit to perform exposure. With this operation, the inner portion of the pattern which does not need high precision can be formed with a smaller number of times of exposure operations. When the plurality of electron beams are positioned in the third area NN on the array, the positions of the electron beams are deflected without being set. With this operation, exposure can be performed while minimizing wasteful deflection of electron beams.

(S300)

Figure 30B:
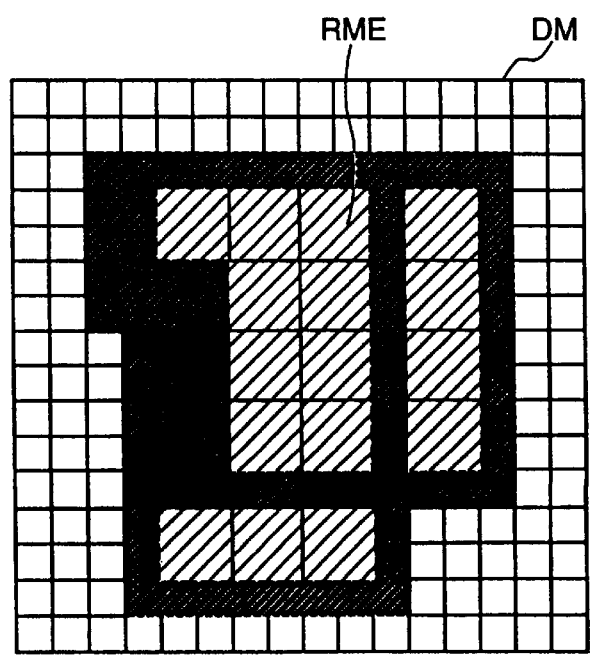
FIG. 30B is a view showing the result of division of the area RR shown in FIG. 30A by an array element RME.
Figure 31A:
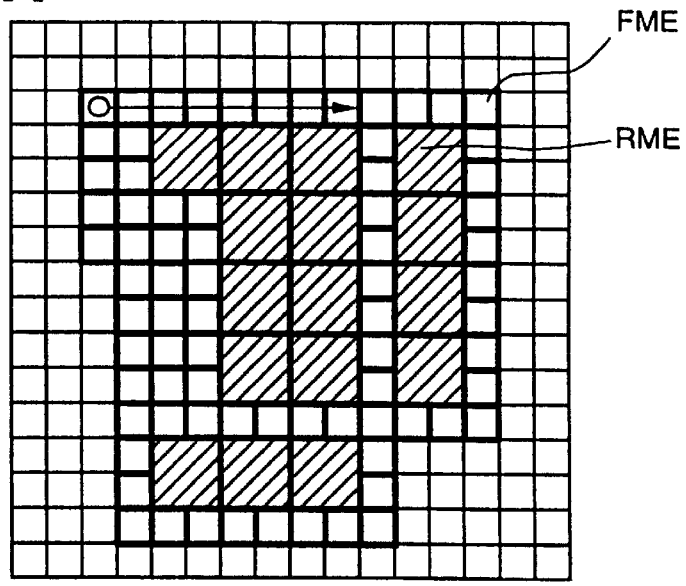
FIGS. 31A to 31C are views for explaining exposure control data.
Figure 31B:
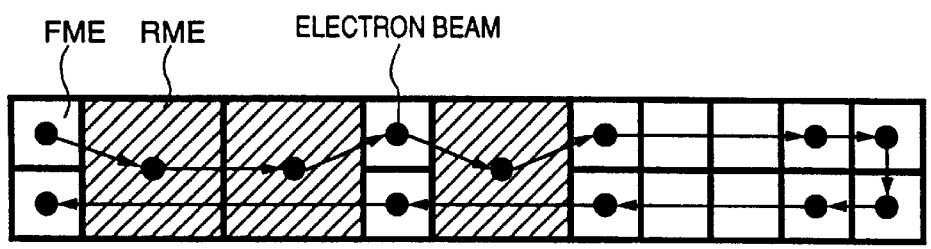

On the basis of data associated with the areas FF, RR, and NN shown in FIG. 30B, the CPU 625 determines the array positions of the array elements FME and RME to be exposed, as shown in FIG. 31A, thereby preparing deflection control data for positioning the electron beams at the array elements FME and RME to be exposed, i.e., sequential data formed by sequentially arranging a plurality of data of array positions at which the electron beams must be set in the deflection path, as shown in FIG. 31B.

Figure 31C:
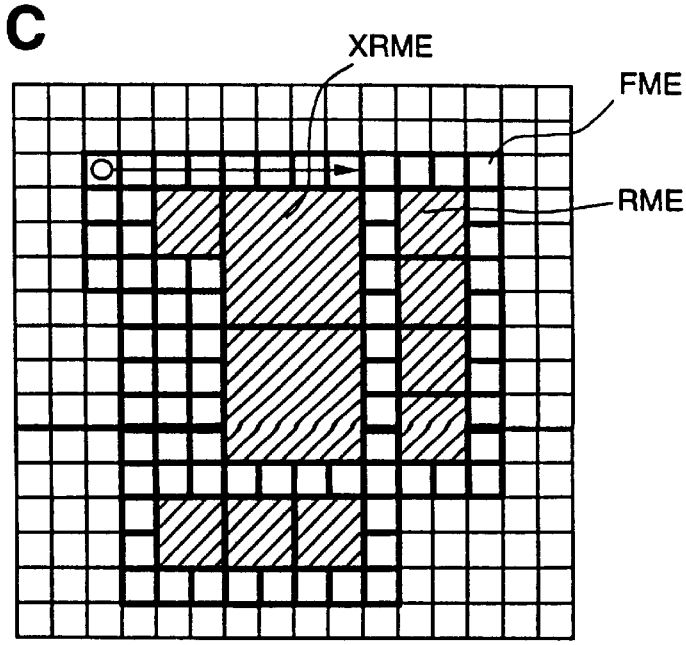

In this embodiment, the second area RR is divided only by the array element RME larger than the array interval of the array elements FME on the array. However, an area constituted by the array elements RME may be divided by an array element XRME larger than the array element RME. At this time, an area which cannot be divided by the array element XRME may be constituted by the array elements RME. The result is shown in FIG. 31C. Deflection control data representing only the array elements FME, RME, and XRME to be exposed with the electron beams may be prepared. The area constituted by the array elements XRME can be exposed by deflecting the electron beam by the deflector 606 using, as a unit, a deflection amount larger than the unit deflection amount for an area constituted by the array elements RME. Therefore, the inner portion of the pattern which does not need high precision can be formed with a much smaller number of times of exposure operations.

(S400)

Figure 32A:
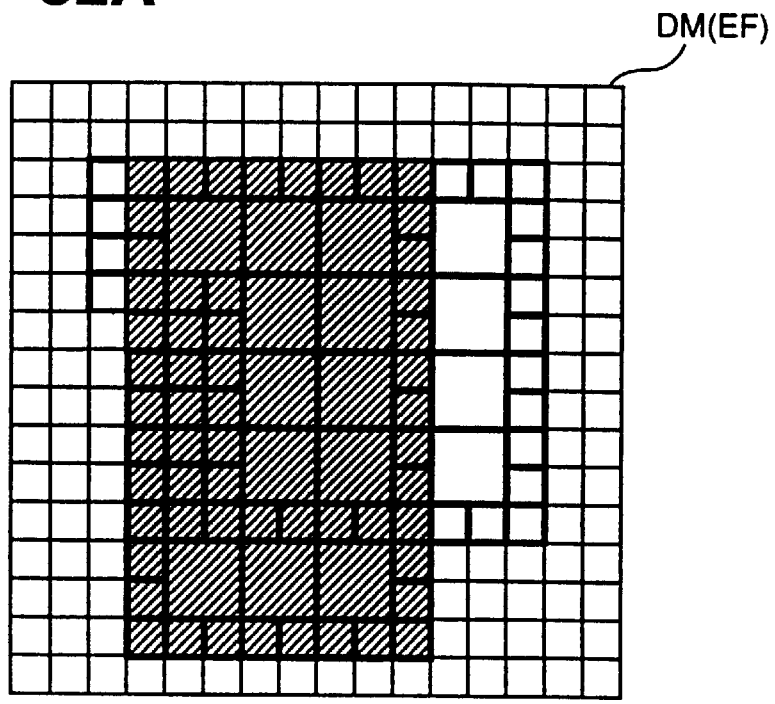
FIGS. 32A and 32B are views for explaining blanking control data.
Figure 32B:
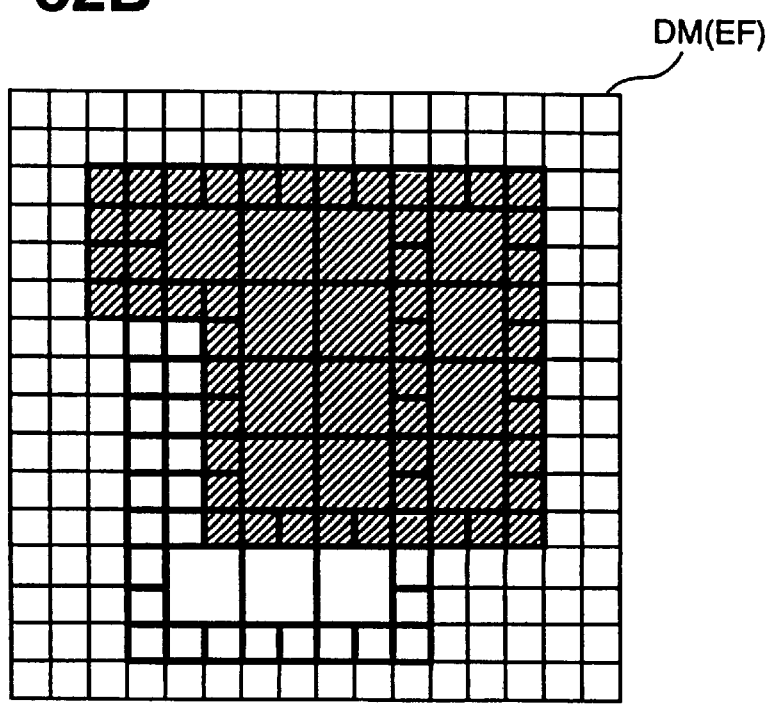

To perform pattern exposure, the blanking electrodes must be controlled on the basis of the array positions of the plurality of electron beams to irradiate the electron beams from the element electron optical systems. FIGS. 32A and 32B are views showing irradiation of electron beams from the element electron optical systems in correspondence with the array positions. More specifically, the electron beam is irradiated on a hatched array element. The CPU 625 prepares blanking control data corresponding to the array positions of each element electron optical system.

(S500)

From data of the exposure pattern to be formed on the wafer, as shown in FIG. 33, the CPU 625 prepares exposure control data including the array positions, the types of array elements, the blanking control data including the operation time of the blanking electrode of each element electron optical system. In this embodiment, the CPU 625 of the electron beam exposure apparatus performs the above processing. However, even when the processing is performed by an external processing unit, and the exposure control data is transferred to the CPU 625, the object and effect do not change.

The CPU 625 directs the control system 622 through the interface 624 to "execute exposure". The control system 622 operates as follows on the basis of data on the memory 623 to which the exposure control data is transferred.

The control system 622 directs the deflection control circuit 617, on the basis of the exposure control data from the memory 623, which is transferred in synchronism with the internal reference clock, to cause the subdeflector of the deflector 606 to deflect the plurality of electron beams from the element electron optical system array 603, and also directs the blanking control circuit 614 to turn on/off the blanking electrodes of the element electron optical systems in accordance with the exposure pattern to be formed on the wafer 605.

At this time, the X-Y stage 612 continuously moves in the X and Y directions. The deflection control circuit 617 controls the deflection position of the electron beam in consideration of the moving amount of the X-Y stage 612.

The control system 622 changes the OFF time of the blanking electrode of each element electron optical system or changes the size of the source image on the wafer depending on the type of array element (FME, RME). Since the array element RME substantially has an exposure area larger than that of the array element FME, underexposure occurs if the same exposure time is set for the array elements FME and RME. The blanking electrode is controlled by the blanking control circuit 614 to prolong the exposure time for the array element RME. Alternatively, when the array element RME is to be exposed, the size of crossover image of the sources of the electron gun 601 may be increased by an electron gun control circuit 631. Furthermore, the focal length of the element electron optical system may be reduced by the first focus/astigmatism control circuit 615 to increase the size of the source image on the wafer (the magnification of the intermediate image formed by the element electron optical system is defined on the basis of the ratio of the focal length of the condenser lens 602 to that of the element electron optical system). However, when the focal length of the element electron optical system is to be decreased, the intermediate image formation position changes. In this case, the position variation of the source image on the wafer along the optical axis, which is caused by the variation of the intermediate image formation position, may be corrected by a refocus coil (not shown) arranged in the reduction electron optical system 604.

Figure 34A:
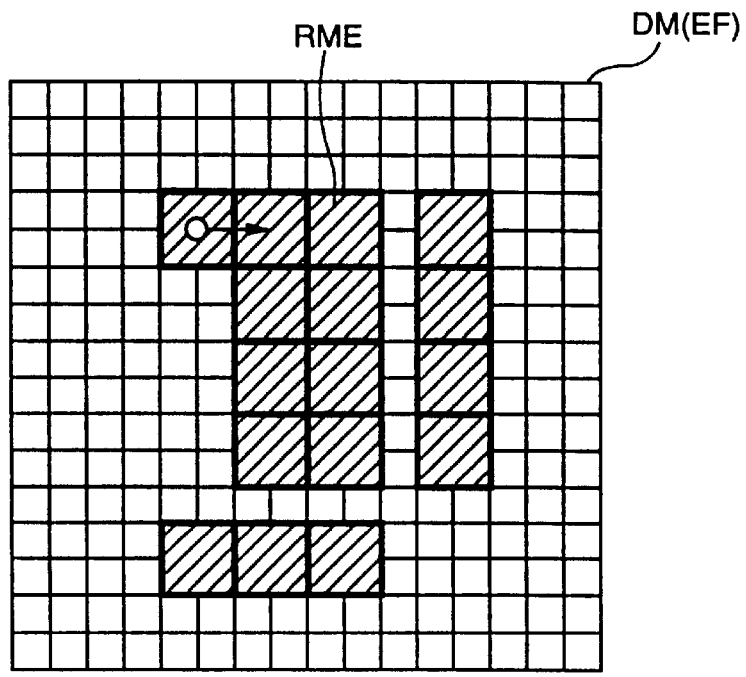
FIG. 34A is a view for explaining the area to be continuously exposed by the array element RME.
Figure 34B:
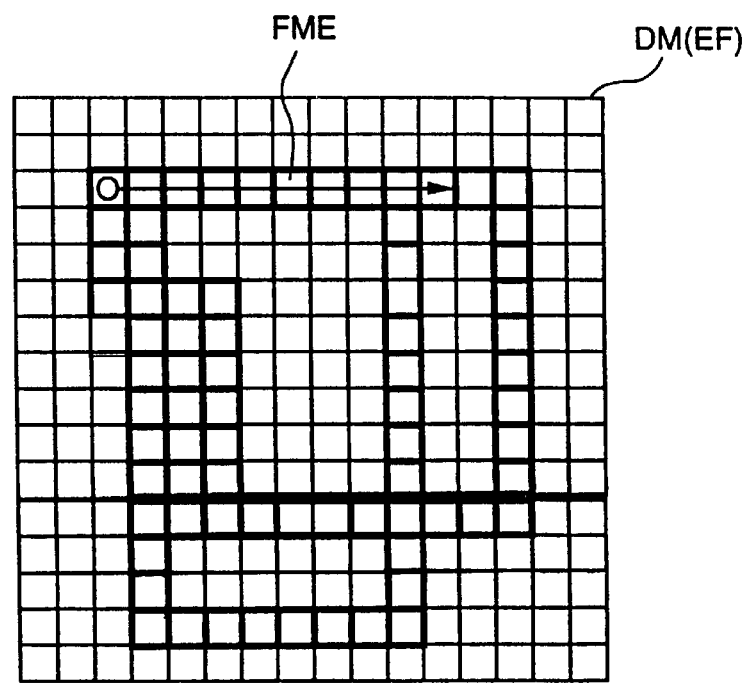
FIG. 34B is a view for explaining the area to be continuously exposed by an array element FME.

When exposure of the array elements RME and exposure of the array element FME are alternately performed, the load on the control system increases. In view of this, the sequential control data may be changed to sequentially perform exposure first at deflection positions of the array elements RME, as shown in FIG. 34A, and next at deflection positions of the array elements FME, as shown in FIG. 34B.

Figure 35:
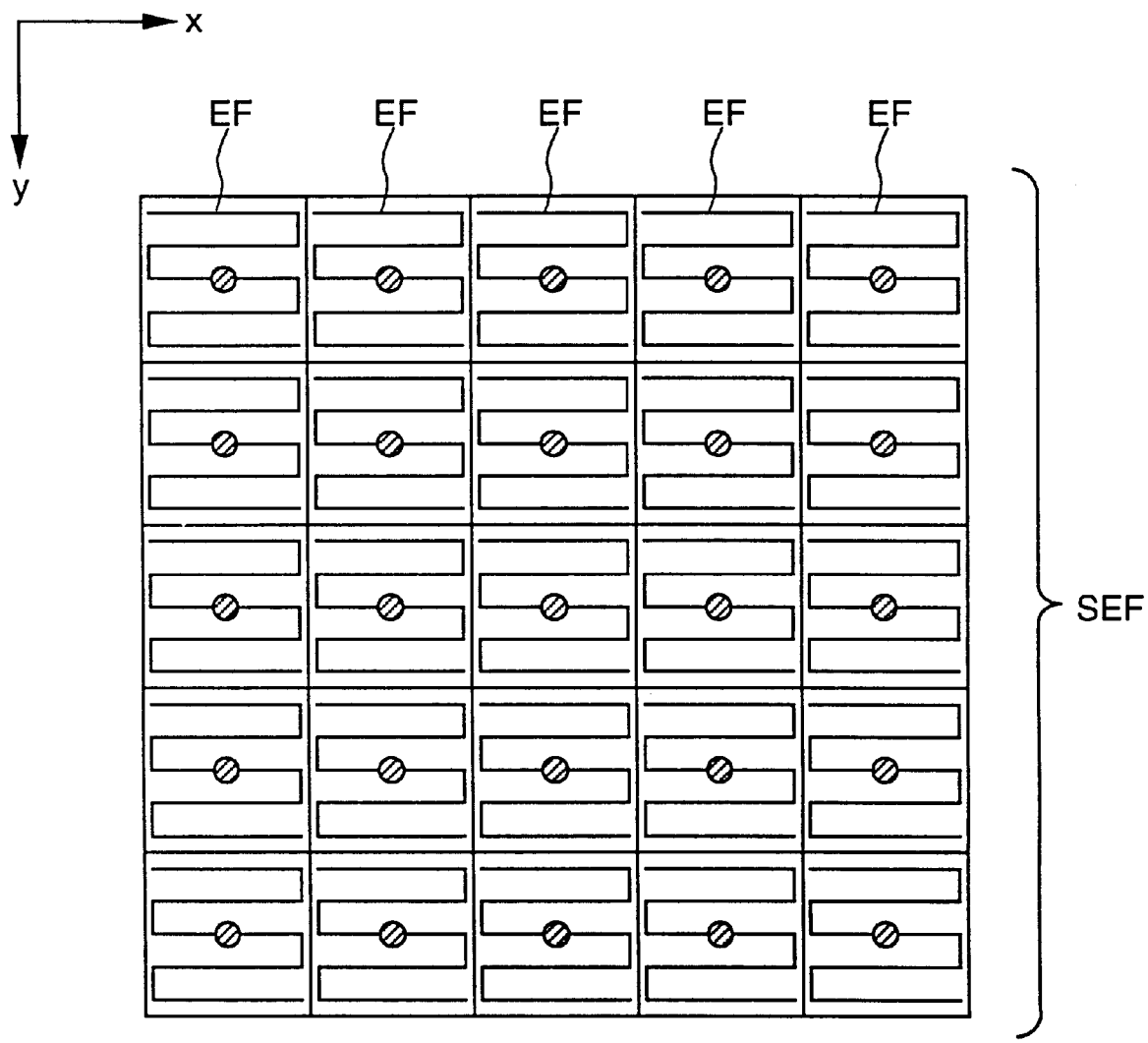
FIG. 35 is a view for explaining the subarray exposure field (SEF)
Figure 36:
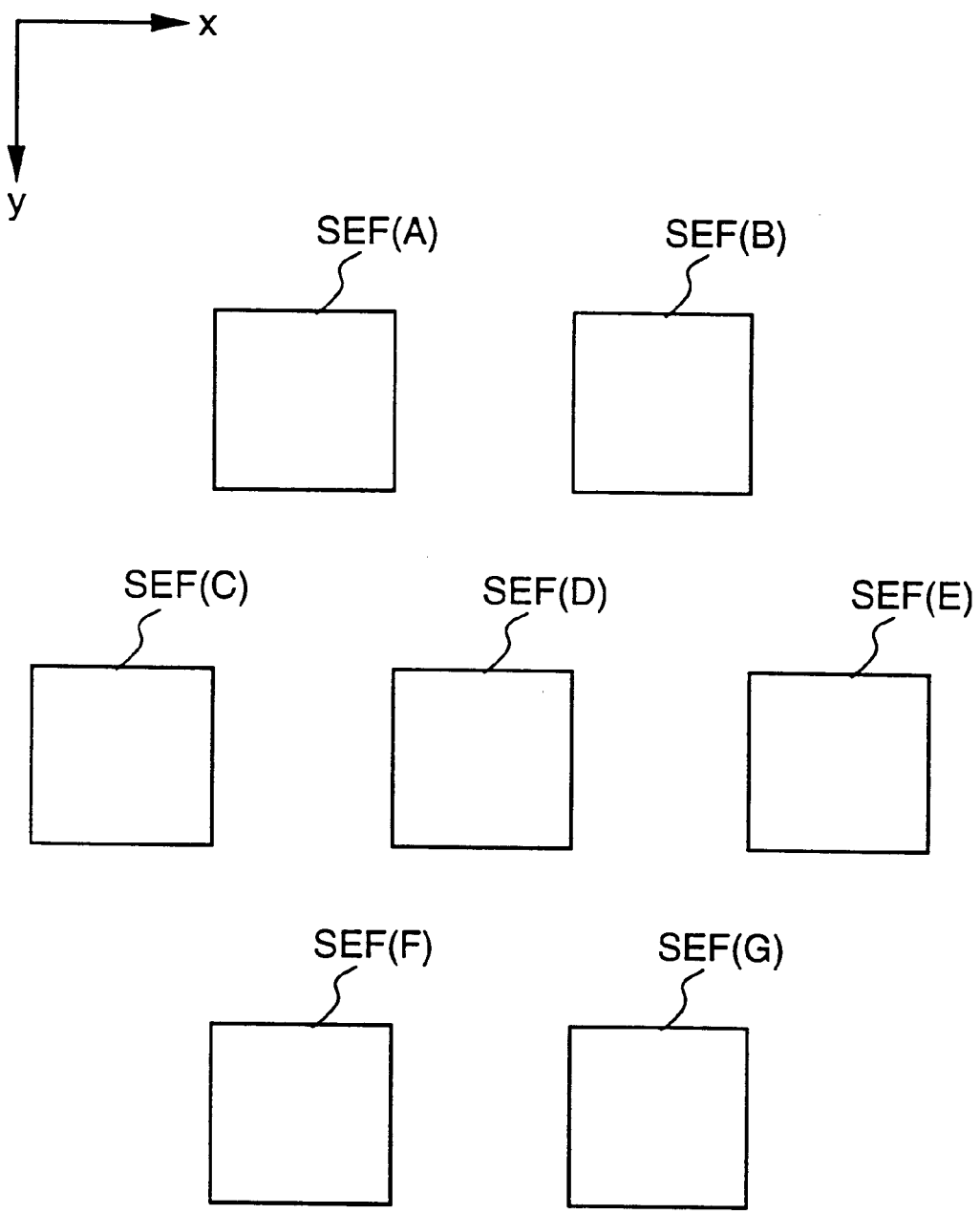
FIG. 36 is a view for explaining the subfield.

Consequently, the electron beams from the element electron optical systems scan to expose exposure fields (EF) on the wafer 605, as shown in FIGS. 32A and 32B. A plurality of electron beams from one subarray serve to expose a subarray exposure field (SEF) in which the exposure fields of the element electron optical systems in the subarray are adjacent to each other, as shown in FIG. 35. In this way, a subfield constituted by subarray exposure fields SEF(A) to SEF(G) on the wafer 605 formed by the subarrays A to G, respectively, is exposed, as shown in FIG. 36.

After exposure of subfield ①  shown in FIG. 19, the control system 622 directs the deflection control circuit 617 to make the main deflector of the deflector 606 deflect the plurality of electron beams from the element electron optical system array so as to expose subfield ②. At this time, the control system 622 commands the second focus/astigmatism control circuit 616 to control the dynamic focus coil 607 on the basis of dynamic focus correction data which has been obtained in advance, thereby correcting the focal position of the reduction electron optical system 604. At the same time, the control system 622 commands control of the dynamic stigmatic coil 608 on the basis of dynamic astigmatism correction data which has been obtained in advance, thereby correcting the astigmatism of the reduction electron optical system. The operation of step 1 is performed to expose subfield ②.

The above steps 1 and 2 are repeated to sequentially expose subfields in the order of ③, ④, . . . . , as shown in FIG. 19, thereby exposing the entire surface of the wafer.

According to the first embodiment, even when the size of the exposure pattern to be formed becomes small, a decrease in throughput can be minimized.

(Second Embodiment)

This embodiment provides another operation of the electron beam exposure apparatus according to the first embodiment. Therefore, an electron beam exposure apparatus according to the second embodiment has the same arrangement as that of the electron beam exposure apparatus described in [Description of Constituent Elements of Electron Beam Exposure Apparatus] of the first embodiment.

Figure 44:
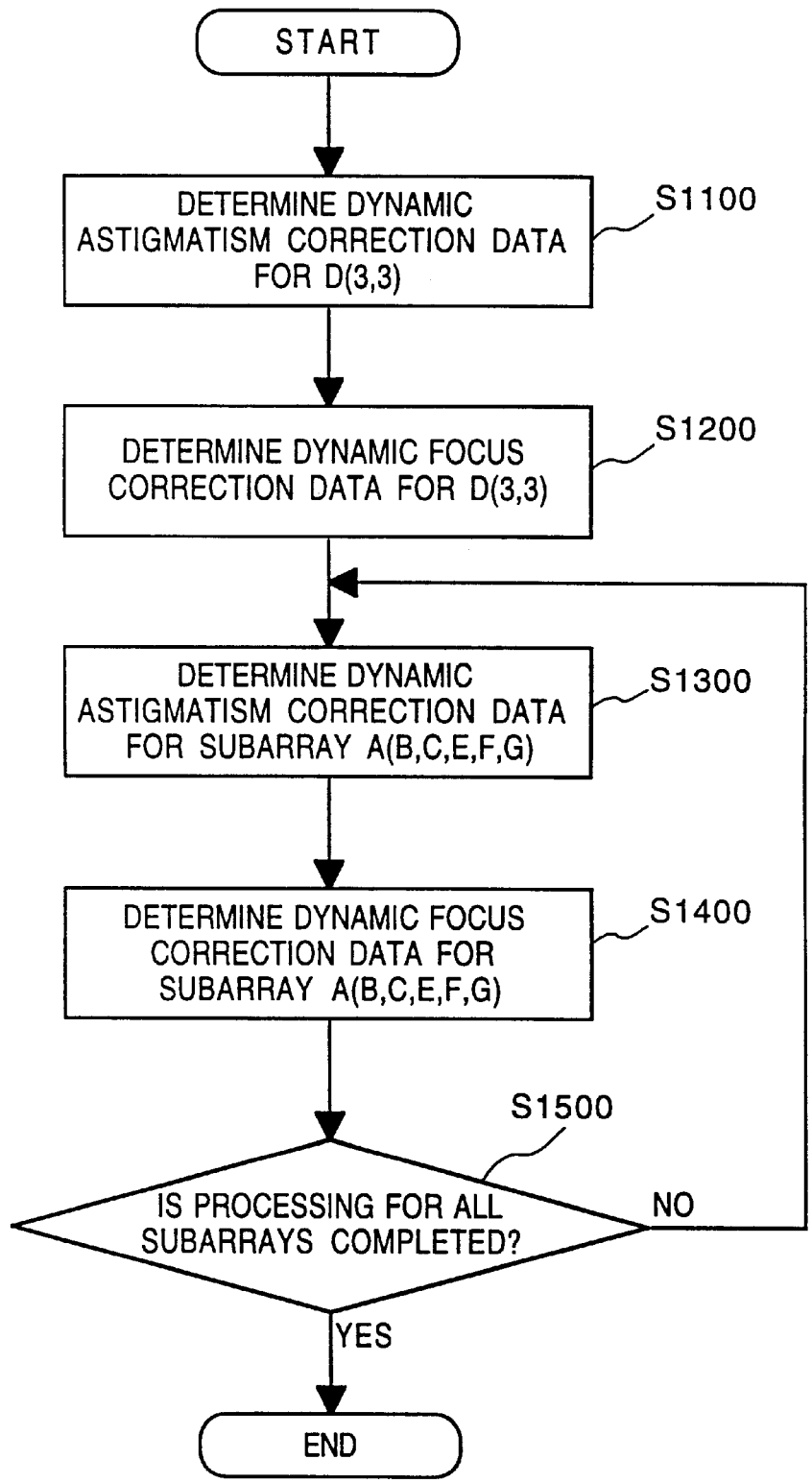
FIG. 44 is a flow chart for explaining calibration.

Prior to wafer exposure by this exposure apparatus, a CPU 625 directs a control system 622 through an interface 624 to perform "calibration". The control system 622 determines dynamic astigmatism correction data and dynamic correction data for each subarray in accordance with the flow chart in FIG. 44.

(step S1100)

Figure 39A:
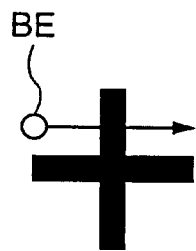
FIGS. 39A to 39C are views for explaining marks on a stage reference plate.
Figure 39B:
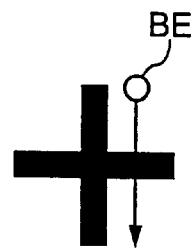
Figure 39C:
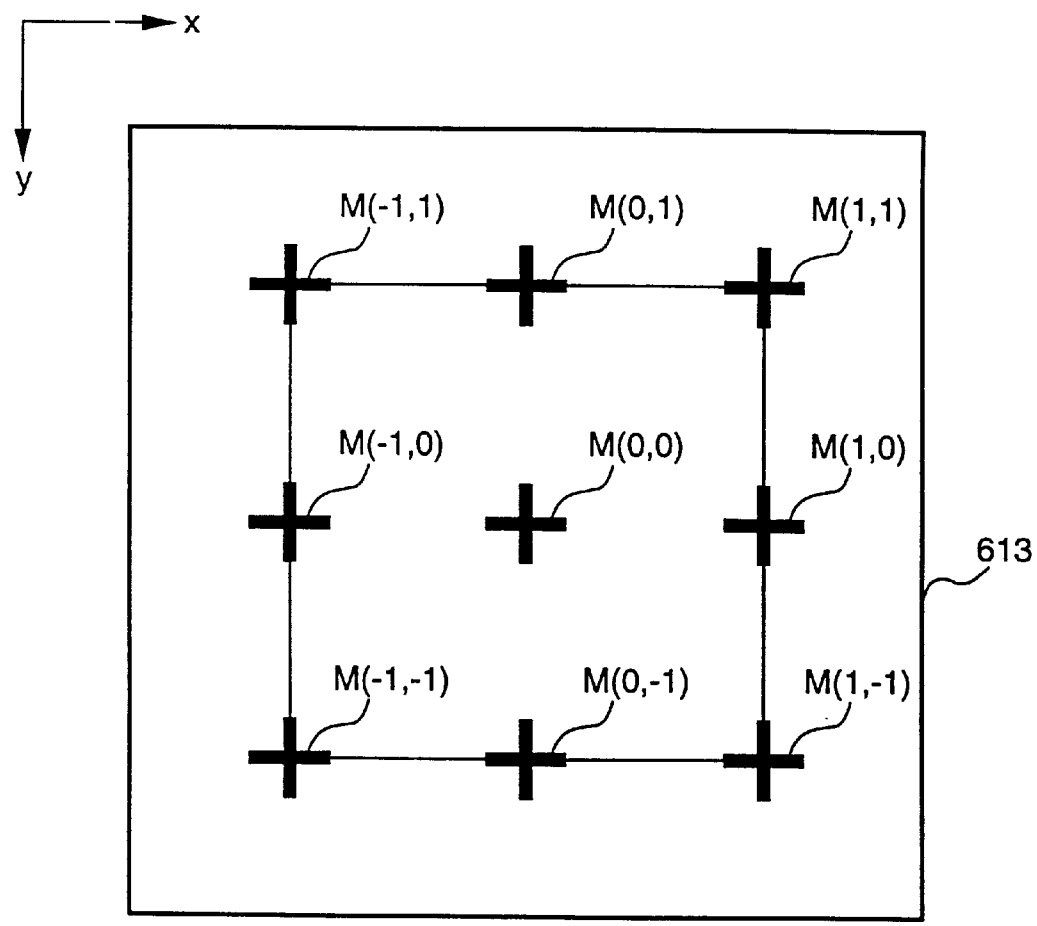

As shown in FIG. 39C, cross marks are formed on a stage reference plate 613 at positions corresponding to elements which are set when the deflection area (MEF) of the main deflector of a deflector 606 is divided to form a matrix of nine elements.

A position where an electron beam from an element electron optical system D(3,3) at the center of an element electron optical system array 603 shown in FIG. 24 is irradiated on the wafer without being deflected is set as a beam reference position. The control system 622 directs a stage drive control circuit 620 to move a X-Y stage 612 and set a mark (M(0,0)) of the stage reference plate 613 at the beam reference position.

The control system 622 directs a blanking control circuit 614 to turn off only the blanking electrode of the element electron optical system D(3,3) while keeping the remaining blanking electrodes ON so that only the electron beam from the element electron optical system D(3,3) becomes incident on the stage reference plate 613.

Simultaneously, the control system 622 instructs a deflection control circuit 617 to make the main deflector of the deflector 606 deflect an electron beam BE from the element electron optical system D(3,3) to the position of a mark M(1,1). As shown in FIG. 39A, the mark M(1,1) is scanned with the electron beam BE in the X direction. Reflected electrons/secondary electrons from the mark are detected by a reflected electron detector 609 and input to the control system 622. The control system 622 obtains the blur of the beam in the X direction on the basis of the mark data. In addition, the mark M(1,1) is scanned with the electron beam BE in the Y direction, as shown in FIG. 39B. Reflected electrons/secondary electrons from the mark are detected by the reflected electron detector 609 and input to the control system 622. The control system 622 obtains the blur of the electron beam in the Y direction on the basis of the mark data.

Next, the control system 622 directs a second focus/astigmatism control circuit 616 to change setting of a dynamic stigmatic coil 608 (change the dynamic astigmatism correction data), scans the mark M(1,1) with the electron beam BE again, and obtains the blurs of the beam in the X and Y directions in a similar manner. By repeating the above operation, the control system 622 obtains dynamic astigmatism correction data for substantially equalizing the blurs of the beam in the X and Y directions. With this operation, the optimum dynamic astigmatism correction data at the deflection position corresponding to the mark M(1,1) is determined. The above operation is performed for all marks, thereby determining optimum dynamic astigmatism correction data at deflection positions corresponding to the respective marks.

(S1200)

The control system 622 causes the main deflector of the deflector 606 to deflect the electron beam BE from the element electron optical system D(3,3) to the position of the mark M(1,1) and scans the mark M(1,1) in the X direction, as shown in FIG. 39A. Reflected electrons/secondary electrons from the mark are detected by the reflected electron detector 609 and input to the control system 622. The control system 622 obtains the blur of the beam on the basis of the mark data. At this time, the dynamic stigmatic coil 608 is controlled on the basis of the dynamic astigmatism correction data obtained previously.

Next, the control system 622 directs the second focus/astigmatism control circuit 616 to change setting of a dynamic focus coil 607 (change the dynamic focus correction data), scans the mark M(1,1) with the electron beam BE again, and obtains the blur of the beam in a similar manner. By repeating the above operation, the control system 622 obtains dynamic focus correction data for minimizing the blurs of the beam. With this operation, the optimum dynamic focus correction data at the deflection position corresponding to the mark M(1,1) is determined. The above operation is performed for all marks, thereby determining optimum dynamic focus correction data at deflection positions corresponding to the respective marks.

(S1300)

Figure 24A:
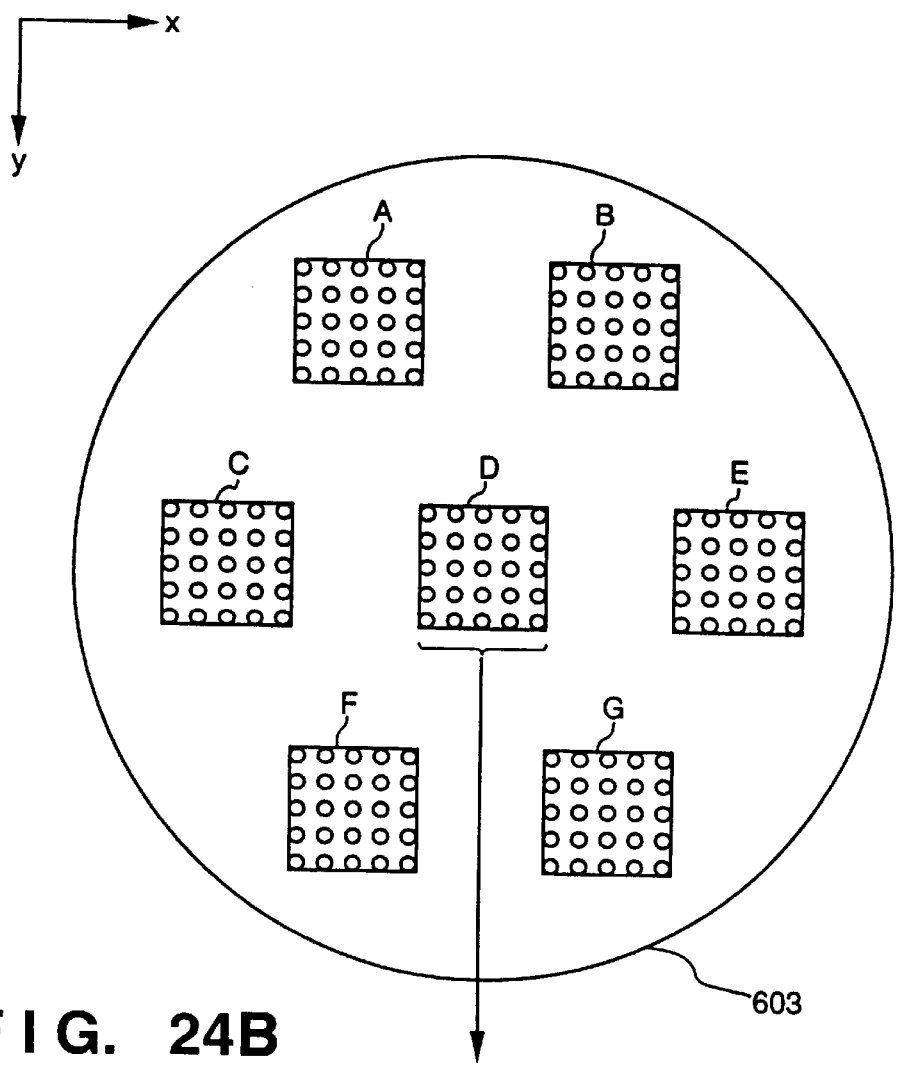
FIGS. 24A and 24B are views for explaining an element electron optical system array.

A position where an electron beam from an element electron optical system A(3,3) of the element electron optical system array 603 shown in FIG. 24A is irradiated on the wafer without being deflected is set as a beam reference position. The control system 622 directs the stage drive control circuit 620 to move the X-Y stage 612 and set the mark (M(0,0) of the stage reference plate 613 at the beam reference position.

The control system 622 directs the blanking control circuit 614 to turn off only the blanking electrode of the element electron optical system A(3,3) while keeping the remaining blanking electrodes ON so that only the electron beam from the element electron optical system A(3,3) becomes incident on the stage reference plate 613.

Simultaneously, the control system 622 commands the deflection control circuit 617 to make the main deflector of the deflector 606 deflect the electron beam BE from the element electron optical system A(3,3) to the position of the mark M(1,1). As shown in FIG. 39A, the mark M(1,1) is scanned with the electron beam BE in the X direction. Reflected electrons/secondary electrons from the mark are detected by the reflected electron detector 609 and input to the control system 622. The control system 622 obtains the blur of the beam in the X direction on the basis of the mark data. In addition, the mark M(1,1) is scanned with the electron beam BE in the Y direction, as shown in FIG. 39B. Reflected electrons/secondary electrons from the mark are detected by the reflected electron detector 609 and input to the control system 622. The control system 622 obtains the blur of the electron beam in the Y direction on the basis of the mark data. At this time, the dynamic focus coil is controlled on the basis of the dynamic focus correction data obtained in step S1100, and the dynamic stigmatic coil 608 is controlled on the basis of the dynamic astigmatism correction data obtained in step S1100.

Next, the control system 622 instructs a first focus/astigmatism control circuit 615 to change setting of the astigmatism of a subarray A (change the dynamic astigmatism correction data for each subarray), scans the mark M(1,1) with the electron beam BE again, and obtains the blurs of the beam in the X and Y directions in a similar manner. By repeating the above operation, the control system 622 obtains dynamic astigmatism correction data for the subarray A, which substantially equalizes and minimizes the blurs of the beam in the X and Y directions. With this operation, the optimum dynamic astigmatism correction data for the subarray A at the deflection position corresponding to the mark M(1,1) in determined. The above operation is performed for all marks, thereby determining optimum dynamic astigmatism correction data for the subarray A at deflection positions corresponding to the respective marks.

(S1400)

The control system 622 causes the main deflector of the deflector 606 to deflect the electron beam BE from the element electron optical system A(3,3) to the position of the mark M(1,1) and scans the mark M(1,1) in the X direction, as shown in FIG. 39A. Reflected electrons/secondary electrons from the mark are detected by the reflected electron detector 609 and input to the control system 622. The control system 622 obtains the blur of the electron beam on the basis of the mark data. At this time, the astigmatism of the element electron optical system of the subarray A is controlled on the basis of the dynamic astigmatism correction data for the subarray A obtained previously.

Next, the control system 622 directs the first focus/astigmatism control circuit 615 to change setting of the intermediate image formation position of the element electron optical system of the subarray A (change the dynamic focus correction data for each subarray), scans the mark M(1,1) with the electron beam BE again, and obtains the blur of the beam in a similar manner. By repeating the above operation, the control system 622 obtains dynamic focus correction data for the subarray A, which minimizes the blurs of the beam. With this operation, the optimum dynamic focus correction data for the subarray A at the deflection position corresponding to the mark M(1,1) is determined.

The above operation is performed for all marks, thereby determining optimum dynamic focus correction data for the subarray A at deflection positions corresponding to the respective marks.

(S1500)

Figure 24B:
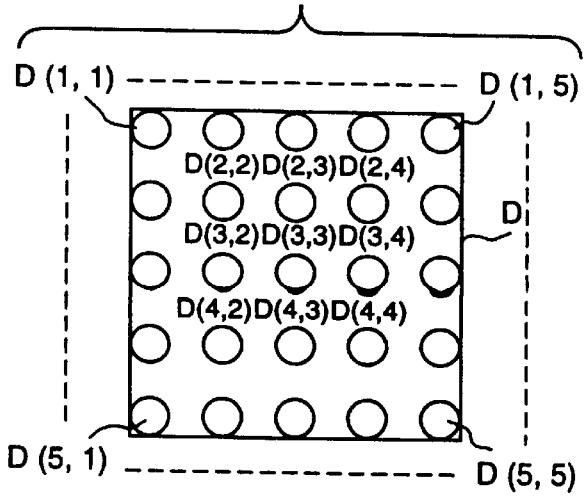

The control system 622 performs the same operation as in step S1300 for electron beams from element electron optical systems B(3,3), C(3,3), E(3,3), F(3,3), and G(3,3) of the element electron optical system array 603 shown in FIGS. 24A and 24B. Consequently, the optimum dynamic focus correction data and optimum dynamic astigmatism correction data at deflection positions corresponding to the respective marks are determined for all the subarrays.

The CPU 625 directs the control system 622 through the interface 624 to "execute exposure". The control system 622 operates in the following manner.

The control system 622 directs the deflection control circuit 617 to make the subdeflector of the deflector 606 deflect the plurality of electron beams from the element electron optical system array, and at the same time, directs the blanking control circuit 614 to turn on/off the blanking electrodes of the element electron optical systems in accordance with the exposure pattern to be formed on a wafer 605. At this time, the X-Y stage 612 continuously moves in the X direction, and the deflection control circuit 617 controls the deflection position of the electron beam in consideration of the moving amount of the X-Y stage 612.

Figure 40:
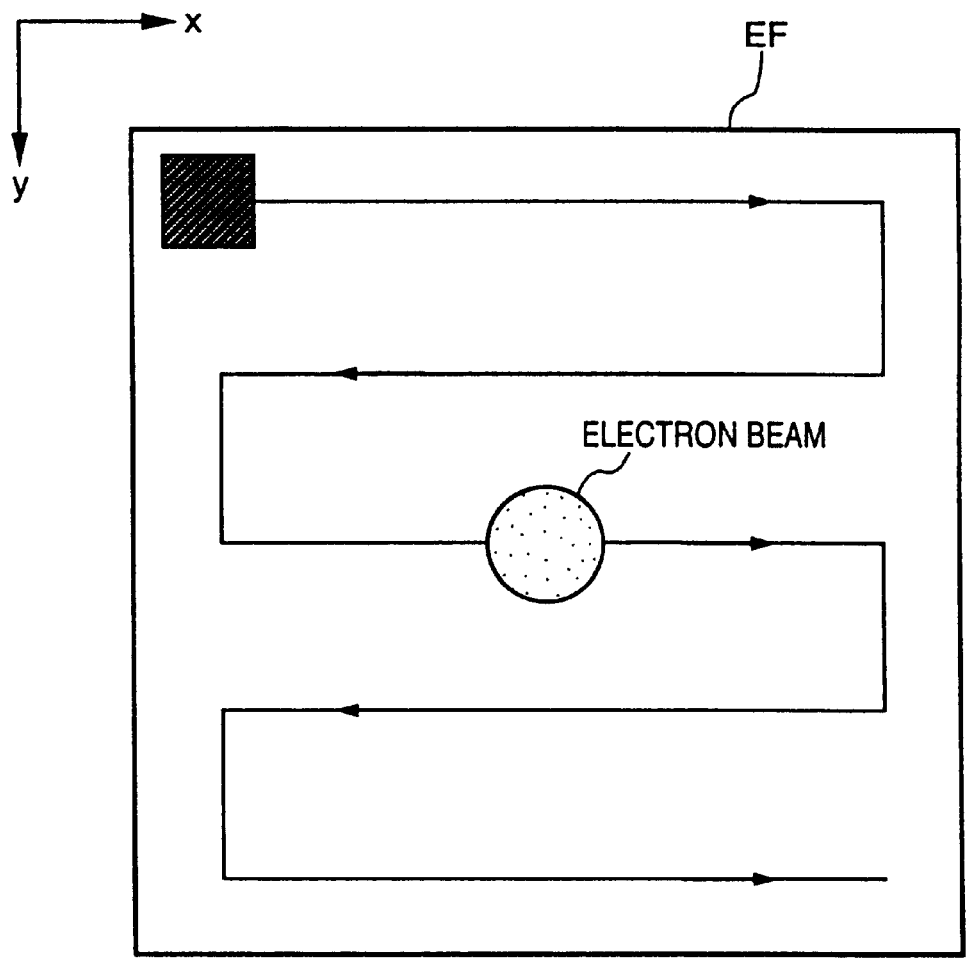
FIG. 40 is a view for explaining the exposure field.

As a result, an electron beam from one element electron optical system scans to expose an exposure field (EF) on the wafer 605 starting from the full square, as shown in FIG. 40. As shown in FIG. 35, the exposure fields (EF) of the plurality of element electron optical systems in the subarray are set to be adjacent to each other. Consequently, a subarray exposure field (SEF) consisting of the plurality of exposure fields (EF) on the wafer 605 is exposed. Simultaneously, a subfield constituted by subarray exposure fields SEF(A) to SEF(G) formed by the subarrays A to G, respectively, on the wafer 605 is exposed, as shown in FIG. 36.

After exposure of subfield ①shown in FIG. 19, the control system 622 directs the deflection control circuit 617 to make the main deflector of the deflector 606 deflect the plurality of electron beams from the element electron optical system array so as to expose subfield ②. At this time, the control system 622 directs the second focus/astigmatism control circuit 616 to control the dynamic focus coil 607 on the basis of the above-described dynamic focus correction data, thereby correcting the focal position of the reduction electron optical system 604. At the same time, the control system 622 directs to control the dynamic stigmatic coil 608 on the basis of the above-described dynamic astigmatism correction data, thereby correcting the astigmatism of the reduction electron optical system. In addition, the control system 622 commands the first focus/astigmatism control circuit 615 to control the electron optical characteristics (intermediate image formation positions and astigmatisms) of the element electron optical systems on the basis of the dynamic focus correction data and dynamic astigmatism correction data for each subarray. The operation in step 1 is performed to expose subfield ②.

The above steps 1 and 2 are repeated to sequentially expose subfields in the order of ③, ④, . . . , as shown in FIG. 19, thereby exposing the entire surface of the wafer.

(Third Embodiment)

Figure 42:
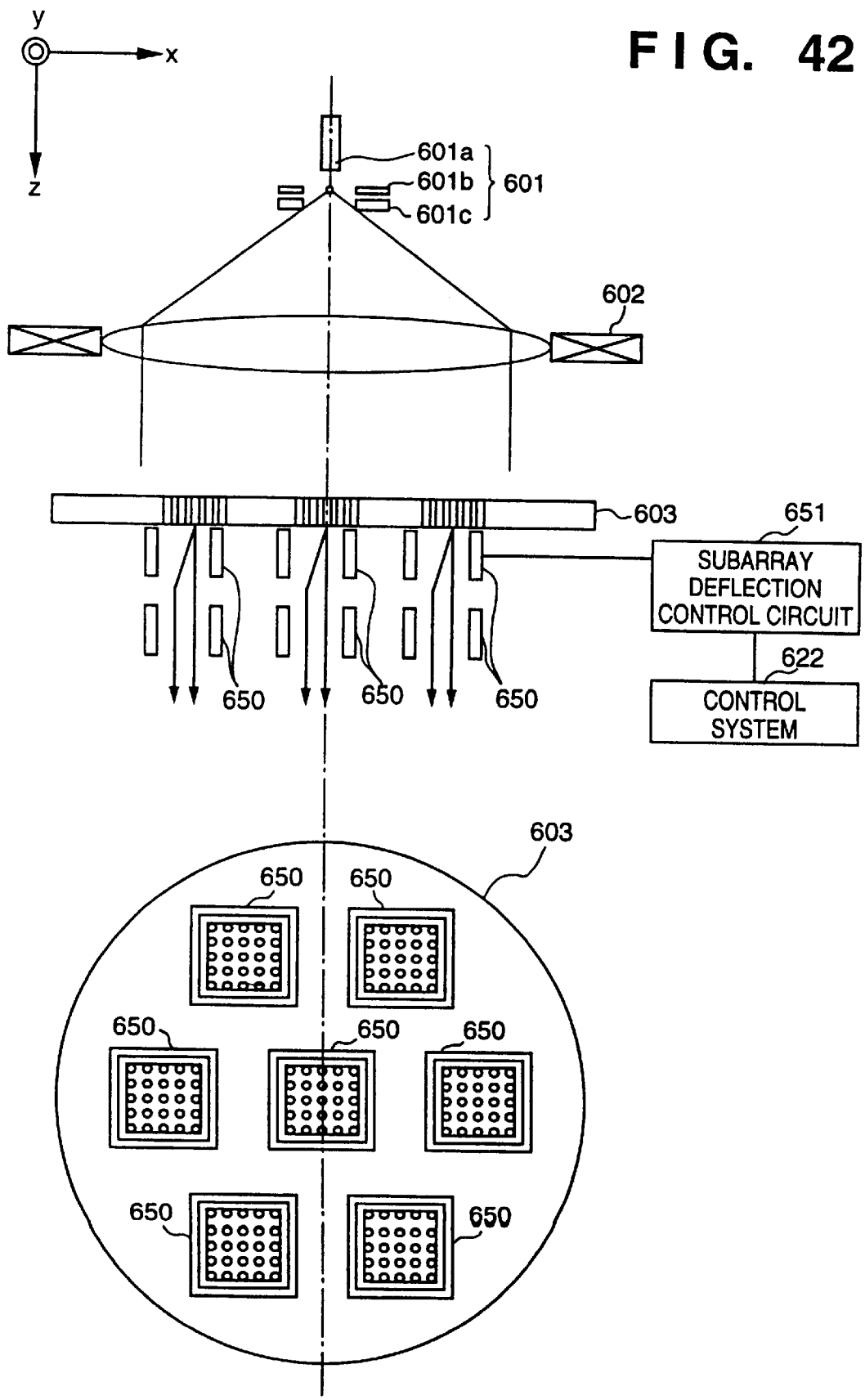
FIG. 42 is a view for explaining a deflector arranged for each subarray.
Figure 43:
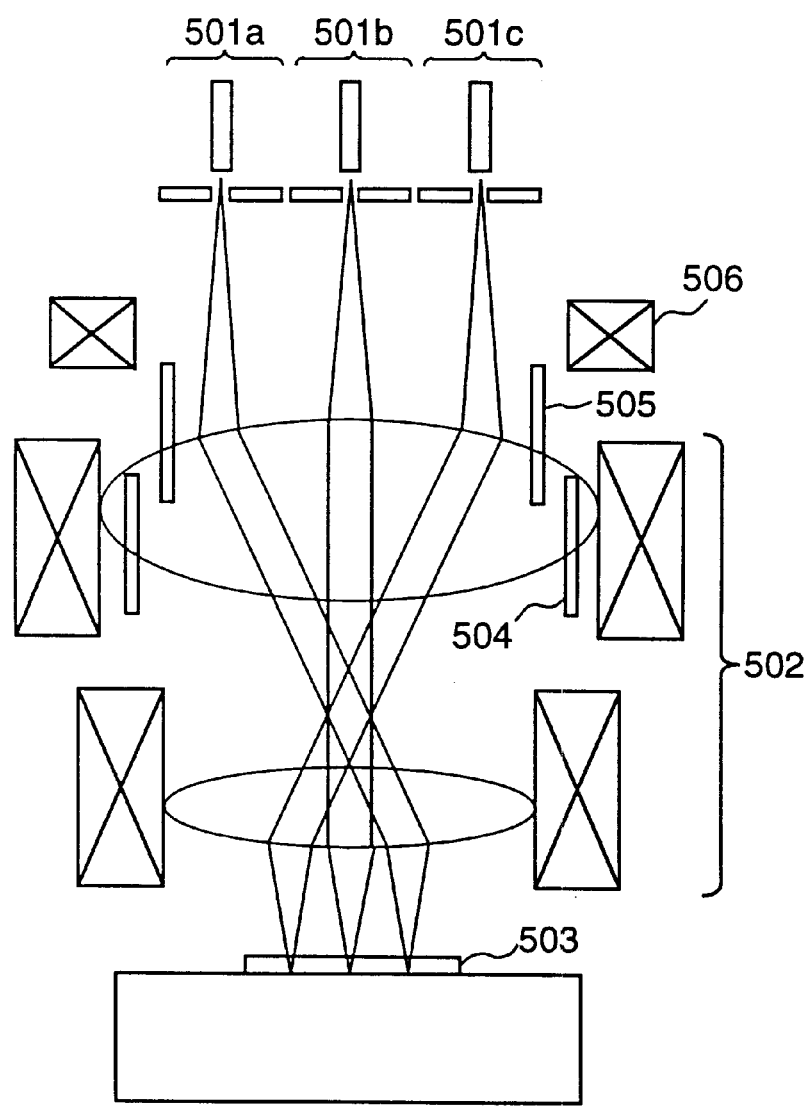
FIG. 43 is a view for explaining the conventional multi-electron beam exposure apparatus.

FIG. 42 is a view showing the difference in constituent elements between the second embodiment and the third embodiment. The same reference numerals as in FIGS. 23A–23C denote the same constituent elements in FIG. 42, and a detailed description thereof will be omitted.

In the third embodiment, a deflector 650 for deflecting an electron beam from a subarray is arranged on the reduction electron optical system 604 side of an element electron optical system array 603 in correspondence with each subarray of the element electron optical system array 603. The deflector 650 has a function of translating a plurality of intermediate images formed by the subarrays (in the X and Y directions) and is controlled by a control system 622 through a subarray deflection control circuit 651.

The operation of this embodiment will be described next.

Prior to wafer exposure by this exposure apparatus, a CPU 625 directs the control system 622 through an interface 624 to perform "calibration". The control system 622 operates in the following manner.

A position where an electron beam from an element electron optical system A(3,3) of the element electron optical system array 603 shown in FIG. 24A is irradiated on the wafer without being deflected is set as a beam reference position. The control system 622 directs a stage drive control circuit 620 to move an X-Y stage 612 and set a mark M(0,0) of a stage reference plate 613 as in the second embodiment at the beam reference position.

The control system 622 directs a blanking control circuit 614 to turn off only the blanking electrode of the element electron optical system A(3,3) while keeping the remaining blanking electrodes ON so that only the electron beam from the element electron optical system A(3,3) becomes incident on the wafer side.

Simultaneously, the control system 622 directs a deflection control circuit 617 to make the main deflector of a deflector 606 deflect an electron beam BE from the element electron optical system A(3,3) to the position of a mark M(1,1). As shown in FIG. 39A, the mark M(1,1) is scanned in the X direction. Reflected electrons/secondary electrons from the mark are detected by a reflected electron detector 609 and input to the control system 622. The control system 622 obtains the deviation between the actual deflection position and the designed deflection position in the X direction on the basis of the mark data. The control system 622 directs the subarray deflection control circuit 651 to change setting of the X-direction translation of the intermediate image by the deflector 650 corresponding to a subarray A (change dynamic deflection correction data in the X direction) to cancel the deviation, scans the mark M(1,1) with the electron beam BE again, and obtains the deviation between the actual deflection position and the designed deflection position in a similar manner. By repeating the above operation, the control system 622 obtains dynamic deflection correction data for substantially canceling the deviation.

Next, the control system 622 scans the mark M(1,1) in the Y direction, as shown in FIG. 39B. In the same way as described above, the control system 622 obtains dynamic deflection correction data in the Y direction for substantially canceling the deviation. With this operation, the optimum dynamic deflection correction data at the deflection position corresponding to the mark M(1,1) is determined.

The above operation is performed for all marks, thereby determining the optimum dynamic deflection correction data at deflection positions corresponding to the respective marks. The control system 622 performs the same operation as for the electron beam from the element electron optical system A(3,3) for electron beams from element electron optical systems B(3,3), C(3,3), D(3,3), E(3,3), F(3,3), and G(3,3) of the element electron optical system array 603 shown in FIG. 24. Consequently, the optimum dynamic deflection correction data at deflection positions corresponding to the respective marks are determined for all the subarrays.

In "execution of exposure", after exposure of subfield ①  shown in FIG. 19, the control system 622 directs the deflection control circuit 617 to make the main deflector of the deflector 606 deflect the plurality of electron beams from the element electron optical system array so as to expose subfield ②. At this time, the control system 622 directs the subarray deflection control circuit 651 to control the deflector 650 corresponding to the subarray on the basis of the above-described dynamic deflection correction data for each subarray, thereby correcting the position of each intermediate image along the direction (X and Y directions) perpendicular to the optical axis.

As described above, according to this embodiment, an electron beam exposure apparatus which can optimally correct deflection errors generated in the plurality of electron beams passing through the reduction electron optical system when the deflector is actuated in units of electron beams can be provided.

Third Mode of Carrying Out the Invention

An embodiment of a method of producing a device by using the above-described electron beam exposure apparatus and method will be described below.

Figure 45:
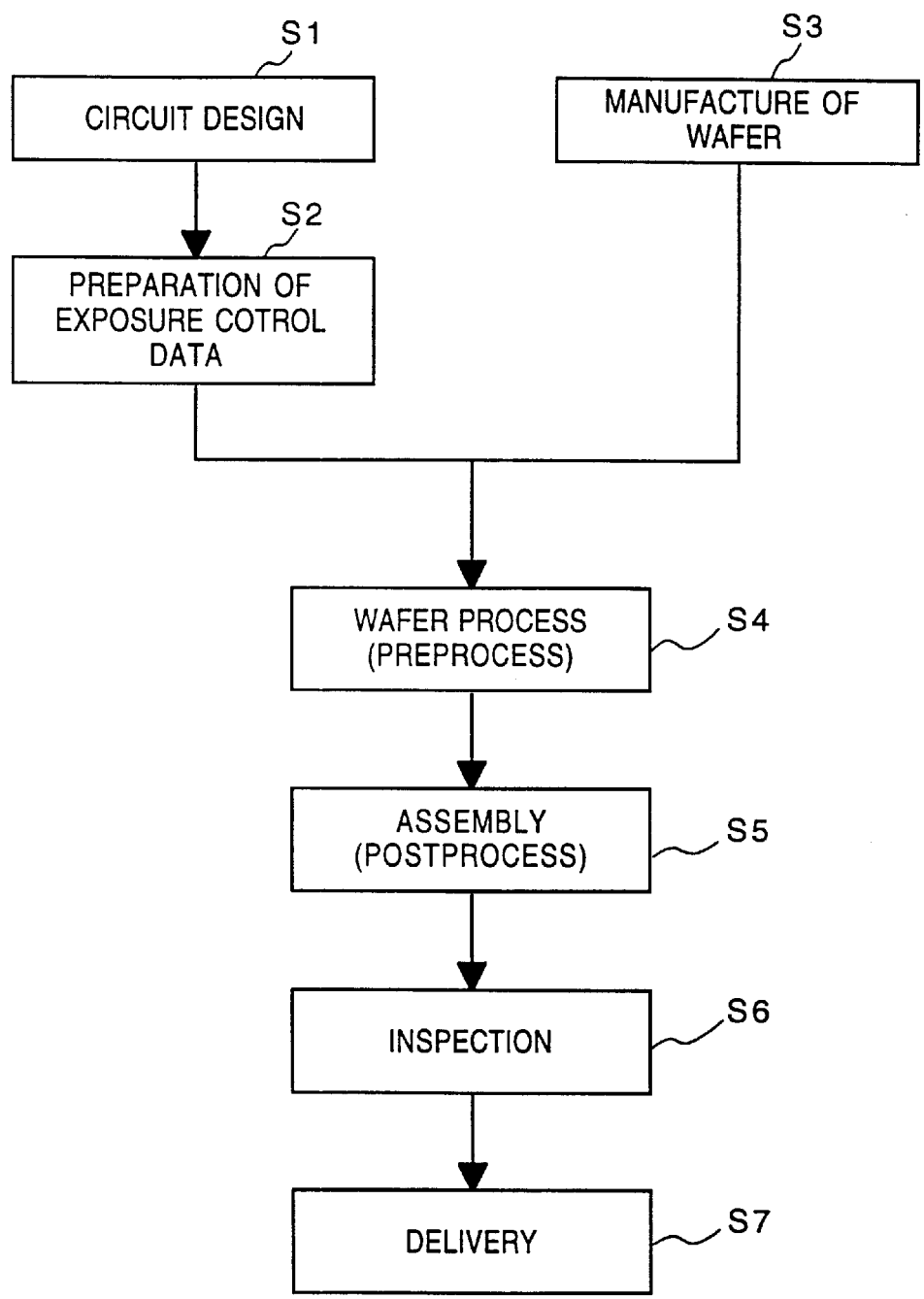
FIG. 45 is a flow chart for explaining the manufacture of a microdevice.

FIG. 45 is a flow chart showing the manufacture of a microdevice (a semiconductor chip such as an IC or LSI, a liquid crystal panel, a CCD, a thin-film magnetic head, a micromachine, or the like). In step 1 (circuit design), the circuit of a semiconductor device is designed. In step 2 (preparation of exposure control data), exposure control data for the exposure apparatus is prepared on the basis of the designed circuit pattern. In step 3 (manufacture of wafer), a wafer is manufactured using a material such as silicon. Step 4 (wafer process) is called a preprocess in which the exposure apparatus to which the prepared exposure control data is input and the wafer are used to form an actual circuit on the wafer by lithography. Step 5 (assembly) is called a postprocess in which semiconductor chips are formed from the wafer manufactured in step 4. The postprocess includes an assembly process (dicing and bonding) and packaging process (chip encapsulating). In step 6 (inspection), the operation confirmation test, durability test, and the like are performed for the semiconductor device manufactured in step 5. With these processes, a semiconductor device is completed and delivered (step 7).

FIG. 46 is a flow chart showing the wafer process in detail. In step 11 (oxidation), the surface of the wafer is oxidized. In step 12 (CVD), an insulating film is formed on the surface of the wafer. In step 13 (electrode formation), an electrode is formed on the wafer by deposition. In step 14 (ion implantation), ions are implanted in the wafer. In step 15 (resist processing), a photosensitive agent is applied on the wafer. In step 16 (exposure), the circuit pattern is formed on the wafer by exposure using the above-described exposure apparatus. In step 17 (development), the exposed wafer is developed. In step 18 (etching), portions other than the developed resist image are etched. In step 19 (resist removal), the unnecessary resist after etching is removed. By repeating these processes, multiple circuit patterns are formed on the wafer.

When the manufacturing method of this embodiment is used, a high-integration semiconductor device which is conventionally difficult to manufacture can be manufactured at a low cost.

The present invention is not limited to the above embodiments and various changes and modifications can be made within the spirit and scope of the present invention. Therefore, to apprise the public of the scope of present invention the following claims are made.

What is claimed is:

1. An electron beam exposure apparatus which has a deflector for deflecting a plurality of electron beams and exposes a target exposure surface by deflecting the plurality of electron beams by said deflector, and simultaneously, independently controlling irradiation of the plurality of electron beams, comprising:

control means for controlling an exposure operation such that a unit of deflection by said deflector is set to be small in a first area where a contour area of a pattern is formed by exposure with at least one of the plurality of electron beams, and the unit of deflection by said deflector is set to be large in a second area different from the first area, where an inner area of said pattern is formed by exposure with at least one of the plurality of electron beams.

2. The apparatus according to claim 1, wherein said control means controls said deflector to deflect and set, in the first and second areas, an electron beam irradiated on said target exposure surface in accordance with the deflection unit corresponding to said area.

3. The apparatus according to claim 2, wherein said control means controls said deflector to deflect without setting, in an area other than the first and second areas, an electron beam irradiated on said target exposure surface.

4. The apparatus according to claim 1, further comprising adjustment means for adjusting a size of an electron beam irradiated on said target exposure surface, and wherein said control means controls said adjustment means to set the size of an electron beam irradiated on said target exposure surface in said second area larger than that of an electron beam irradiated on said target exposure surface in said first area.

5. The apparatus according to claim 1, wherein said control means controls said plurality of electron beam sources to set an irradiation time of an electron beam irradiated on said target exposure surface in said second area longer than that of an electron beam irradiated on said target exposure surface in said first area.

6. The apparatus according to claim 1, wherein said control means sets the deflection unit in said first area on the basis of all or some of a minimum line width, a type of line width, and a shape of line width of said exposure pattern to be formed on said target exposure surface.

7. The apparatus according to claim 1, further comprising a reduction electron optical system and a correction electron optical system to form a plurality of intermediate images from a plurality of electron beams for correcting an aberration generated by said reduction electron optical system, the intermediate images being reduced and projected on said target exposure surface by said reduction electron optical system.

8. A device manufacturing method of manufacturing a device by using an electron beam exposure apparatus of claim 7.

9. A device manufacturing method of manufacturing a device by using an electron beam exposure apparatus of claim 1.

10. An electron beam exposure method in which a target exposure surface is exposed by deflecting a plurality of electron beams by a common deflector, and simultaneously, independently controlling irradiation of the plurality of electron beams, comprising:

the control step of controlling an exposure operation to set a unit of deflection by said deflector to be small in a first area where a contour area of a pattern is formed by exposure with at least one of the plurality of electron beams, and the unit of deflection by said deflector to be large in a second area different from the first area, where an inner area of said pattern is formed by exposure with at least one of the plurality of electron beams.

11. The method according to claim 10, wherein the control step includes the step of controlling said deflector to deflect and set, in the first and second areas, an electron beam irradiated on said target exposure surface in accordance with the deflection unit corresponding to said area.

12. The method according to claim 11, wherein the control step includes the step of controlling said deflector to deflect without setting, in an area other than the first and second areas, an electron beam irradiated on said target exposure surface.

13. The method according to claim 10, wherein the control step includes the step of making a size of an electron beam irradiated on said target exposure surface in said second area larger than that of an electron beam irradiated on said target exposure surface in said first area.

14. The method according to claim 10, wherein the control step includes the step of making an irradiation time of an electron beam irradiated on said target exposure surface in said second area longer than that of an electron beam irradiated on said target exposure surface in said first area.

15. The method according to claim 10, wherein the control step includes the step of setting the deflection unit in said first area on the basis of all or some of a minimum line width, a type of line width, and a shape of line width of said exposure pattern to be formed on said target exposure surface.

16. A device manufacturing method of manufacturing a device by using an electron beam exposure method of claim 10.

17. An electron beam exposure method in which a target exposure surface is exposed by deflecting a plurality of electron beams by a common deflector, and simultaneously, independently controlling irradiation of the plurality of electron beams, comprising:

the area determination step of determining, on the basis of an exposure pattern to be formed on said target exposure surface, a first area where a contour area of said pattern is formed by exposure with at least one of the plurality of electron beams and a second area different from the first area, where an inner area of said pattern is formed by exposure with at least one of the plurality of electron beams; and the control step of controlling an exposure operation to set a unit of deflection by said deflector to be small in said first area, and the unit of deflection by said deflector to be large in said second area.

18. The method according to claim 17, wherein the control step includes the step of controlling said deflector to deflect and set, in the first and second areas, an electron beam irradiated on said target exposure surface in accordance with the deflection unit corresponding to said area.

19. The method according to claim 17, wherein the control step includes the step of controlling said deflector to deflect without setting, in an area other than the first and second areas, an electron beam irradiated on said target exposure surface.

20. The method according to claim 17, wherein the control step includes the step of making a size of an electron beam irradiated on said target exposure surface in said second area larger than that of an electron beam irradiated on said target exposure surface in said first area.

21. The method according to claim 17, wherein the control step includes the step of making an irradiation time of an electron beam irradiated on said target exposure surface in said second area longer than that of an electron beam irradiated on said target exposure surface in said first area.

22. The method according to claim 17, wherein the control step includes the step of setting the deflection unit in said first area on the basis of all or some of a minimum line width, a type of line width, and a shape of line width of said exposure pattern to be formed on said target exposure surface.

23. A device manufacturing method of manufacturing a device by using an electron beam exposure method of claim 17.

* * * * *

UNITED STATES PATENT AND TRADEMARK OFFICE
CERTIFICATE OF CORRECTION

PATENT NO. : 6,166,387
DATED : December 26, 2000
INVENTOR(S) : Masato Muraki et al.

It is certified that error appears in the above-identified patent and that said Letters Patent is hereby corrected as shown below:

Title page,
Item [30] Foreign Application Priority Data:

"Mar. 4, 1996 [JP] Japan ...8-045873" should be deleted.

Column 1,
Line 31, "in" (first occurrence) should read -- when --;
Line 35, "repeated pattern through holes" should read -- repeated-pattern-through-holes --;
Line 47, "repeated pattern through holes" should read -- repeated-pattern-through-holes --; and
Line 50, "repeated pattern through holes" should read -- repeated-pattern-through-holes --.

Column 2,
Line 52, "small" should be deleted.

Column 12,
Line 44, "Assume" should read -- ¶ Assume --.

Signed and Sealed this

Twenty-seventh Day of November, 2001

*Attest:*

NICHOLAS P. GODICI
*Attesting Officer*    Acting Director of the United States Patent and Trademark Office